United States Patent
Iwata

(10) Patent No.: US 6,625,057 B2
(45) Date of Patent: Sep. 23, 2003

(54) MAGNETORESISTIVE MEMORY DEVICE

(75) Inventor: Yoshihisa Iwata, Yokohama (JP)

(73) Assignee: Kabushiki Kaisha Toshiba, Minato-Ku (JP)

( * ) Notice: Subject to any disclaimer, the term of this patent is extended or adjusted under 35 U.S.C. 154(b) by 0 days.

(21) Appl. No.: 09/985,587

(22) Filed: Nov. 5, 2001

(65) Prior Publication Data

US 2002/0089024 A1 Jul. 11, 2002

(30) Foreign Application Priority Data

Nov. 17, 2000 (JP) ........................................ 2000-351787

(51) Int. Cl.$^7$ .............................................. G11C 11/00
(52) U.S. Cl. ....................................... 365/158; 365/196
(58) Field of Search .................................. 365/158, 196

(56) References Cited

U.S. PATENT DOCUMENTS

| | | | |
|---|---|---|---|
| 5,519,662 A | 5/1996 | Ishibashi et al. | ............. 365/207 |
| 5,815,452 A | 9/1998 | Shen | .......................... 365/207 |
| 6,002,611 A | 12/1999 | Ogura et al. | ........... 365/185.28 |
| 6,188,615 B1 | 2/2001 | Perner et al. | ............. 365/189.1 |
| 6,205,073 B1 * | 3/2001 | Naji | ........................... 365/209 |

OTHER PUBLICATIONS

Y. Nakagome, et al., "A 1.5V Circuit Technology for 64Mb DRAMs", 1990 Symposium on VLSI Circuits, pp. 17–18.

M. Aoki, et al., "An Experimental 16Mb DRAM with Transposed Data–Line Structure", 1988 IEEE International Solid–State Circuits Conference, pp. 250–251 and 391–392.

P. Naji, et al., "A 256kb 3.0V 1T1MTJ Nonvolatile Magnetoresistive RAM", 2001 IEEE International Solid–State Circuits Conference, pp. 122–123, 438, 94–95, and 404–405.

* cited by examiner

Primary Examiner—M. Tran
(74) Attorney, Agent, or Firm—Banner & Witcoff, Ltd.

(57) ABSTRACT

An integrated semiconductor memory device with an array of memory cells MC using magnetic tunnel junction (MTJ) cells is disclosed. A sense amplifier SA that is connected to a bit line BL for data readout of a selected memory cell MC is arranged using an operational amplifier OP. The operational amplifier OP has an inverting input terminal which is connected to the bit line BL and a non-inverting input terminal, to which a potentially fixed constant voltage VC is given. A PMOS transistor Q31 is provided, which can also do double-duty as a current source load. This PMOS transistor has its drain and gate that are connected to the inverting input terminal, and a source as connected to an output terminal of the operational amplifier OP whereby the transistor is under feedback control in response to an output of the operational amplifier OP so that a clamped voltage potential of the bit lime BL is fixed to the voltage VC.

11 Claims, 48 Drawing Sheets

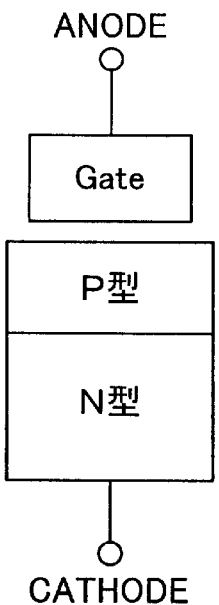
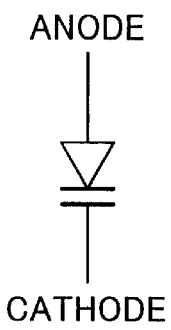
FIG. 28A          FIG. 28B
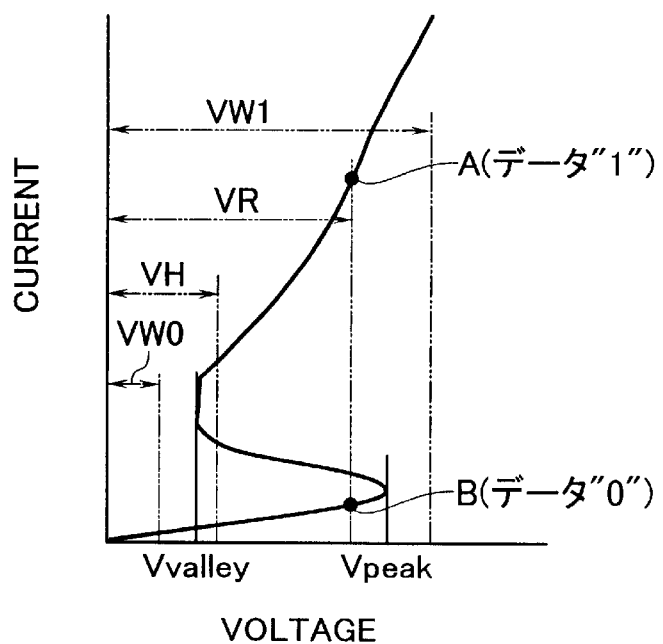
FIG. 29

|  | WL | BL-Read | BL-Write |
|---|---|---|---|
| 保持 | -2 | 0/1.5 | 0/1.5 |
| "1"読み出し | 0.5 | 1.5→0 | 0 |
| "0"読み出し |  | 1.5 | 1.5 |
| "1"書き込み | 3 | 0/1 | 1.5 |
| "0"書き込み |  |  | 0 |

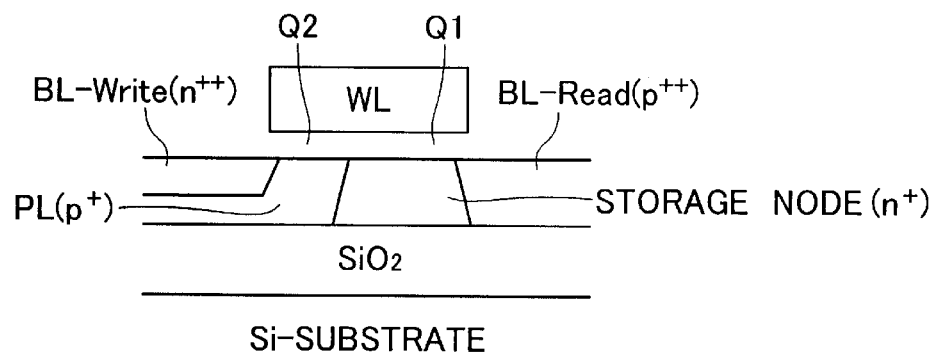
FIG. 38A
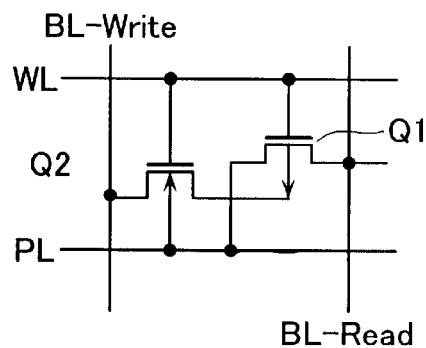
FIG. 38B
| | WL | PL | BL-Read & BL-Write |
|---|---|---|---|
| 保持 | 3 | −1.5 | 0 |
| "1"読み出し | 0 | −1.5 | <0 |
| "0"読み出し | | | 0 |
| 消去 | −1.5 | 0 | ~0 |
| "1"書き込み | 3 | 0 | 0 |
| "0"書き込み | | | 0.6 |
FIG. 39

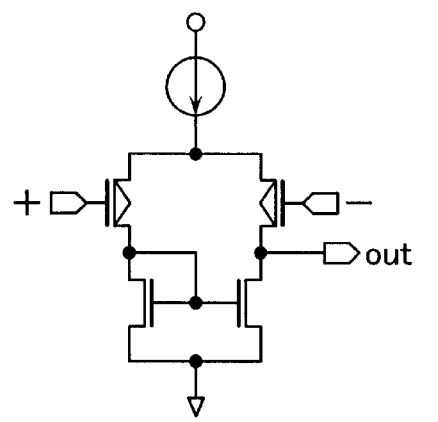 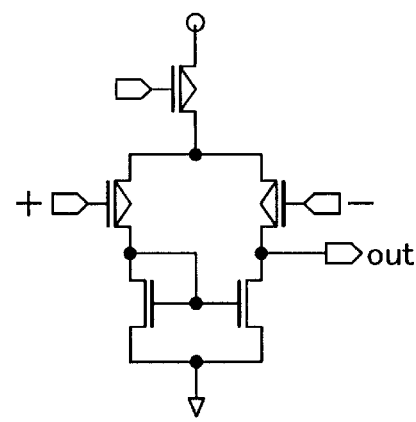
FIG. 44A          FIG. 44B
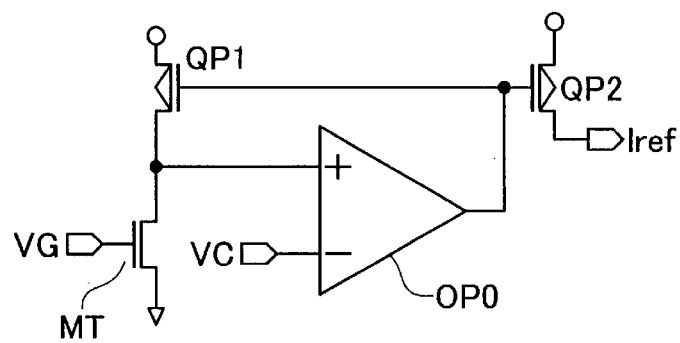
FIG. 45
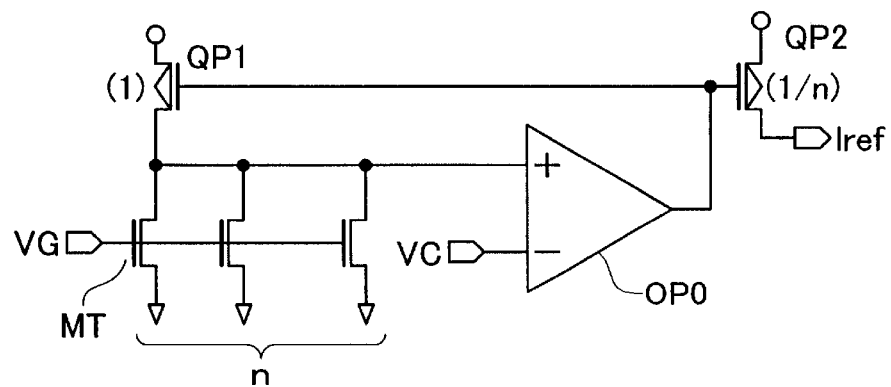
FIG. 46

MAGNETORESISTIVE MEMORY DEVICE

CROSS-REFERENCE TO RELATED APPLICATIONS

This application is based on and claims the benefit of priority from prior Japanese Patent Application No. 2000-351787, filed on Nov. 17, 2000, the entire contents of which are incorporated herein by reference.

BACKGROUND OF THE INVENTION

1. Field of the Invention

This invention relates to semiconductor memory integrated circuit (IC) devices configured using memory cells of the current readout type.

2. Description of Related Art

Currently available memory cells adaptable for use in semiconductor memory IC devices include those cells of the type performing data storage depending upon whether a current flowing during cell selection is present or absent or alternatively whether such current is large or small in amount. This type of memory cells will be referred to hereinafter as the "current-driven" type memory cells in the description. Known current-driven memory cells include non-volatile memory cells suitable for use with electrically programmable read-only memory (EPROM) and electrically erasable programmable read-only memory (EEPROM) chips, which cells are of the multilayered gate type metal oxide semiconductor (MOS) transistor structure having a floating gate or alternatively the metal nitride oxide semiconductor (MNOS) transistor structure, the metal oxide nitride oxide semiconductor(MONOS) transistor.

Other known memory cells include magnetic random access memory (MRAM) cells employing magnetoresistance (MR) effects, thyristor-RAM (T-RAM) cells using negative differentiation resistance each formed of a thyristor and a select transistor (such as disclosed in F. Nemati and J. D. Plummer, 1996 Symp. on VLSI Tech. at pp. 66–77, as will be referred to as "Document #1" or simply "D1" in the rest of the description), tunnel switch diode (TSD) cells using TSDs (as recited for example in H. J. Levy et al., IEEE Journal of Solid-State Circuits, vol. 33, April 1998, pp. 669–672, to be referred to as "Document #2" or "D2" hereafter), and a specific type of dynamic random access memory (DRAM) cells called "gain cells" among those skilled in the semiconductor memory art. The gain-cell type DRAM cells are generally categorized into the two: the one that stores a packet of electrical charge carriers while using the gate of a sensing MOS transistor as its storage node, and the other that is designed to utilize the so-called "backgate bias" effect for storage of electrical charge with the bulk region (channel body) of a sense MOS transistor being used as the storage node thereof.

In the case of memory cells of the floating gate type for general use in EPROMs and EEPROMS, data determination or "judgment" is done by detection of a difference of drain current in view of the fact that the threshold voltage is different depending upon the amount of electrical charge being presently accumulated at the floating gate of interest. It should be required at this time that a drain voltage be suppressed at a low potential level for preclusion of unwanted occurrence of writing during reading. Typical examples of prior known sense amplifier circuitry used in EEPROMs are shown in FIGS. 55 and 56.

The sense amplifier system shown in FIG. 55 is the one as taught by N.Ohtsuka et al., "A 62 ns 16 Mb CMOS EPROM with Address Transition Detection Technique," ISSCC Digest of Technical Papers, February 1991, pp. 262–263. The sense amp system of FIG. 56 is disclosed in G. Canepa et al., "A 90 ns 4 Mb CMOS EPROM," ISSCC Digest of Technical Papers, February 1988, pp. 120–121. Note here that the both circuits are shown so that portions less relevant to this invention are eliminated from the illustrations.

The sense amp circuits of FIGS. 55–56 are both designed to perform an operation for establishment of a specific bitline voltage potential as determinable by load-to-memory cell ratios in turn-on resistance values thereof, also known as "ratio" operation among those skilled in the art to which the invention pertains; thus, a bitline potential changes from 0.5 V to 1V or more or less in a way pursuant to the threshold voltage level of a memory cell. Electrons are accumulated at the cell's floating gate, causing a bit line associated with a memory cell of higher threshold voltage (and thus the cell's drain) to potentially go high. The remaining, non-selected memory cells are such that their word line-coupled control gates are kept at 0V; thus, if the drain potential is high then electrons are readily injectable thereinto. The presence of this high drain potential can cause writing errors, especially for those memory cells presently in an erase state (ordinarily, logic data "1" storage state).

In the case of multiple-value data storage, a four-value storage scheme based on a threshold value distribution shown for example in FIG. 35 is representatively known, which is found in M.Bauer et al., ISSCC95 at pp. 132–133. One typical sense amplifier circuitry suitable for use in the case of such multi-value storage is configured as shown for example in FIG. 56, which is suggested from M.Bauer et al., "A Multilevel-Cell 32 Mb Flash Memory," ISSCC Digest of Technical Papers, February 1995, pp. 132–133. Here also, any part irrelevant to this invention is eliminated from the illustration.

As in the case of two-value storage, the sense amp circuit shown in FIG. 56 is designed to do the "load-to-cell turn-on ratio" operation discussed above. Accordingly, in accordance with a present threshold voltage of a memory cell, its associated bit line potentially increases from 0.5V and then goes beyond 1V. In addition, the required sense time period is longer than that of the two-value storage due to the fact that upper and lower level data bits are read out sequentially- that is, the upper level data bit is first read and thereafter the lower bit is read out. Even when word-line closing control is done after completion of each bit data reading, possible stress becomes stronger when compared to the two-value case, resulting in the circuitry suffering from high risks of writing errors.

MRAM cells also include memory cells of the type utilizing magnetic tunnel junction (MTJ) architectures, called "MTJ-MRAM" cells, examples of which are disclosed in R.Scheuerlein et al., 2000 ISSCC at pp. 128–129 ("Document #3" or "D3") and M.Durlam et al., 2000 ISSCC, pp. 130–131 ("D4"). These MTJ-MRAM cells taught thereby utilize the fact that electrical resistance when spins of ferromagnetic materials with an interposed tunneling dielectric film forming an MTJ are parallel in direction is different in value that when the spins are anti-parallel (the resistance is large when spins are antiparallel). With such MTJ-MRAM cells, a resistance difference becomes smaller with an increase in voltage to be applied to the MTJ; thus, it is required that any application voltage be suppressed in potential. Although the resistance difference gets larger owing to research and development results in recent years, the application voltage is strictly required to fall within a limited range of from 0.2 to 0.4V; otherwise, the resistance different would decrease thereby making the data judgment more difficult.

A basic structure of MTJ-MRAM cell is shown in FIG. 33A, and equivalent circuitry of it is depicted in FIG. 33B. Also see FIG. 34, which shows a relation of the MTJ-MRAM cell's resistance change versus a bias voltage used, sometimes called the "bias voltage-dependent resistance change characteristic," as taught by M.Durlam et al., "Nonvolatile RAM based on Magnetic Tunnel Junction Elements," ISSCC 2000 slide supplement, February 2000, pp. 410–411. As shown in FIG. 33A, the MTJ-MRAM cell is designed so that its MTJ is formed of ferromagnetic films 331, 333 with a tunnel dielectric film 332 sandwiched therebetween. The lower ferromagnetic film 331 is spin-fixed whereas the upper film 333 is spin-variable. The upper ferromagnetic film 333's spin drive is done by use of a bit line BL and a write-use word line W-WL, which lines run at right angles to each other with the MTJ interposed therebetween. The MTJ is grounded through a select transistor QS, which is driven by a read-use word line R-WL. In view of the fact that the MTJ differs in resistance in a data-dependent way, MTJ may be represented equivalently as a variable resistor VR as shown in FIG. 33B.

A configuration of sense amplifier circuitry adaptable for use with the MTJ-MRAM cells is shown in FIG. 53 (see the above-identified document D3). This sense-amp circuit shown herein also is designed to perform the "load-to-cell ratio" operation stated previously. With such operation, an application voltage to certain MTJ increases in potential if the MTJ is high in resistance and antiparallel in spin direction, which would result in a decrease in change of resistance causing a resistance difference relative to a spin-parallel MTJ to likewise decrease, as suggested by the data of FIG. 34.

The prior art memory cell structures of the above documents D3 and D4 are arranged so that a 1-bit cell is made up from a couple of transistors plus two MTJ elements, for writing complementary data bits into the MTJ elements. With such "2-transistor/2-MTJ" cell configuration, a readout signal is significant. Unfortunately, this does not come without accompanying a trade-off: the use of many elements for each cell suffers from reduction of on-chip integration density and per-cell storability; if a 1-transistor/1-MTJ cell structure is employed for achieving mass-storabilities, then, a reference voltage must be set at a potential level as created by an intermediate resistance that is midway between the resistance values of a spin-antiparallel MTJ element and that of spin-parallel MTJ element, resulting in a read signal amount becoming half-reduced. Thus a need is felt to avoid the use of any application voltages with risks of resistance difference reduction.

In the case of a TSD cell of the metal insulator semiconductor (MIS) switch diode type, this is structured as shown in FIG. 28A and is represented by a symbol shown in FIG. 28B. More specifically, this cell structure is such that an insulated gate electrode (anode electrode) is formed over a p-type semiconductive layer of a p-n junction diode with a tunnel dielectric film sandwiched between them. The TSD has two terminals, one of which is capable of enlarging a read current if a higher voltage is applied thereto. Unfortunately as shown in a characteristic diagram of FIG. 29, upon occurrence of excessive potential rise-up beyond a trigger voltage Vpeak entering a negative differential resistance region, read errors can occur causing a read voltage VR to be limited.

Although the above-identified document D2 with teachings about TSD cells is silent about any specific sense-amp circuitry, a scheme is employable for performing reading through execution of a TSD-cell to load ratio operation with a common load provided at a single bit line; if this is the case, the bit-line potential can decrease when a large current flows into the TSD, resulting in a decrease in voltage being applied between the electrodes of TSD, which in turn leads to loss of a drive current. Alternatively if the TSD cell is potentially increased at its anode then a voltage across the electrodes of one TSD cell less in current flow will possibly go beyond the trigger voltage Vpeak in some cases.

According to the document D1, a T-RAM cell with a thyristor used as its storage element is structured as shown in FIG. 30A with a symbol shown in FIG. 30B used to represent the T-RAM cell. The thyristor here is a "pnpn" thyristor TH having its p-base with a sidewall, on which a word line WL2 of MOS gate structure is formed to have a ring-like shape. This thyristor TH has an n-emitter which is connected to a bit line BL via a select MOS transistor QS controllable by a word line WL1. This T-RAM cell is also capable of increasing a read current with use of larger voltages. See FIGS. 31A and 31B, the former of which shows a current versus voltage characteristic of the T-RAM cell during data holding, and the latter of which shows a characteristic during data reading. Exceeding beyond the trigger voltage Vpeak entering the negative differential resistance region can cause read errors; thus the read voltage VR is limited. This is similar to that of the TSD cell stated supra. Although D1 with teachings of T-RAM cells fails to suggest sense-amp circuitry per se, execution of the ratio operation would cause similar problems to those in the case of TSD cells.

Presently available gain cells using the gate of a sensing MOS transistor as its storage node for electrical charge accumulation include phase-state low electron-number drive RAM cells, also known as "PLEDM" cells, one of which is disclosed in K.Nakazato et al., "Phase-state Low Electron-number Drive Random Access Memory (PLEDM)," ISSCC Digest of Technical Papers, February 2000, pp. 132–133 ("D5"). The structure of such PLEDM cell is illustrated in FIG. 36A, and its equivalent circuit is shown in FIG. 36B.

A heavily-doped n ($n^+$) type gate electrode of sense MOS transistor Q1 is for use as a storage node Vn with its drain being connected to a read bit line BL-Read. A multilayer structure with alternate lamination of silicon nitride films and i-type silicon films is over the gate electrode. A write bit line BL-Write is formed on the multilayer structure. This bit line may be an $n^+$ type silicon layer. A word line WL is formed to cover these components making up the gate structure, with a dielectric film interposed therebetween. Interlayer part of the storage node Vn and write bit line BL-Write constitutes a write MOS transistor Q2 of the vertical type, which is extremely less in current leakage. With such a structure, a gain cell is obtained.

An operation condition indicated in Document D5 is as shown in FIG. 37A. Sense amplifier circuitry is configured as shown in FIG. 57. Data writing is performed in such a way that either H level (for example, 1.5V for a data bit of logic "1") or L level (e.g. 0V for data "0") is written into the storage node Vn through the write MOS transistor Q2 while substantially simultaneously applying to word line WL an H-level write potential (e.g. 3V). In a standby state, a negative potential (−2V) is given to word line WL causing storage node Vn to potentially stay at or below the threshold voltage of sense MOS transistor Q1 due to the presence of a coupling capacitor Cc between word line WL and storage node Vn. Data read is done by giving to word line WL a read voltage potential of about 0.5V to thereby drive sense MOS transistor Q1 to turn on only when H level is held at storage node Vn.

It is demonstrated by D5 that the storage node is at about −2V in case a logic "0" has been written or "programmed" into non-select cells (i.e. a built-in capacitor shown in FIG. 37B is of 0.04 fF), and also that a potential difference of 3.5V is available between the gate and drain of a non-select cell-associated sense MOS transistor Q1 upon precharging of read bit line BL-Read at 1.5V, or more or less. As integration densities decrease due to rapid growth of semiconductor microfabrication technologies, the channel length of sense MOS transistor Q1 is shortened; if this is the case, its gate oxide film is ordinarily made thinner for suppression of short-channel effects. One example is that if electric fields being applied to the gate oxide film are limited to 5 MV/cm then this film is required to measure as thick as 7 nanometers (nm), resulting in the channel length being merely scaled down to 0.25 μm.

The same discussion will not automatically be applicable to other types of gain cells with sense MOS transistor gates used as storage nodes, it is true that sense MOS transistors of the virtually floating gate type must be employed in cases where write MOS transistors are less in current leakage with storage nodes being small in capacitance (these are inevitable for microfabrication of gain cells of the type accumulating electrical charge with sense transistor gates used as storage nodes). As far as such architecture is used, even if charge carriers as injected into a gate due to drain avalanche with application of a potentially high drain voltage—"hot" carriers—are less in amount, resultant storage node potential change is significant undesirably.

Additionally, with the sense-amp circuitry shown in FIG. 57, even when such drain avalanche does not occur, those non-select cells satisfying the above-noted biasing conditions can experience bit-line precharge voltage reduction due to the presence of gate potential-induced drain current leakage, also known as the gate induced drain leakage (GIDL). This precharge voltage reduction causes read errors in some cases. In other cases, the same would result in writing being done at a storage node with low voltages because of the fact that a bit-line precharge voltage is for direct use as a write voltage for restoring.

Further, turning back to the discussion on the read operation, sense MOS transistors of the load and gain cell are designed to perform the ratio operation, although the sense-amp circuitry of FIG. 57 per se does not offer any ratio operability. If this is the case, it is required that the sense MOS transistors be low in drain voltage; otherwise, injection of those electrons without experience of any collision—say, lucky electrons—into storage nodes can occur due to hot carriers, as in EPROMs. Thus it is desired that the sense MOS transistors be lowered or minimized in drain voltage.

A typical one of gain cells of the type utilizing the backgate bias effects with sense MOS transistor bulk (channel body) regions as storage nodes thereof is a capacitor-less DRAM (CDRAM) cell, as disclosed in H.Wann and C.Chu, "A Capacitorless DRAM Cell on SOI Substrate," IEDM Digest of Technical Papers, Dec. 1998, pp. 635–638("D6"). A CDRAM cell structure is shown in FIG. 38A, with its equivalent circuit depicted in FIG. 38B.

The CDRAM cell shown is generally formed of a sense-use P-channel MOS (PMOS) transistor Q1 and a write N-channel MOS (NMOS) transistor Q2 over a silicon-on-insulator (SOI) substrate, these transistors having a common gate. The sense PMOS transistor Q1 has its source connected to a read-use bit line BL-Read and an insulated channel body of $n^+$ type for use as an electrically "floating" storage node. The sense PMOS transistor Q1 has its $p^+$ type drain coupled to a purge line PL. Arranged between the storage node and a write-use bit line BL-Write is a write NMOS transistor Q2 with a region of purge line PL used as the channel body. With such a structure, the gain cell is thus obtained.

Operation voltages of the CDRAM of Document D6 are as shown in FIG. 39. An H-level voltage is applied to word line WL for writing H or L level into the channel body of sense PMOS transistor Q1 through NMOS transistor Q2. Then a negative voltage is given to purge line PL to thereby hold data. Reading is done by detection of a change in bit-line potential based on turn-on or off of sense PMOS transistor Q1 while applying negative voltage to purge line PL and also giving a 0-V voltage to the word line.

Although D6 lacks any detailed explanation about sense circuitry, the cell structure also must undesirably satisfy the hot-carrier injection conditions if the drain voltage is high in potential for holes, judging from the fact that the cell as taught thereby is designed so that the channel body is used as the storage node.

As apparent from the foregoing discussions, prior art semiconductor memory devices using current-driven memory cells with limited bias conditions are such that a bitline clamping potential is determined by execution of the so-called load-to-memory cell ratio operations under control of load currents with respect to memory cells. The use of such architecture is faced with a problem as to unwanted increase in stresses being applied to the memory cells. If an attempt is made to lessen such stresses, the resultant memory cells are no longer capable of sufficiently offering the performance required.

SUMMARY OF THE INVENTION

The magnetoresistive memory device in accordance with one aspect of this invention comprises more than one memory cell storing data therein depending on whether its magnetoresistance is large or small in value and a sense amplifier connected to a bit line from which data of the memory cell will be output for detecting or sensing the data of the memory cell, wherein the sense amplifier includes an operational amplifier which has its inverting input terminal connected to the bit line and a non-inverting input terminal with a fixed potential applied thereto, and a clamping transistor being under feedback control in response to an output of the operational amplifier for forcing the bit line to be clamped at the fixed potential without regard to any data being read, the transistor having its drain connected to the inverting input terminal and a source coupled to an output terminal of the operational amplifier.

BRIEF DESCRIPTION OF THE DRAWINGS

FIG. 28A is a pictorial representation of a TSD cell structure; and, FIG. 28B depicts a symbol thereof.

FIG. 29 is a graph showing operation characteristics of the TSD cell.

FIG. 33A depicts a structure of an MTJ-MRAM cell whereas FIG. 33B shows an equivalent circuit thereof.

FIG. 38A depicts in cross-section a structure of a CDRAM cell, and FIG. 38B shows its equivalent circuit.

FIG. 39 is a table showing the CDRAM cell's operation conditions.

FIGS. 44A–44B are diagrams each showing a configuration of an operational amplifier.

FIG. 45 is a diagram showing a configuration of a current source circuit with temperature characteristics.

FIG. 46 is a diagram showing another configuration of the current source circuit with temperature characteristics.

DETAILED DESCRIPTION OF THE EMBODIMENTS

Figure 1:
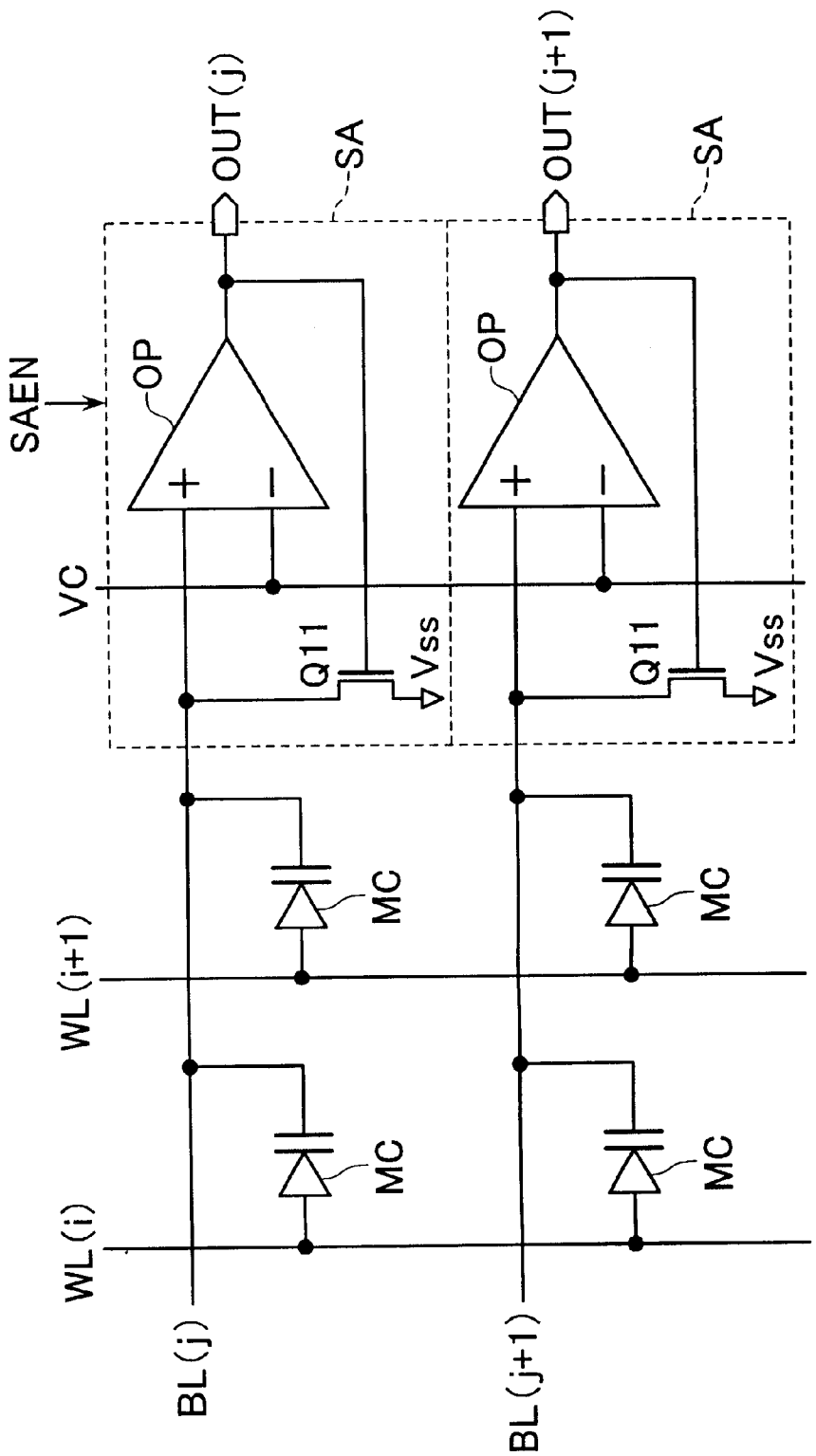
FIG. 1 is a diagram showing an arrangement of a cell array employing TSD cells and sense amplifiers operatively associated therewith.

A sense amplifier scheme incorporating the principles of this invention is such that an operational amplifier and clamping circuit are used to enable execution of control for forcing the bit line of interest to stay at a constant or "fixed" potential level without regard to data being presently read.

Accordingly, unlike the prior art schemes for determination of a bit-line clamp potential through ratio operations in the way stated in the introductory part of the description, it is possible to suppress or minimize stresses of current-driven memory cells to thereby obtain much increased read-out margins.

Memory cells to which the sense amplifiers embodying this invention are the so-called current-driven memory cells, typically including (a) memory cells of the type functioning to flow out or "push" a current toward a bit line(s) in a way conformity with data when selection, and (b) cells of the type acting to draw thereinto or "pull in" a current in accordance with data when selected.

Sense amplifiers adaptable for use with the memory cells of the former type (a) are practically arranged to include an operational amplifier that has its inverting input terminal connected to its corresponding one of bit lines and a non-inverting input terminal to which a fixed or constant potential is given. And a clamping circuit operatively associated therewith is configured from an N-channel metal oxide semiconductor (NMOS) transistor for use as a discharging element, which is connected to the inverting input terminal for control of a source thereof in response to a signal appearing at an output terminal of the operational amplifier to thereby perform a bit-line discharging operation.

In contrast, sense amplifiers suitable for use with the memory cells of the latter type (b) are typically designed so that an operational amplifier, or "op-amp" for short, has its inverting input terminal connected to a corresponding bit line and a non-inverting input terminal to which a fixed potential is given. Its associative clamp circuit is designed including a P-channel MOS (PMOS) transistor, which has a source as connected to the inverting input terminal for being controlled in response to a signal at the output terminal of such op-amp to thereby perform a bit-line charge-up operation; in this respect, the PMOS transistor may also serve as a current source load.

Other available sense amplifiers for use with the memory cells of the type (b) are such that an op-amp has an inverting input terminal connected to its corresponding bit line and a non-inverting input terminal to which a fixed potential is given. The op-amp comes with a clamp circuit which includes a constant current source load as connected to the inverting input terminal, and also a discharging NMOS transistor having its source connected to the inverting input terminal for being controlled by a signal at the output terminal of op-amp to thereby perform a bitline discharging operation.

Typical examples of the (a)-type memory cells are:

(1) memory cells employing specific elements with negative differentiation resistance characteristics, including tunnel diodes such as tunnel switch diode (TSD) cells and the like; and (2) memory cells made up from a certain element with negative differential resistance characteristics such as thyristors and a select transistor serially connected to the element, such as thyristor-RAM (T-RAM) cells.

Examples of the (b)-type memory cells include, but not limited to:

(3) magnetic memory cells storing data therein depending upon whether the magnetic resistance or magneto-resistance is significant or small in value, typically magnetic tunnel junction magnetic random access memory (MTJ-MRAM) cells formed of an MTJ and a select transistor connected thereto;

(4) electrically erasable and programmable read-only memory (EEPROM) cells each comprised of a transistor having a charge accumulation layer for accumulating electrical charge carriers within its gate in accordance with data;

(5) gain cells each comprising a sensing transistor and a "write" transistor for writing data-dependent electrical charge to the gate thereof; and (6) gain cells each having a sensing transistor and a write transistor for writing data-dependent charge to its channel body.

Referring now to FIG. 1, there is shown a configuration of a memory cell array employing TSD cells as current-driven memory cells MC, along with sense amplifiers SA operatively associated with these cells. The structure of each memory cell MC is as shown in FIG. 28A, which cell is a metal insulator semiconductor (MIS) tunnel diode that has an anode electrode being formed over an anode layer of p-n junction diode with a tunnel dielectric film interposed therebetween. The memory cell MC has an anode terminal as connected to a corresponding one of parallel word lines WL and also has a cathode terminal coupled to a corresponding bit line BL.

A respective one of the sense amplifiers SA is arranged including an operational amplifier OP. This op-amp OP has an inverting input terminal to which a fixed or constant potential VC is given and a non-inverting input terminal connected to its associated bit line BL. A discharging NMOS transistor Q11 is provided between a bit line BL and a ground terminal, for constitution of a clamp circuit (limiter circuit) operable to suppress the bit line BL's potential rise-up to the fixed potential VC. This MOS transistor Q11 has its gate, to which an output terminal of op-amp OP is connected for feedback of an output signal thereto, i.e. feedback-connected.

The memory cells MC of this type have operating and performance characteristics as shown in FIG. 29. A voltage-current characteristic curve indicative of a negative differential resistance characteristic crosses with a read voltage VR at two separate intersection positions "A" and "B," which correspond to logic data "1" and "0" states respectively. During data writing, write voltages VW0, VW1 with potential levels determinable depending on data are given between a presently selected word line WL and bit line BL. The "0" data write voltage VW0 is potentially less than or equal to a characteristic curve valley voltage V-valley whereas the "1" data write voltage VW1 is greater than or equal in potential to a peak voltage Vpeak. After having given this write voltage, let it return at a hold voltage VH to thereby permit achievement of data hold.

During reading, a read voltage VR which is potentially midway between the valley voltage Vvalley and the peak voltage Vpeak is applied to word line WL. In view of the fact that a read current is different depending on the data being read, a change in bit-line potential is detected by 20 sense amplifier SA. Practically let the fixed potential be VC=0V. A bitline precharge potential is also set at 0V, by way of example. During "1" data reading, if the selected bitline potential increases due to flow of a relatively large read current coming from a memory cell, then the op-amp OP's output voltage likewise increases in potential, causing the discharging MOS transistor Q11 to increase in discharge current accordingly. To be brief, owing to the output of op-amp OP, negative feedback is established for suppression of any bitline potential riseup. With such op-amp OP's operation, the bit line's clamp potential becomes VC=0V. During "0" data reading, a current outflowing to the bit line BL is less in amount, resulting in the op-amp OP's output being held at Low ("L") level when compared to that during data reading.

More specifically the operational amplifier OP is operable to drive the gate of the discharge NMOS transistor Q11 for control of its current driving ability or "drivability" in a way conformity with the actually sensed amount of a cell current, which is large or small. Whereby, the op-amp OP's output becomes "H" or "L" level in accordance with the data while simultaneously forcing the bit line to be potentially clamped at VC=0V.

Clamping in this way the bitline potential of interest at the fixed or constant potential VC without use of any ratio operations enables acquirement of a sufficiently increased amount of read current in the case of "1" data, without having to increase the read voltage VR being given to the memory cell(s) MC. This in turn avoids any risk of writing errors otherwise occurring at "0" data-written cells due to an accidental excessive increase of the read voltage beyond the peak voltage Vpeak.

Figure 2:
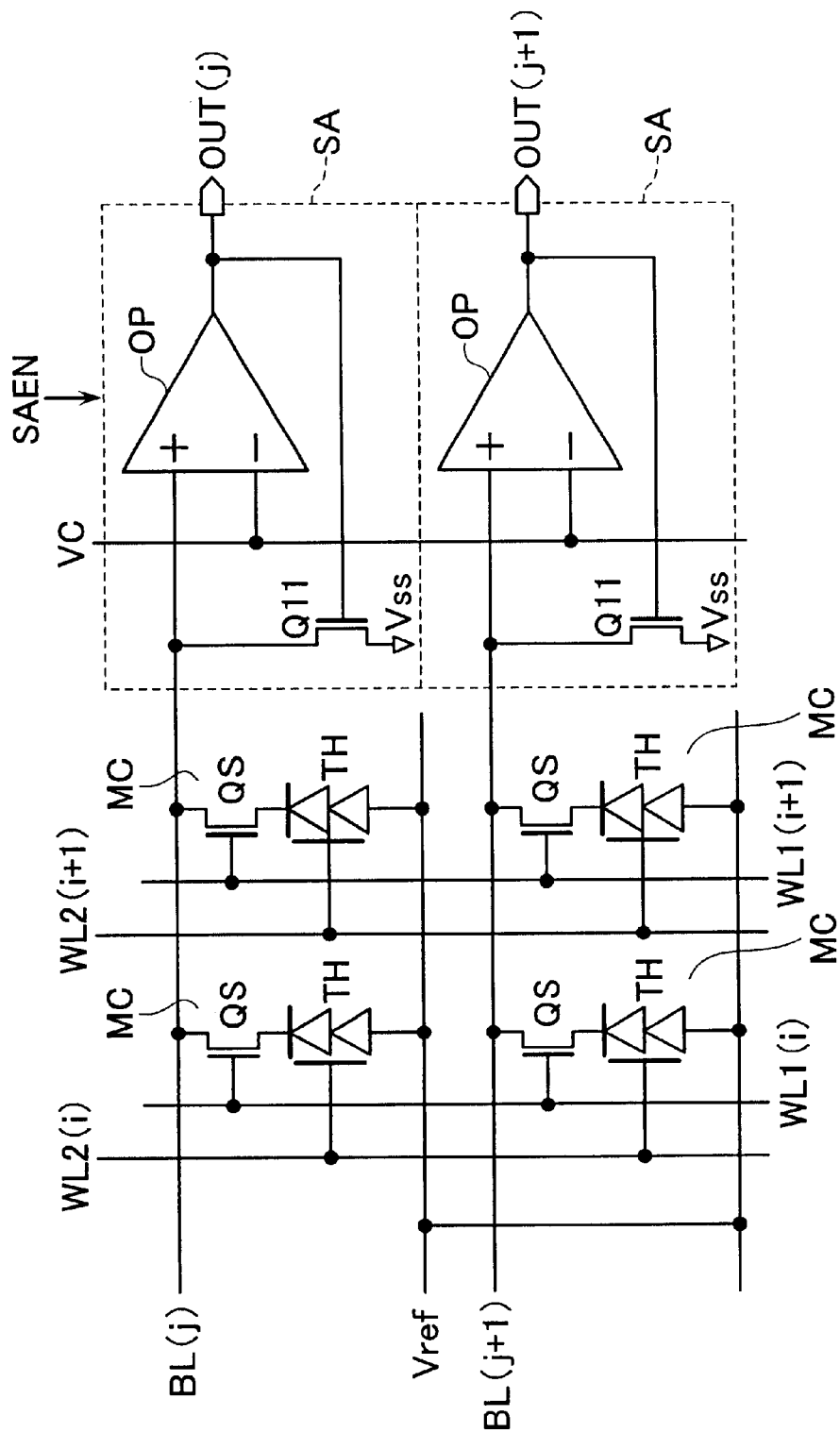
FIG. 2 is a diagram showing a configuration of a cell array using T-RAM cells and its associated sense amplifiers.
Figures 30A, 30B:
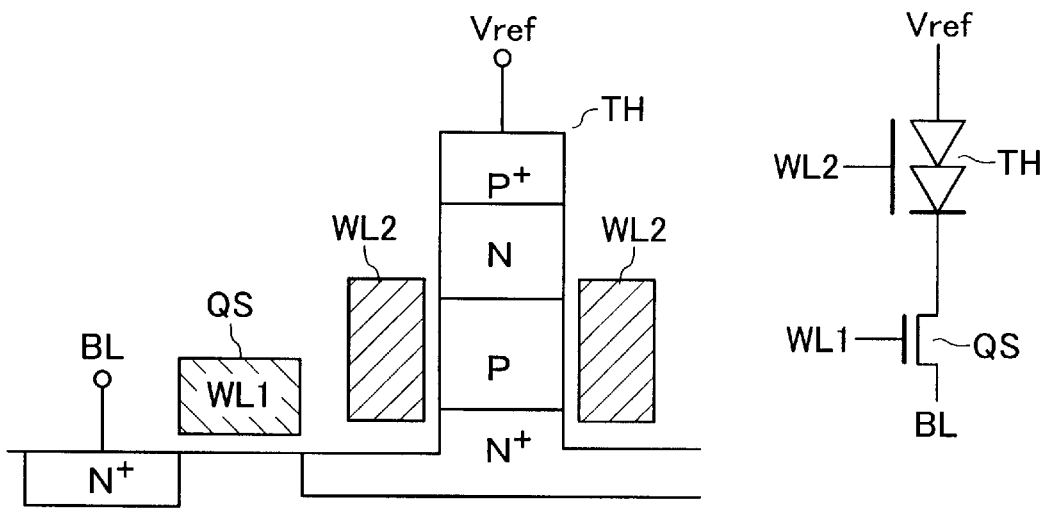
FIG. 30A depicts a T-RAM cell structure.
FIG. 30B shows its corresponding symbol.

Referring next to FIG. 2, there is depicted a cell array configuration using T-RAM cells as the current-driven memory cells MC along with sense amplifiers SA operatively associated therewith. The structure of each memory cell MC is as shown in FIG. 30A, which cell consists essentially of a thyristor TH with its cathode and a MOS transistor QS as series-connected to the cathode. The thyristor TH has an anode connected to a reference potential line Vref and a cathode coupled to its corresponding bit line BL via the MOS transistor QS. Thyristor TH also has a base of p type conductivity—say, p-base—which is provided with a MOS gate, which in turn is coupled to a word line WL2. MOS transistor QS has its gate coupled to another word line WL2.

Sense amplifiers SA used herein are similar to those shown in FIG. 1 in that each is designed to employ an operational amplifier or "op-amp" OP. The op-amp OP has an inverting input terminal to which a fixed potential VC is applied and a non-inverting input terminal connected to its corresponding bit line BL. A discharge-use NMOS transistor Q11 is provided between bit line BL and ground terminal, causing an output terminal of op-amp OP to be connected for feedback to a gate of this MOS transistor Q11.

In the case of this T-RAM cell, the thyristor TH is for use as a storage element. Letting the thyristor TH at a selected cell turn on or alternatively stay off through execution of adequate potential control of the word lines WL1, WL2 and bit lines BL would result in data of either a logic "1" or "0" being written thereinto as indicated by the characteristic curve of FIG. 31A. This write characteristic curve is shown in FIG. 32. A write voltage (e.g. 3V) is applied to selected word lines WL1, WL2 while at the same time applying a "1"-write voltage (e.g. 0V) to a "1"-write bit line. Let the reference voltage Vref stay below the above-noted peak voltage Vpeak. For instance, let Vref be set at about 1.5V if Vpeak=2V.

With such an arrangement, due to the setting of word line WL2=3V, the thyristor TH operates as a MOS diode rather than thyristor. Thus, in the case of "0" write, the diode is in the reverse direction due to the above-stated bias conditions; alternatively in the case of "1" write, the diode becomes in the forward direction. Accordingly in the case of "0" write, any appreciable current will hardly flow due to the load characteristics of a select MOS transistor QS; on the contrary, an increased current rushes to flow in the case of "1" write. Continuously setting the word line WL1 at approximately 1V with the word line WL2 set at 0V and with the bit line BL at 0V results in establishment of the hold state shown in FIG. 31A. During reading, let the word line WL1 be set at a read potential of about 3V while causing the word line WL2 to stay at 0V as shown in FIG. 31B.

In brief, one distinguishable feature of the T-RAM cells over the TSD cells stated previously is that the intended data writing is attainable without applying any voltages potentially higher than or equal to the peak voltage Vpeak between two terminals of the negative differential resistive element used.

Figures 31A, 31B:
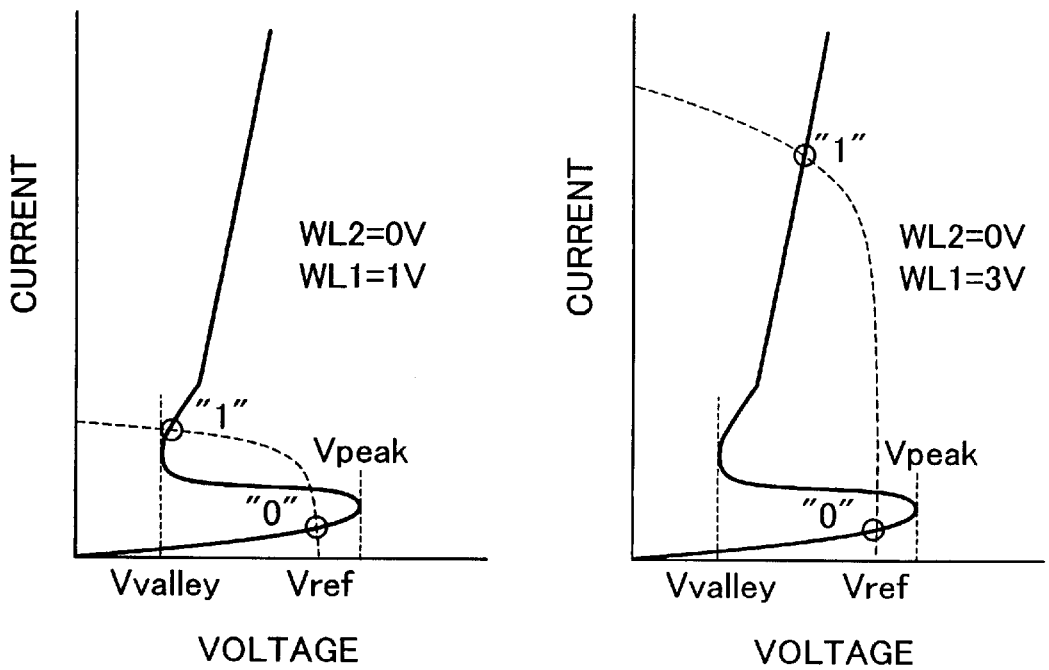
FIGS. 31A and 31B are graphs showing the T-RAM cell's operation characteristics during data holding and reading, respectively.
Figure 32:
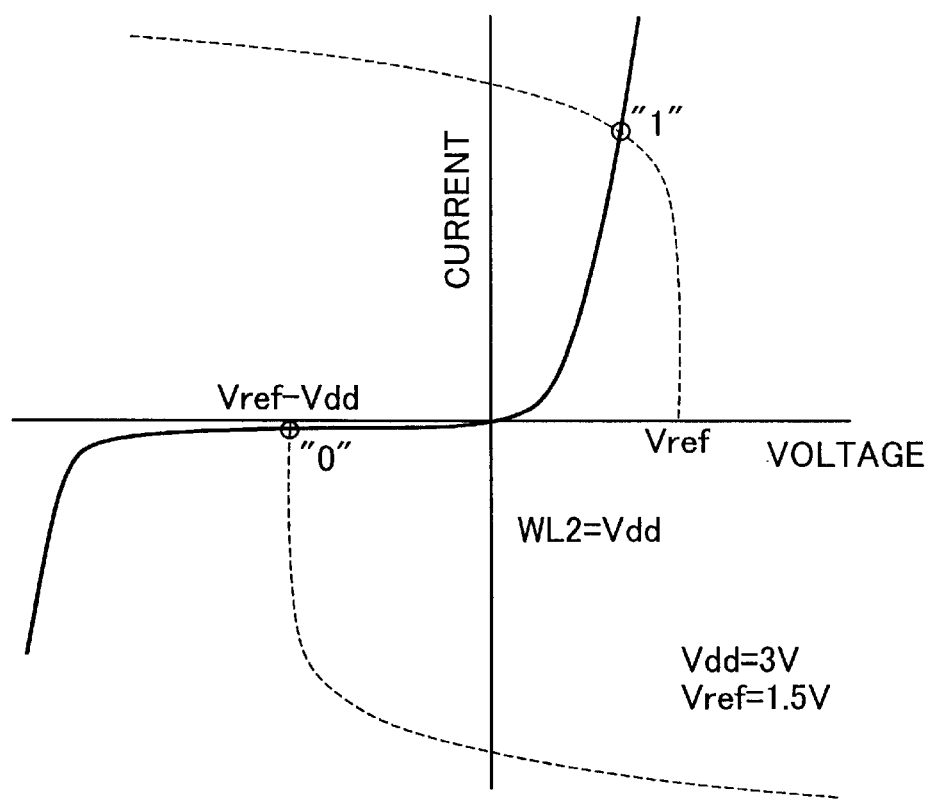
FIG. 32 is a graph showing the T-RAM cell's operation characteristics during writing.

At data read events, an attempt is made to detect whether a read current flows, which is different depending on the data state of FIG. 31B. A data sense operation with use of the sense amplifier SA is the same as that of the case discussed in conjunction with FIG. 1. And in this case also, fixing the bitline clamp potential makes it possible to provide a read current in the case of "1" data without having to potentially increase the reference voltage Vref being given to memory cells MC. This in turn avoids risks of erroneous writing with respect to "0" data-written cells otherwise occurring due to accidental excessive potential riseup beyond the peak voltage Vpeak.

Figure 3:
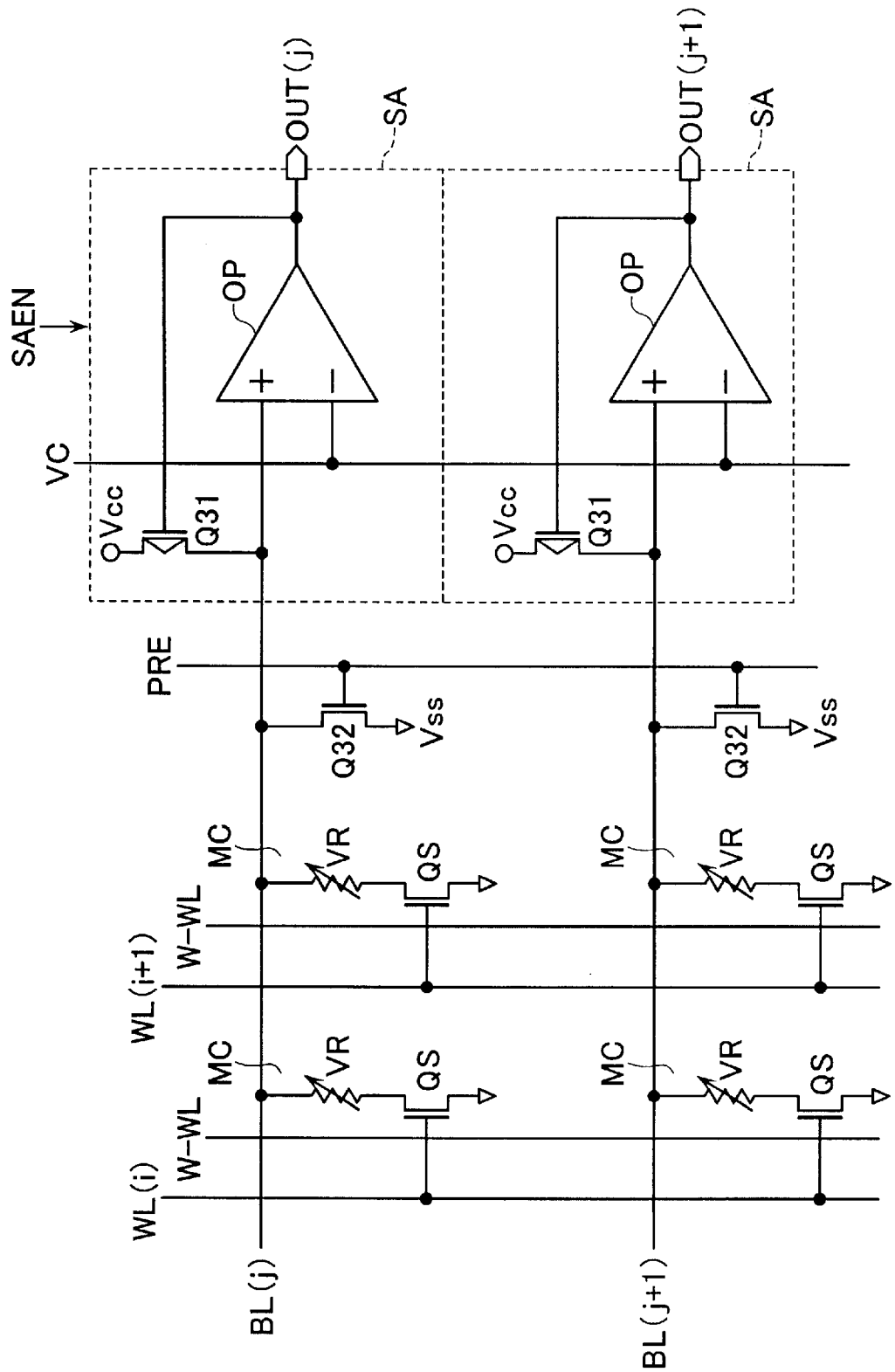
FIG. 3 is a diagram showing a configuration of a cell array using MTJ-MRAM cells and associative sense amplifiers.
Figures 33A, 33B:
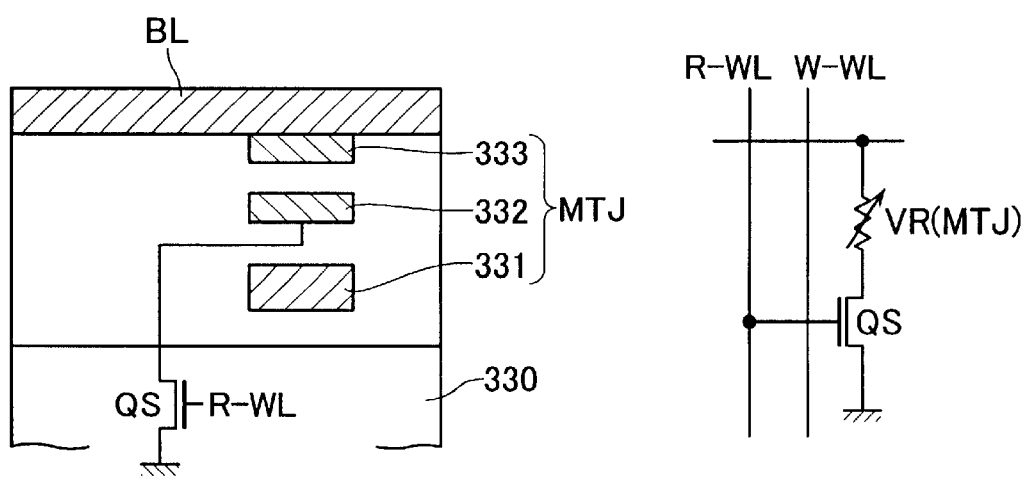
Figure 34:
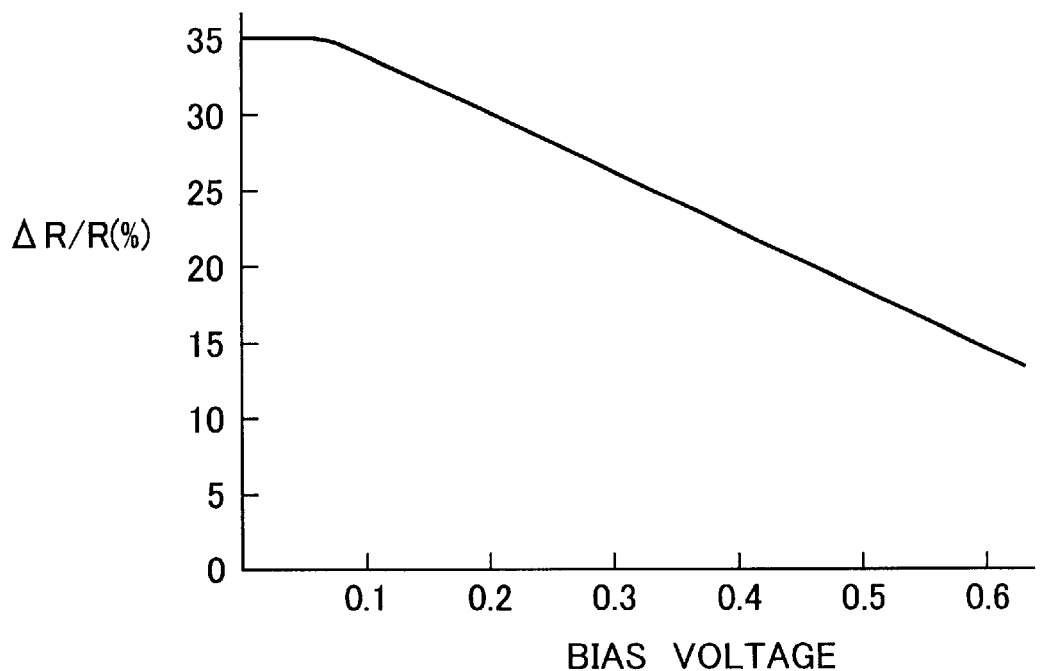
FIG. 34 is a graph showing a magnetoresistance versus bias voltage characteristic of MTJ cell.
Figure 35:
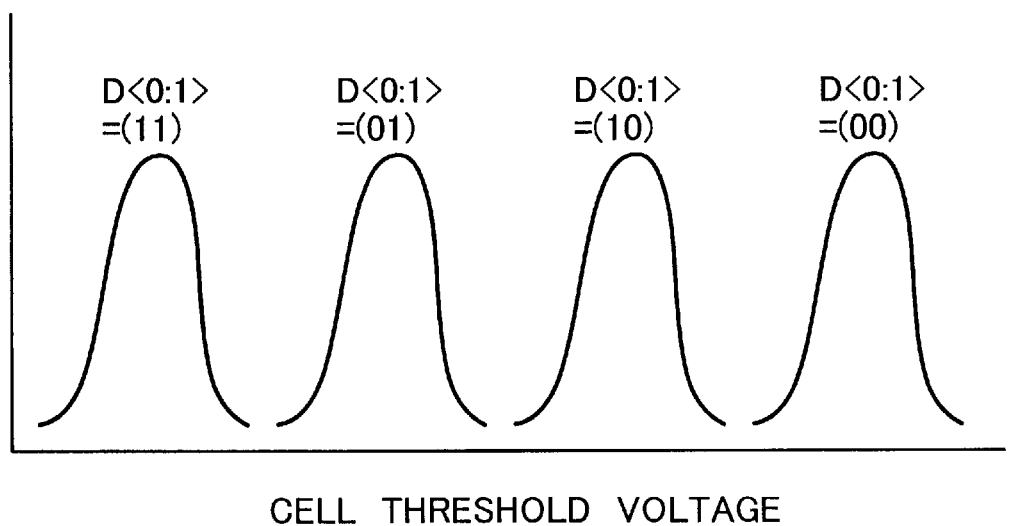
FIG. 35 is a graph showing a distribution of threshold voltages for multiple-value storage.

Turning to FIG. 3, there is shown a one-transistor/one-MTJ cell array configuration using MTJ-MRAM cells as the current-driven memory cells MC, along with sense amplifiers operatively associated therewith. A respective one of these memory cells MC shown herein has the basic structure of FIG. 33A; in FIG. 3, the cell consists essentially of an MTJ which is equivalently indicated as a variable resistor VR and a select MOS transistor QS as series-connected thereto. The MTJ exhibits its high resistance state and low resistance state, which will be stored as data bits "1" and "0" respectively.

This memory cell MC is of the type which takes or "draws" thereinto a current from its associative bit line in accordance with data. The sense amplifier SA makes use of an operational amplifier OP, which is different in arrangement from that shown in FIG. 1 or 2. The op-amp OP has its non-inverting input terminal connected to a corresponding one of bit lines BL and also has an inverting input terminal to which a fixed or constant potential VC is applied. A PMOS transistor Q31 for use as a current source load is provided between the non-inverting input terminal and power supply Vcc, wherein its gate is controlled by an output of op-amp OP. PMOS transistor Q31 is operatively responsive to receipt of a sense-amp activation or "enable" signal SAEN for being made active to charge up a bit line BL associated therewith while at the same time functioning as a clamp circuit for reducing or suppressing any possible bitline potential drop at the fixed potential VC.

The fixed potential VC is set at 500 mV, for example. This will become a fixed clamp potential upon occurrence of a bitline potential change during data reading. A precharge-use NMOS transistor Q32 is connected to the bit line. Prior to sense-amp activation, the NMOS transistor Q32 turns on in response to a precharge signal PRE causing bitline BL to be precharged at 0V.

The bitline precharge operation is terminated causing the switch MOS transistor QS of a selected cell to turn on through driving of a read word line WL(i) (where "i" is an integer); thereafter, sense amplifier SA is rendered operative and activated whereby data sense is done. At the beginning of such sense event, an output of the op-amp OP stays at L level; thus, the PMOS transistor Q31 is rendered conductive, i.e. turns on. In case the selected memory cell is significant in resistance for storage of a logic "1" data bit therein, its associated bit line BL potentially increases due to charge-up from the PMOS transistor Q31. This bitline potential increase results in riseup of the output of op-amp OP, causing negative feedback to be applied for driving PMOS transistor Q31 so that it turns off. Whereby the bitline potential is clamped at VC. In the case of a data bit "0," the memory cell resistance is less; thus, a discharge current is large. The op-amp OP drives the gate of PMOS transistor QP31 so that a current commensurate with such discharge current flows therein. In other words the op-amp OP holds an output level lower than that during "1" data reading to thereby perform an operation for clamping the bit line BL at VC. Accordingly this sense amp SA also permits the bit line BL to stay at the same fixed potential VC irrespective of whether the data is a logical "0" or "1," thus finally determining H or L of the output in accordance with the data.

It has been set forth that in this case also the bit line's clamp potential is constantly fixed at VC, which makes it possible to reliably prevent occurrence of writing errors at non-selected cells while precluding application of unnecessary stresses to the memory cells involved.

Figure 4:
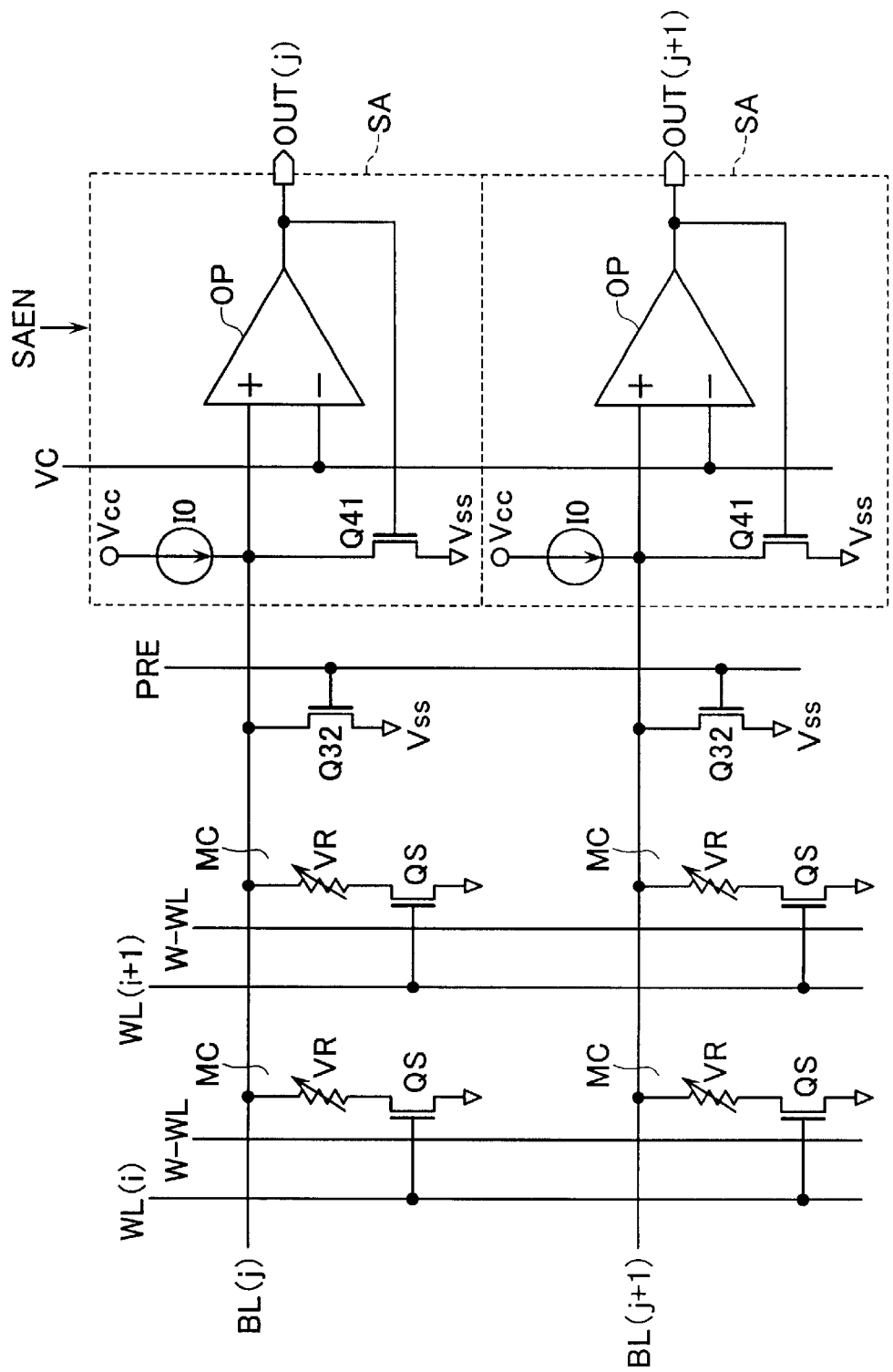
FIG. 4 is a diagram showing another configuration of the cell array using MTJ-MRAM cells and sense amplifiers.

Turning to FIG. 4, there is shown a configuration of sense amplifier SA in the case of using similar MTJ-MRAM cells, which configuration is different from that shown in FIG. 3. A constant current source load I0 is connected to the non-inverting input terminal of operational amplifier OP for supplying a constant current to a bit line BL associated therewith; additionally, a clamping (discharging) NMOS transistor Q41 is connected, which is under control in response to an output of op-amp OP. Part of the constant current source load I0 and NMOS transistor Q41 makes up a limiter circuit operable to suppress potential riseup of bit lines BL at VC. The constant current source load I0 has its current driving ability which has been set so that the current "drivability" is greater than that of a cell in the "0" data state.

The fixed potential VC is 500 mV for example, which becomes a bitline clamp potential during data reading. Prior to data sensing, a bit line BL is precharged at 0V by a precharging NMOS transistor Q32. When the bitline precharge operation is interrupted, the MOS transistor QS of a selected cell is driven to turn on; thereafter, its associative sense amplifier SA is activated in response to an activation or "enable" signal SAEN whereby data sense is done. At the beginning of such data sense, an output of op-amp OP stays at L level. In case the selected memory cell is large in resistance and thus stores therein a logic "1" data bit, the resulting discharge current of the cell is less causing the bit line BL to potentially rise up due to chargeup of the constant current source load I0. This leads to an increase in potential of the output of op-amp OP, which is then given to the gate of NMOS transistor Q41 resulting in a likewise increase in discharge current of NMOS transistor Q41. With this negative feedback operation the bitline potential is clamped at the fixed potential VC. In case data "0" is selected, the memory cell is less in resistance and large in discharge current. Accordingly, the op-amp OP performs a negative feedback operation in such a way that it holds a lower output level for retaining the discharge current of NMOS transistor Q41 smaller than during "1" data reading.

In other words, at this sense amplifier SA, the ratio of a current as supplied from the constant current source I0 to a current flowing in the selected cell and NMOS transistor Q41 is feedback-controlled in accordance with the data. whereby, H or L of the output of op-amp OP is determined in accordance with the data while letting the bit line BL be kept at the same fixed potential VC irrespective of whether the data is a logic "0" or "1."

Figure 5:
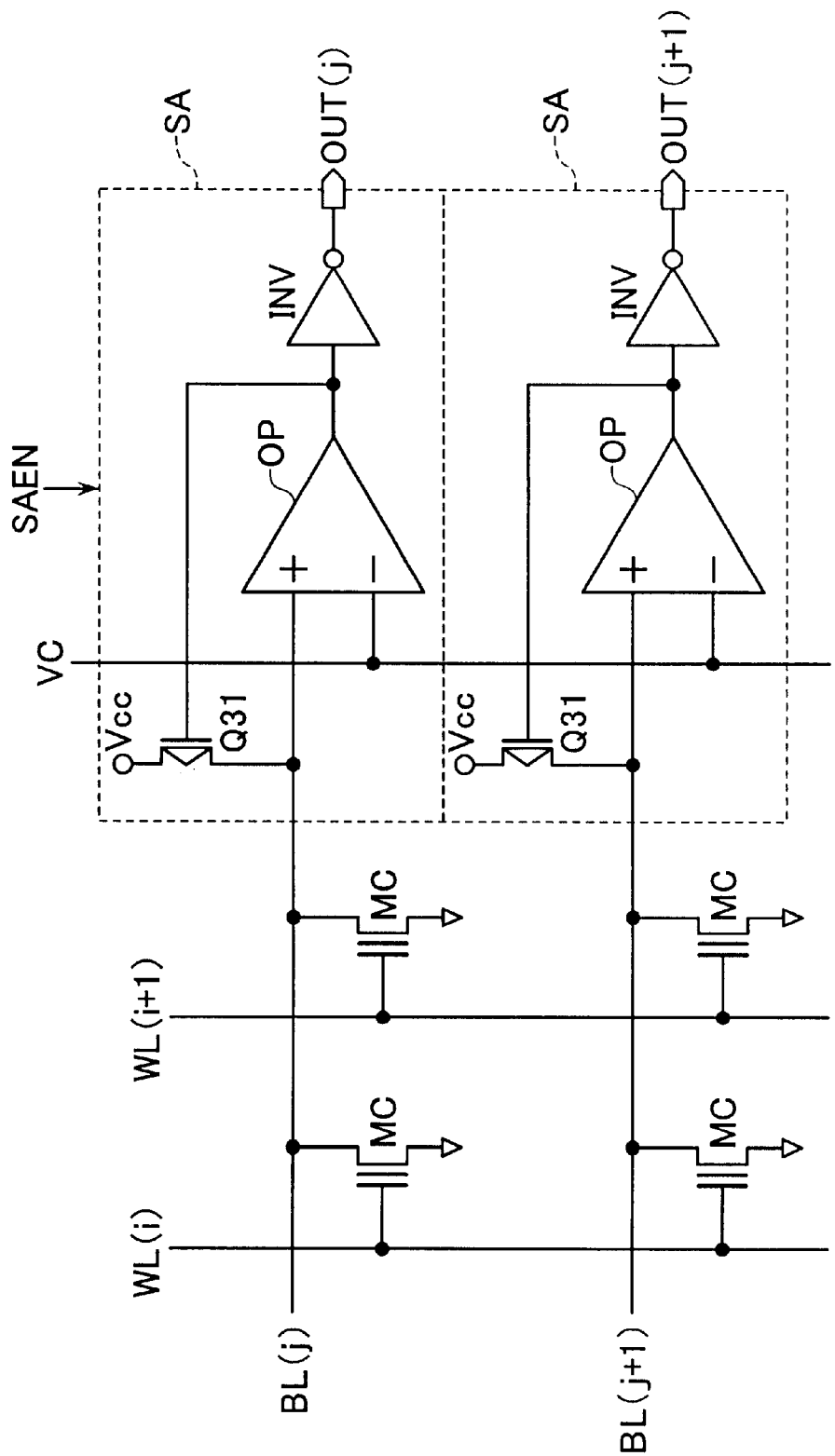
FIG. 5 is a diagram showing a configuration of a cell array using NOR type EEPROM cells and sense amplifiers associated therewith.

Turning to FIG. 5, there is shown a cell array configuration in case the memory cells MC used are NOR type EEPROM cells, along with sense amplifiers SA associated therewith. These sense amplifiers SA are basically the same in arrangement as those shown in FIG. 3. An inverter INV as provided at the output terminal of an op-amp OP is for adjustment of the levels H, L of output data, although such inverter is not essential.

The fixed potential VC used here is 500 mV for example, which becomes a fixed clamp potential in bitline potential variation events during data reading. Prior to execution of data sensing, a bit line BL is precharged at 0V by way of example. The data sensing is done in a way such that after the bitline precharge operation is interrupted and then a read voltage is applied to a selected word line WL, an appropriate sense amplifier SA is activated. In the data sensing, an output of op-amp OP is initially at L level.

In the event that the selected memory cell MC is a cell in the turn-off state, any appreciable discharge current is absent causing bit line BL to potentially increase owing to chargeup of PMOS transistor Q31. This bitline potential riseup results in an increase in output of op-amp OP, which in turn establish feedback for forcing PMOS transistor Q31 to turn off. Whereby the bitline potential is clamped at VC. Alternatively if the selected memory cell is a cell in the turn-on state, then the resultant discharge current is significant in amount so that the bitline potential will no longer increases in potential; thus, the output of op-amp OP stays at L level continuously from the "1" read event.

Figure 6:
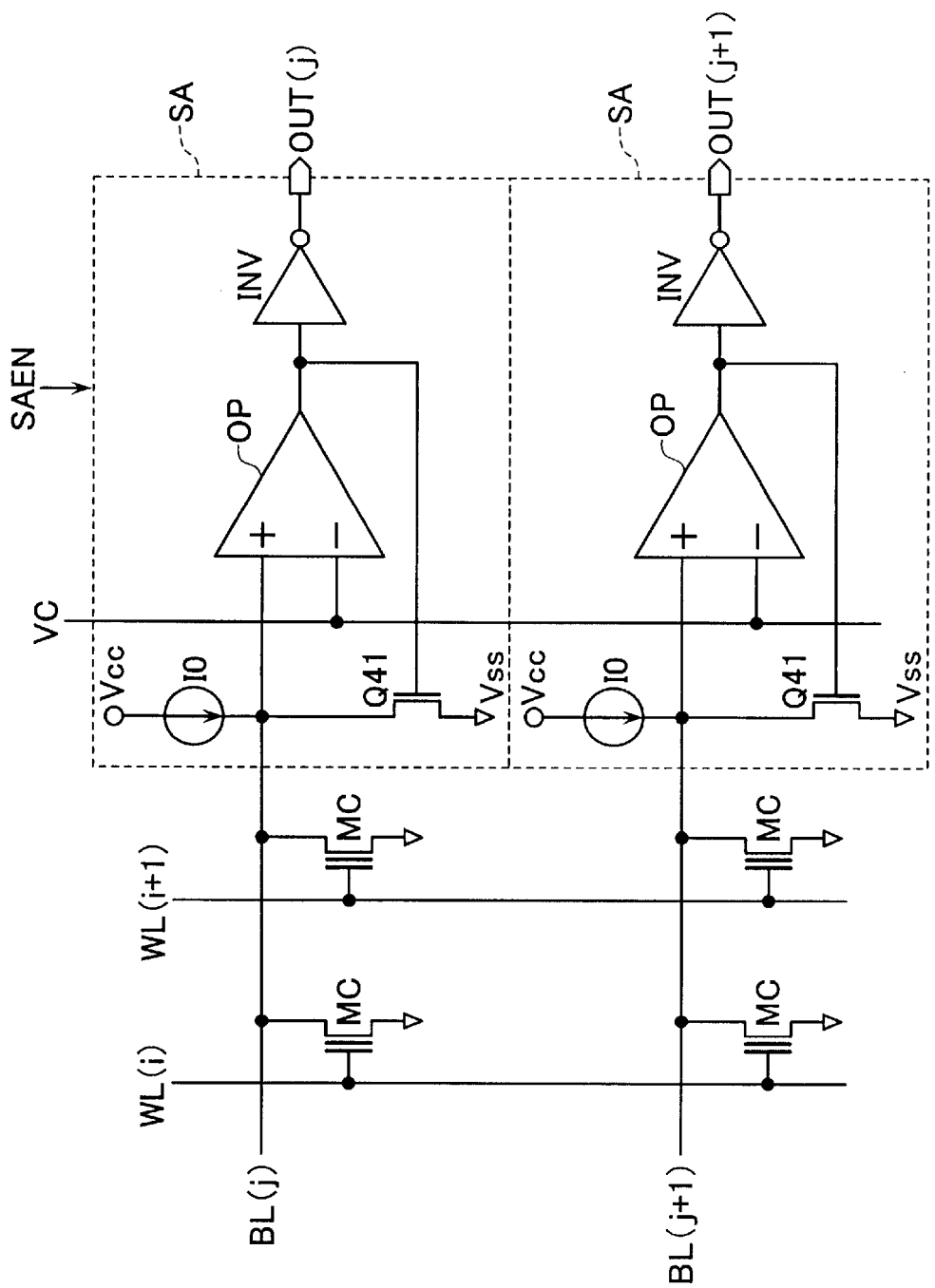
FIG. 6 is a diagram showing a configuration of a cell array using NOR type EEPROM cells and sense amplifiers associated therewith.

See FIG. 6. This diagram shows another configuration of the cell array including similar memory cells MC formed of NOR-EEPROM cells along with associative sense amplifiers SA. These sense amplifiers SA are substantially the same in arrangement as that of FIG. 4.

Figure 7:
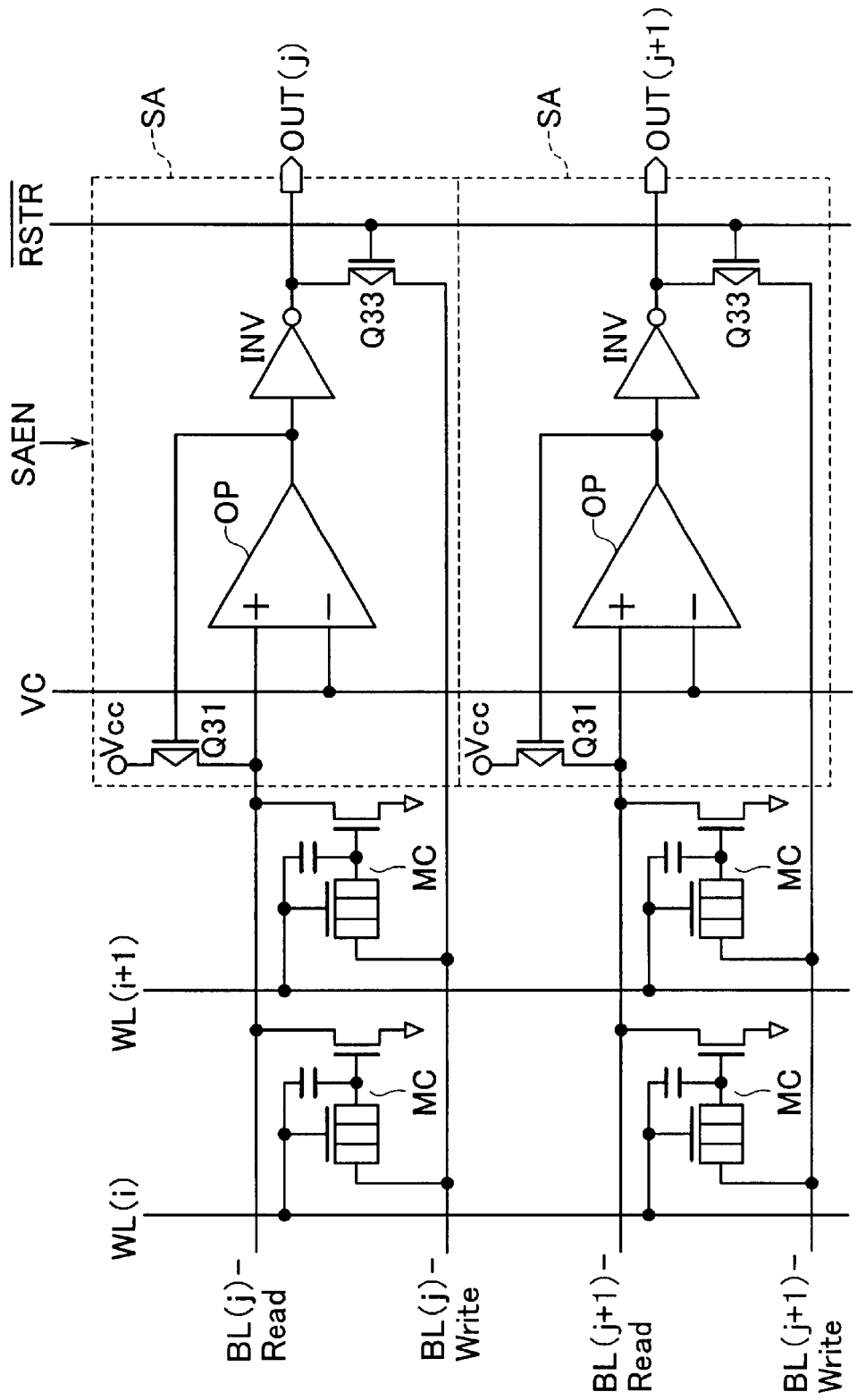
FIG. 7 is a diagram showing a configuration of a cell array using PLEDM cells and sense amplifiers associated therewith.
Figure 36A:
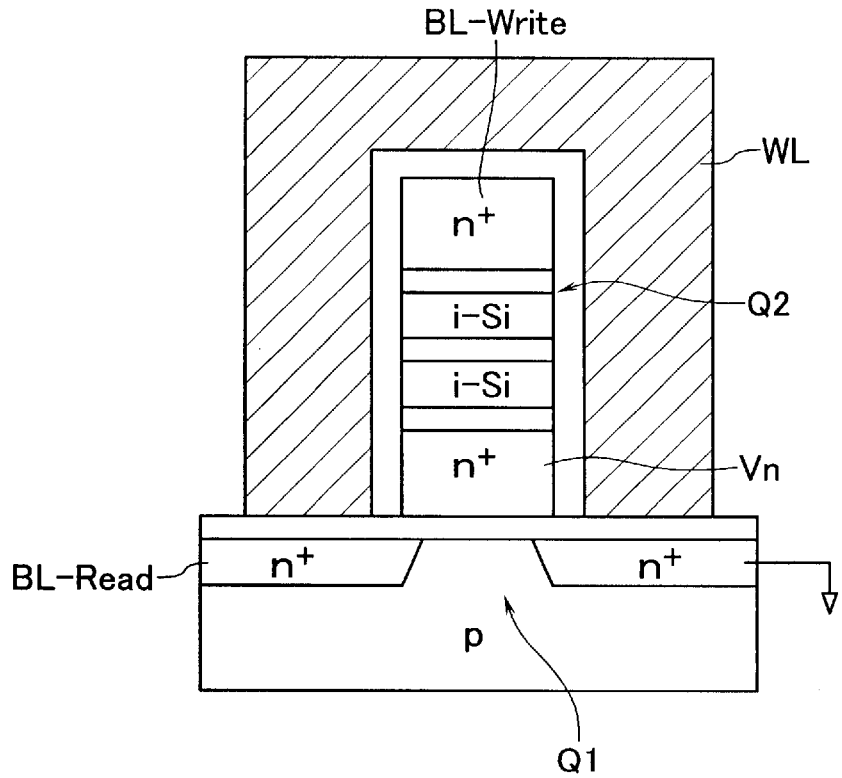
FIG. 36A illustrates in cross-section a structure of a PLEDM cell.
Figure 36B:
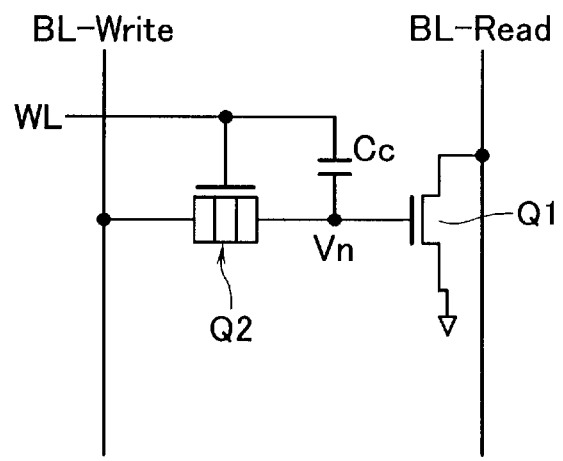
FIG. 36B shows an equivalent circuit thereof.
Figures 37A, 37B:
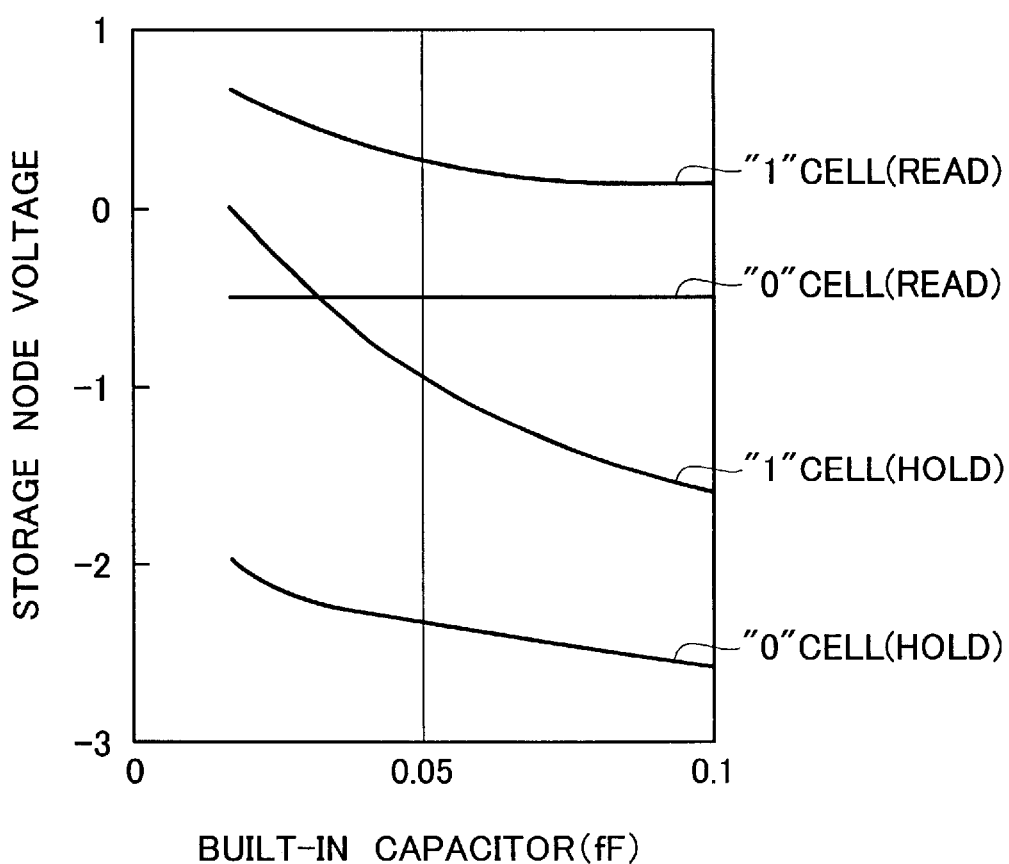
FIG. 37A is a table showing operation conditions of the PLED cell.
FIG. 37B is a graph showing the PLEDM cell's storage node voltage characteristics.

See next FIG. 7, which shows a configuration of a cell array employing, as the current-driven memory cells MC, phase-state low electron-number drive RAM (PLEDM) cells which are one type of gain cells, along with sense amplifiers SA associated therewith. A structure and equivalent circuit of each memory cell MC of this type are as shown in FIG. 36A and FIG. 36B, wherein the cell is generally made up from a sensing MOS transistor Q1 and a writing MOS transistor Q2 of high resistance. The sensing MOS transistor Q1 has its gate for use as a virtually "floating" storage node, which is potentially variable for permitting storage of data "1" or "0."

A respective one of the sense amplifiers SA is designed including an operational amplifier or op-amp OP, which is similar in basic arrangement to that shown in FIG. 3. More specifically the op-amp OP has a non-inverting input terminal to which a read bit line BL-Read is connected and an inverting input terminal to which a fixed or constant potential VC is applied. The read bit line BL-Read is provided with a chargeup PMOS transistor Q31 having a gate controllable by an output of the op-amp OP. The output of op-amp OP is taken out via an inverter INV.

Connected between a sense-amp output terminal and writing bit line BL-Write is a PMOS transistor Q33 which is controlled by a restore control signal RSTR(Bar), which will be represented as "/RSTR" for typographical clarity purposes only. With such an arrangement, output data-this is an inverted version of read data obtainable onto the read bit line BL-Read-will be transferred to the write bit line BL-Write and then restored. Preferably the restore operation is carried out in a way such that a write voltage of about 3V is given to word line WL for writing or "programming" the H or L level of output data into the storage node, although a detailed explanation thereof will be omitted herein.

The sense amplifiers SA are similar in operation principle to those shown in the cases of FIGS. 3 and 5. Letting the fixed potential VC be set at 500 mV for example, the read bit line BL-Read's clamp potential becomes VC when data reading. Consequently in this case also, write errors may be prevented while avoiding risks of unnecessary stresses application to the memory cells concerned.

Figure 8:
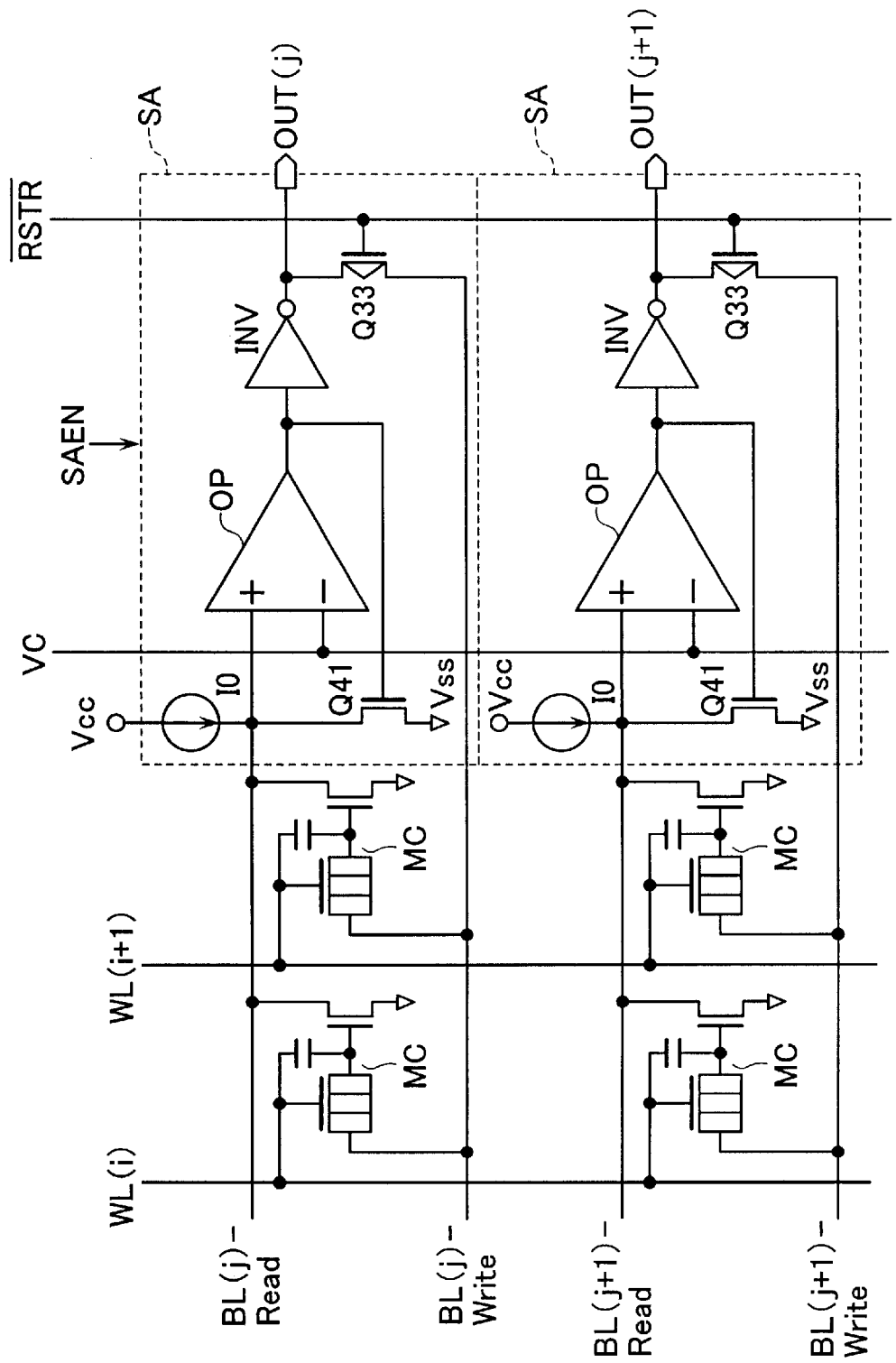
FIG. 8 is a diagram showing another configuration of the cell array using PLEDM cells and sense amplifiers.

Referring to FIG. 8, there is shown a cell array configuration along with sense amplifiers SA, which array employs as the current-driven memory cells MC thereof PLEDM cells based on the same principles as those shown in FIGS. 4 and 6. A restoring PMOS transistor Q33 in each sense amp SA is similar to that of FIG. 7. An operation principle of the sense amp SA is similar to that in the cases of FIGS. 4 and 6. Letting a fixed potential VC be set at 500 mV for example, the clamp potential of a read bit line BL-Read becomes VC. Accordingly in this case also, any unnecessary stresses will hardly be applied to the memory cells, which in turn makes it possible to prevent occurrence of writing errors.

Figure 9:
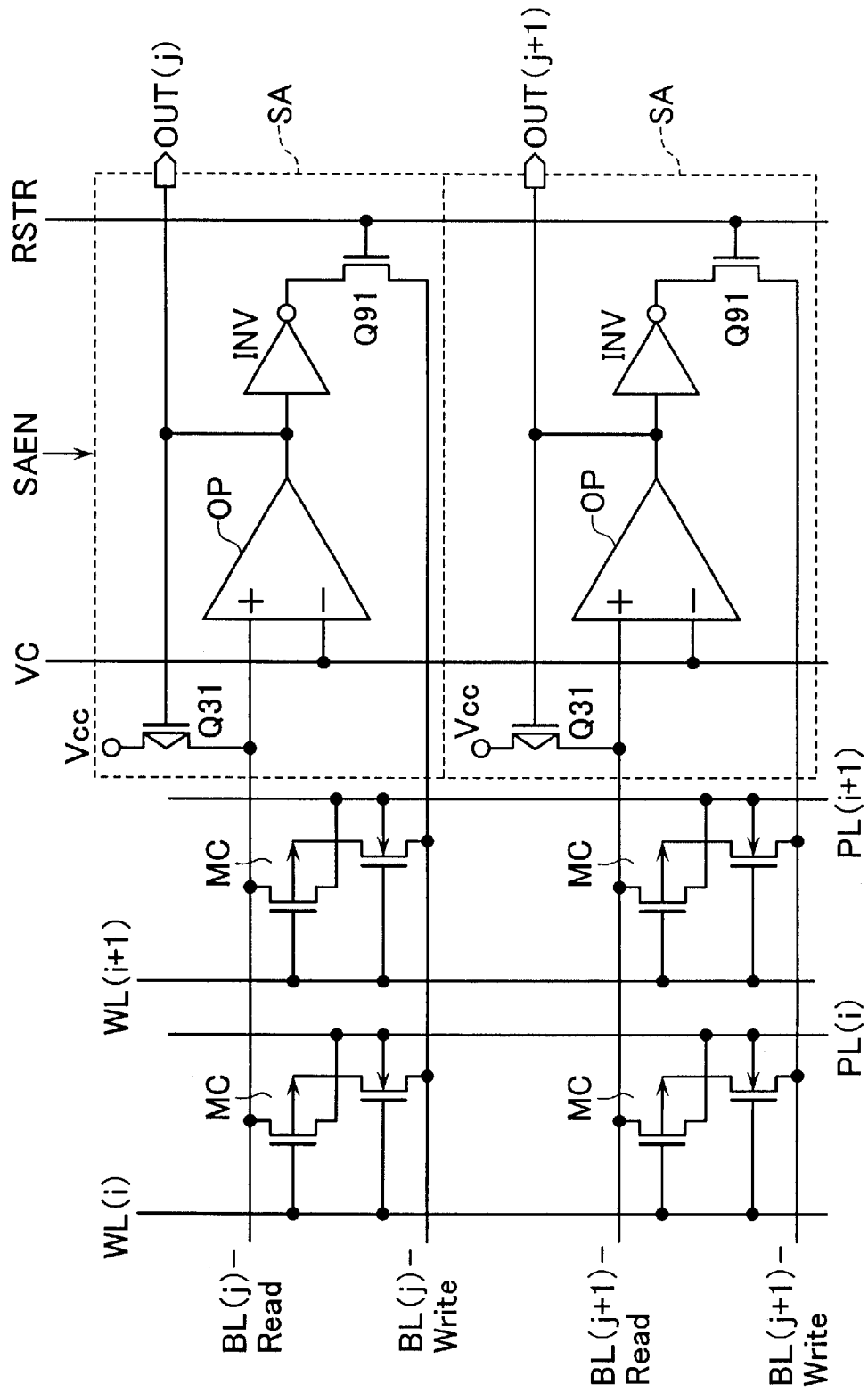
FIG. 9 is a diagram showing a configuration of a cell array using CDRAM cells and associative sense amplifiers.

See FIG. 9, which shows a cell array configuration using as the current-driven memory cells MC capacitor-less DRAM (CDRAM) cells, which are also one type of gain cells, along with sense amplifiers SA operatively associated therewith. The structure and equivalent circuitry of each memory cell of this type are as shown in FIG. 38, wherein the cell has a composite or "hybrid" structure including in combination a sensing PMOS transistor Q1 and a writing NMOS transistor Q2 over a silicon-on-insulator (SOI) substrate. The PMOS transistor Q1 has its channel body for use as an electrically "floating" storage node, which is variable in potential to permit storage of data "1" or "0."

The individual sense amplifier SA is designed to include an operational amplifier OP, which is substantially the same in basic arrangement as that shown in FIG. 7. The op-amp OP has a non-inverting input terminal to which a read bit line BL-Read is connected and an inverting input terminal to which a fixed or constant potential VC is applied. The read bit line BL-Read is provided with a chargeup PMOS transistor Q31 having its gate controllable by an output of op-amp OP.

The op-amp OP has an output terminal for use as a sense-amp output terminal, which is provided with an inverter INV. An NMOS transistor Q91 controllable by a restore control signal RSTR is connected between the inverter INV's output terminal and a corresponding one of write bit lines BL-Write. With such an arrangement, output data that is an inverted version of read data as obtained onto the read bit line BL-Read will be transferred to the write bit line BL-Write and then restored. Although any detailed explanation is eliminated herein, the restore operation is done in a way such that a write voltage of about 3V is applied to word line WL while applying a 0-V voltage to purge line PL to thereby write the H or L level of output data into the storage node from write bit line BL-Write.

The sense amplifier SA is similar in operation principles to those shown in FIGS. 3 and 5. During data reading, a 0-V voltage is applied to word line WL whereas a voltage of negative potential is given to purge line PL. While setting the fixed potential VC at 0V for example, the read bit line BL-Read's H level clamp potential becomes VC=0V during data reading. An L level output becomes the negative potential.

Accordingly in this case also, any unwanted stresses will no longer be applied to the memory cells, which in turn makes it possible to preclude occurrence of writing errors.

Figure 10:
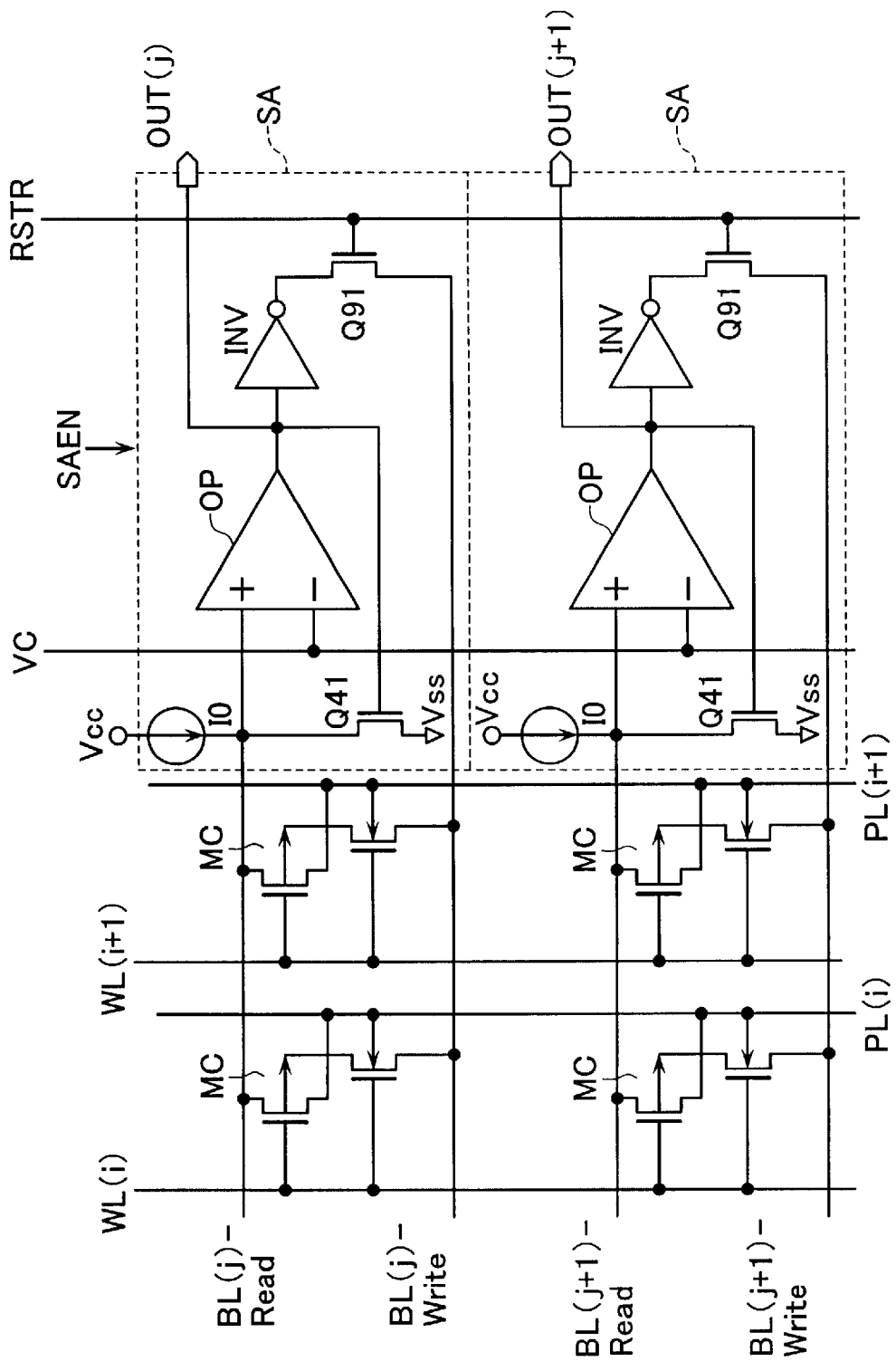
FIG. 10 is a diagram showing a configuration of a cell array using CDRAM cells and sense amplifiers.

Turning to FIG. 10, there is shown an exemplary memory cell array configuration similarly employing CDRAM cells as the memory cells MC and also incorporating sense amplifiers SA of the scheme corresponding to that of FIG. 8. Each sense amp SA includes an operational amplifier OP having a non-inverting input terminal to which a read bit line BL-Read is connected and an inverting input terminal to which a fixed potential VC is given. The read bit line BL-Read is provided with a constant current source I0 and also with a discharging NMOS transistor Q41 as controlled by an output of the op-amp OP. The sense amp SA also includes a restoring NMOS transistor Q91, which is similar to that shown in FIG. 9.

In this case also, a similar operation is done in a way which follows. During data reading, a 0-V voltage is applied to word line WL whereas a voltage of negative potential is given to purge line PL. While setting the fixed potential VC at 0V for example, the read bit line BL-Read's H level clamp potential becomes VC=0V during data reading. An L level output becomes the negative potential.

Figure 11:
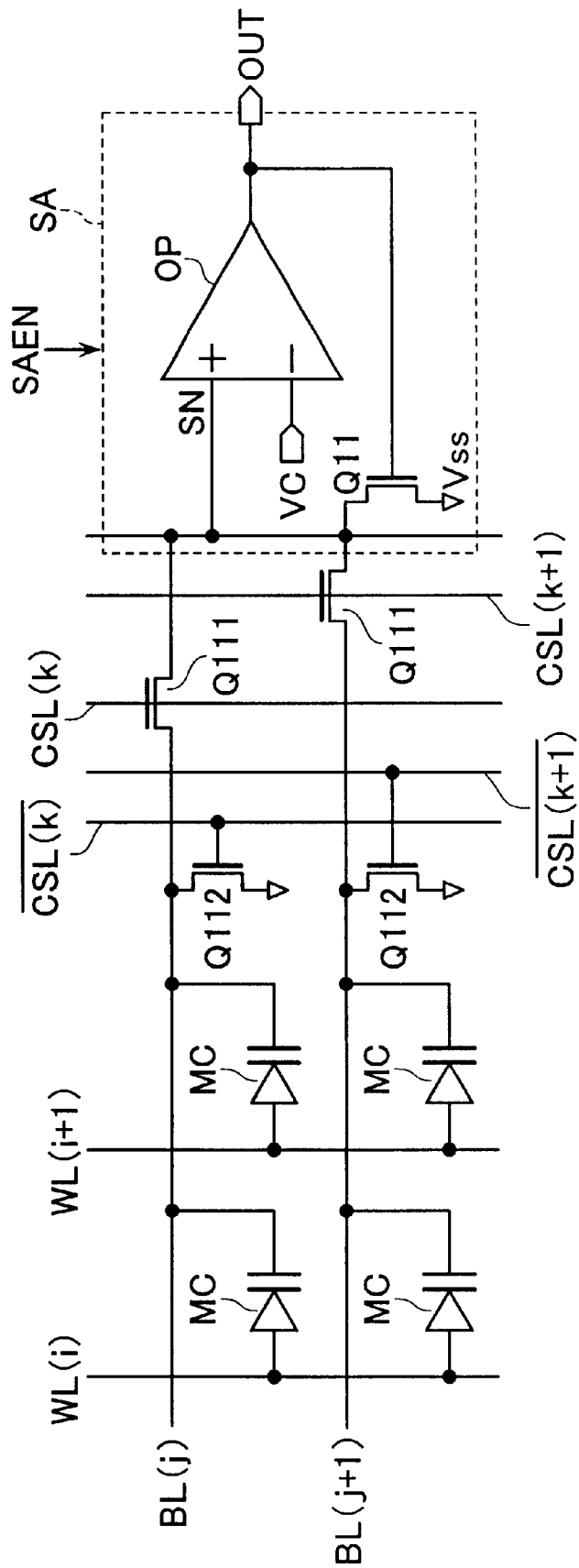
FIG. 11 is a diagram showing a configuration of a cell array using TSD cells and a sense amplifier associated therewith.

See FIG. 11. This diagram shows a memory cell array configuration similar in basic arrangement to that of FIG. 1 with each sense amplifier SA being modified to be selectively connected to bit lines via a column gate associated therewith. An operational amplifier OP in sense amp SA has a non-inverting input terminal for use as a sense node SN which is selectively connectable to bit lines BL(j), BL(j+1) through NMOS transistors Q111 as driven in response to column select signals CSL(k), CSL(k+1). To couple non-select bit lines to the ground, NMOS transistor Q112 are connected to respective bit lines, which transistors are controllable by inverted signals /CSL(k), /CSL(k+1) of the column select signals CSL(k), CSL(k+1).

A sense operation is the same as that of the case shown in FIG. 1.

Figure 12:
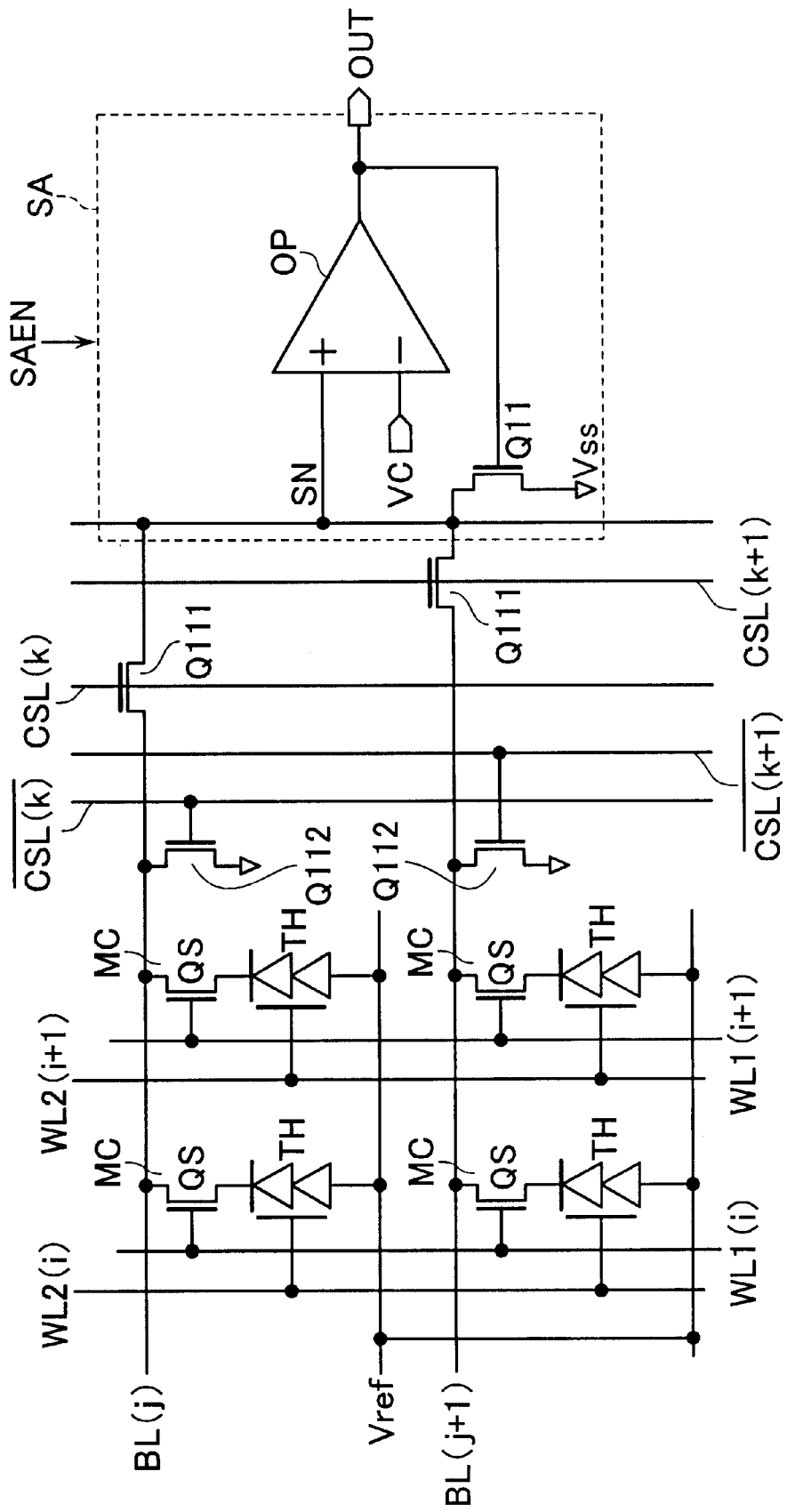
FIG. 12 is a diagram showing a configuration of a cell array using T-RAM cells and its associated sense amplifier.

See next to FIG. 12, which shows a memory cell array configuration similar in basic arrangement to that of FIG. 2 with the sense amplifier SA being modified to be selectively connected to bit lines via a column gate associated therewith. An operational amplifier OP in sense amp SA has a non-inverting input terminal for use as a sense node SN which is selectively connectable to bit lines BL(j), BL(j+1) through NMOS transistors Q111 as driven in response to column select signals CSL(k), CSL(k+1). To couple non-select bit lines to the ground, NMOS transistors Q112 are connected to respective bit lines, which transistors are controllable by inverted signals /CSL(k), /CSL(k+1) of the column select signals CSL(k), CSL(k+1).

A sense operation is the same as that of the case shown in FIG. 2.

Figure 13:
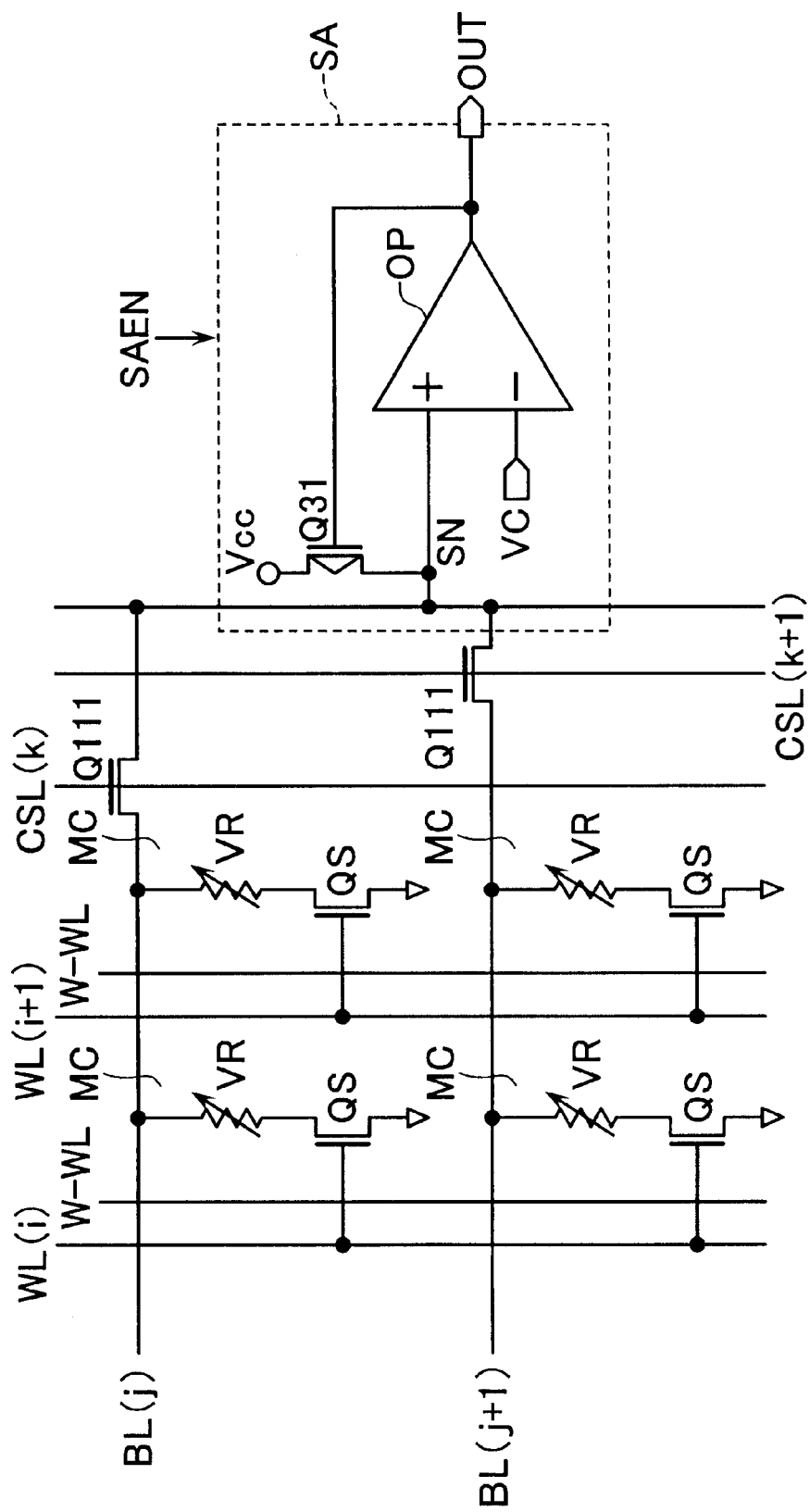
FIG. 13 is a diagram showing a configuration of a cell array using MTJ-MRAM cells and a sense amplifier.

See next to FIG. 13. This diagram depicts a memory cell array configuration similar in basic arrangement to that of FIG. 3 with the sense amplifier SA being modified to be selectively connectable to bit lines via a column gate associated therewith. An operational amplifier OP in sense amp SA has a non-inverting input terminal for use as a sense node SN which is selectively connectable to bit lines BL(j), BL(j+1) via NMOS transistors Q111 as driven in response to column select signals CSL(k), CSL(k+1), respectively.

A sense operation is the same as that of the case shown in FIG. 3.

Figure 14:
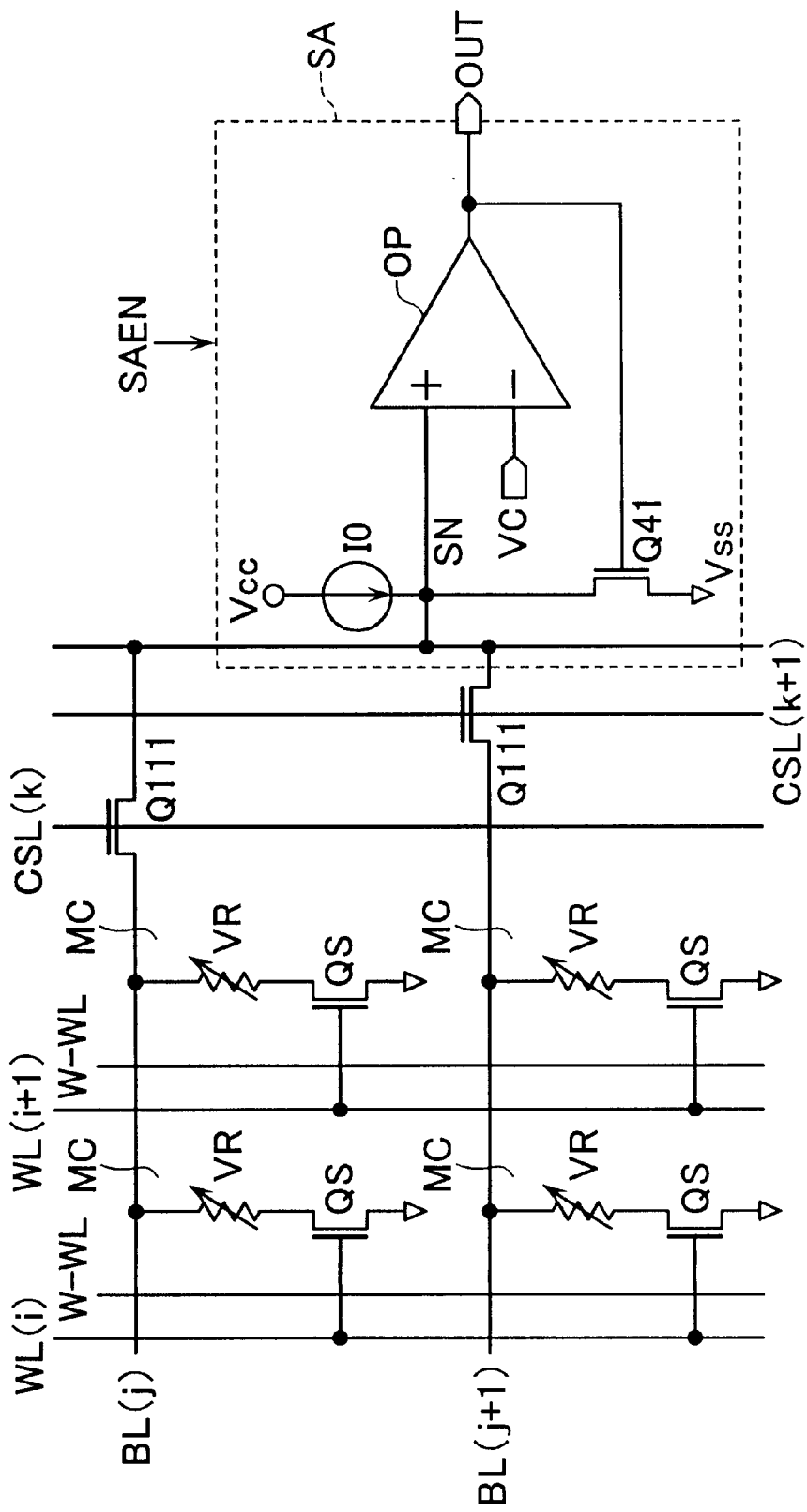
FIG. 14 is a diagram showing another configuration of the cell array using MTJ-MRAM cells and sense amplifier.

See next to FIG. 14, which shows a memory cell array configuration similar in basic arrangement to that of FIG. 4 with the sense amplifier SA being modified to be selectively connected to bit lines via a column gate associated therewith. An operational amplifier OP in sense amp SA has a non-inverting input terminal for use as a sense node SN which is selectively connectable to bit lines BL(j), BL(j+1) through NMOS transistors Q111 as driven in response to column select signals CSL(k), CSL(k+1), respectively.

A sense operation is the same as that of the case shown in FIG. 4.

Figure 15:
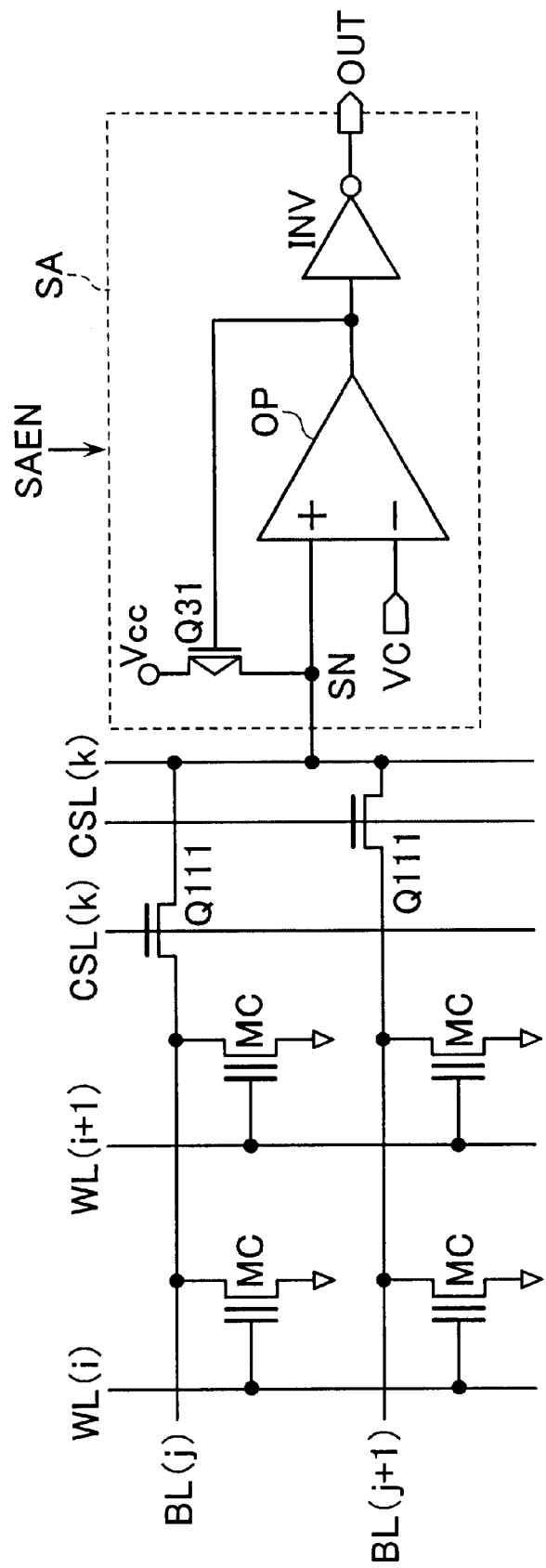
FIG. 15 is a diagram showing a configuration of a cell array using NOR-EEPROM cells and a sense amplifier.

See next to FIG. 15, which shows a memory cell array configuration similar in basic arrangement to that of FIG. 5 with the sense amplifier SA being modified to be selectively connected to bit lines via a column gate associated therewith. An operational amplifier OP in sense amp SA has a non-inverting input terminal for use as a sense node SN which is selectively connectable to bit lines BL(j), BL(j+1) through NMOS transistors Q111 as driven in response to column select signals CSL(k), CSL(k+1) respectively.

A sense operation is the same as that of the case shown in FIG. 5.

Figure 16:
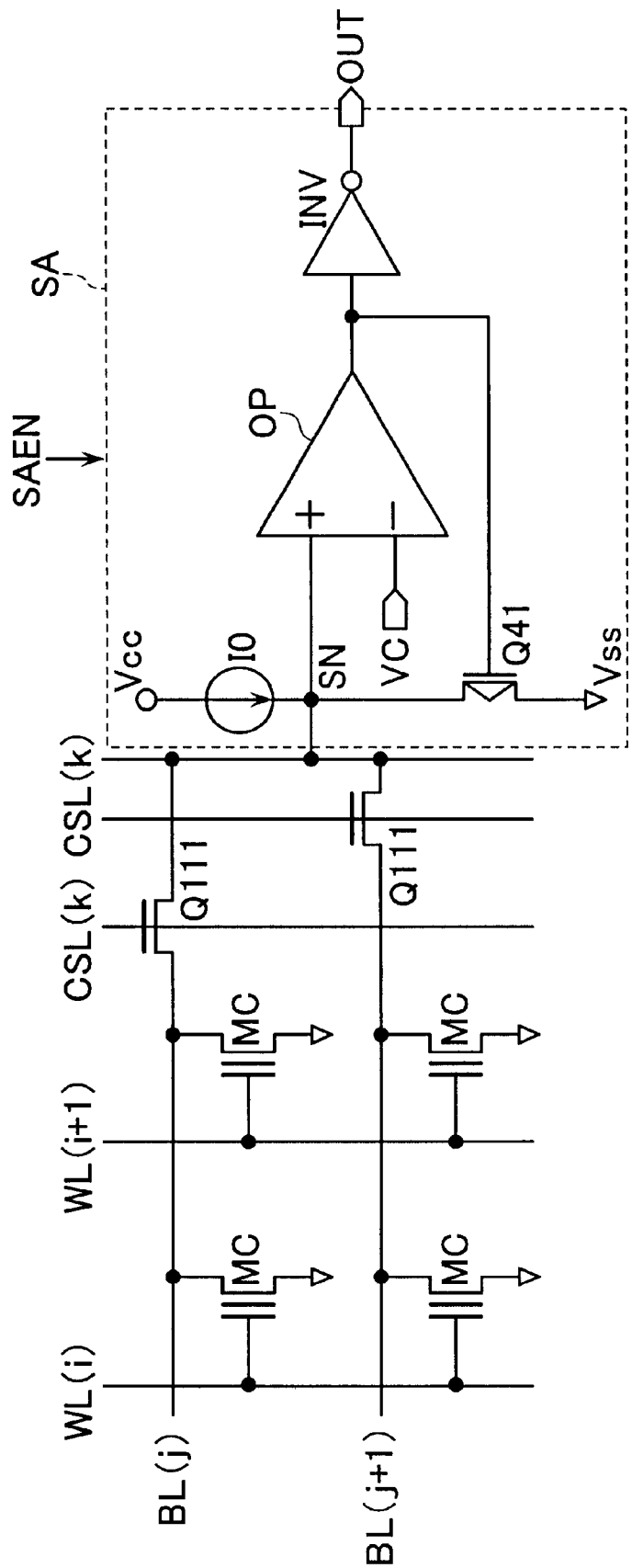
FIG. 16 is a diagram showing another configuration of the cell array using NOR-EEPROM cells and sense amplifier.

See next to FIG. 16, which shows a memory cell array configuration similar in basic arrangement to that of FIG. 6 with the sense amplifier SA being modified to be selectively connected to bit lines via a column gate associated therewith. An operational amplifier OP in sense amp SA has a non-inverting input terminal for use as a sense node SN which is selectively connectable to bit lines BL(i), BL(i+1) through NMOS transistors Q111 as driven in response to column select signals CSL(k), CSL(k+1).

A sense operation is the same as that of the case shown in FIG. 6.

Figure 17:
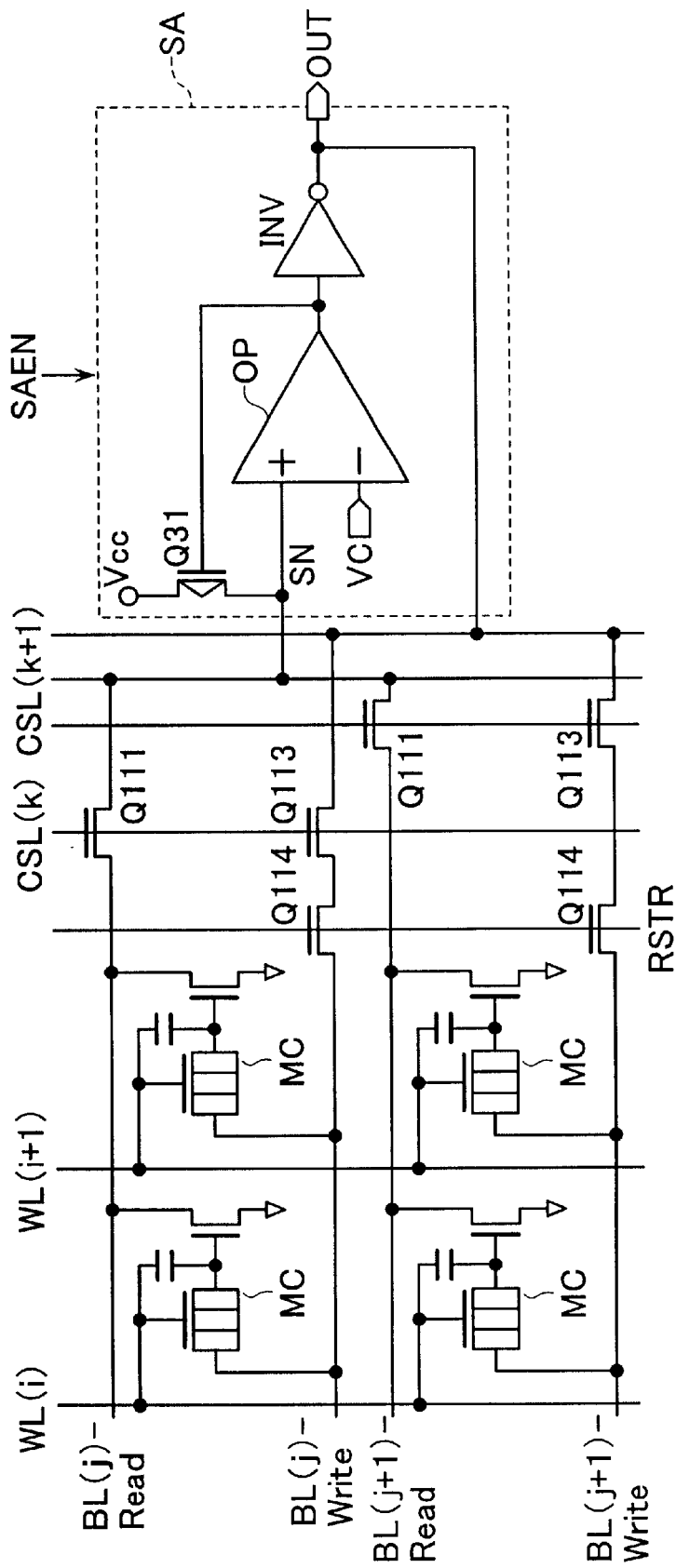
FIG. 17 is a diagram showing a configuration of a cell array using PLEDM cells and a sense amplifier.

See next to FIG. 17, which shows a memory cell array configuration similar in basic arrangement to that of FIG. 7 with the sense amplifier SA being modified to be selectively connectable to bit lines via a column gate associated therewith. An operational amplifier OP in sense amp SA has a non-inverting input terminal for use as a sense node SN which is selectively connectable to read bit lines BL(j)-Read, BL(j+1)-Read through NMOS transistors Q111 as driven in response to column select signals CSL(k), CSL(k+1) respectively.

A restoring NMOS transistor Q114 is provided between the sense amplifier's output terminal and each write bit line BL-Write via an NMOS transistor Q113 that is to be selected simultaneously together with the column gate transistor Q111.

A sense operation is the same as that of the case shown in FIG. 7. Regarding a restore operation also, this will be done via the transistor Q114 as driven by a restore control signal RSTR in a similar way to that shown in FIG. 7.

Figure 18:
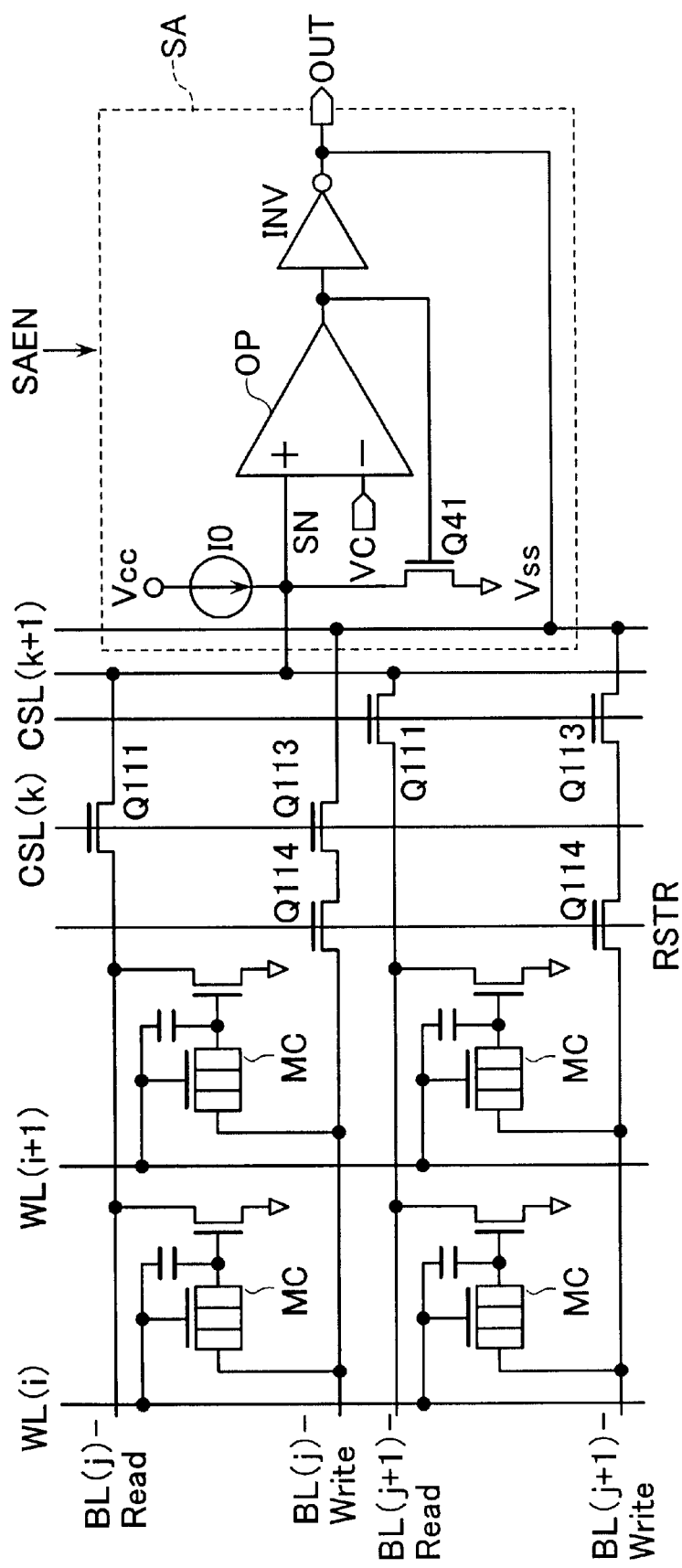
FIG. 18 is a diagram showing a configuration of a cell array using PLEDM cells and a sense amplifier.

See next to FIG. 18, which shows a memory cell array configuration similar in basic arrangement to that of FIG. 8 with the sense amplifier SA being modified to be selectively connectable to bit lines via a column gate associated therewith. An operational amplifier OP in sense amp SA has a non-inverting input terminal for use as a sense node SN which is selectively connected to read bit lines BL(j)-Read, BL(j+1)-Read through NMOS transistors Q111 as driven in response to column select signals CSL(k), CSL(k+1), respectively.

A restoring NMOS transistor Q114 is provided between the sense amplifier's output terminal and each write bit line BL-Write via an NMOS transistor Q113 that is to be selected simultaneously together with the column gate transistor Q111.

A sense operation is the same as that of the case shown in FIG. 8. Regarding a restore operation also, this will be done through the transistor Q114 as driven by a restore control signal RSTR in a similar way to that shown in FIG. 8.

Figure 19:
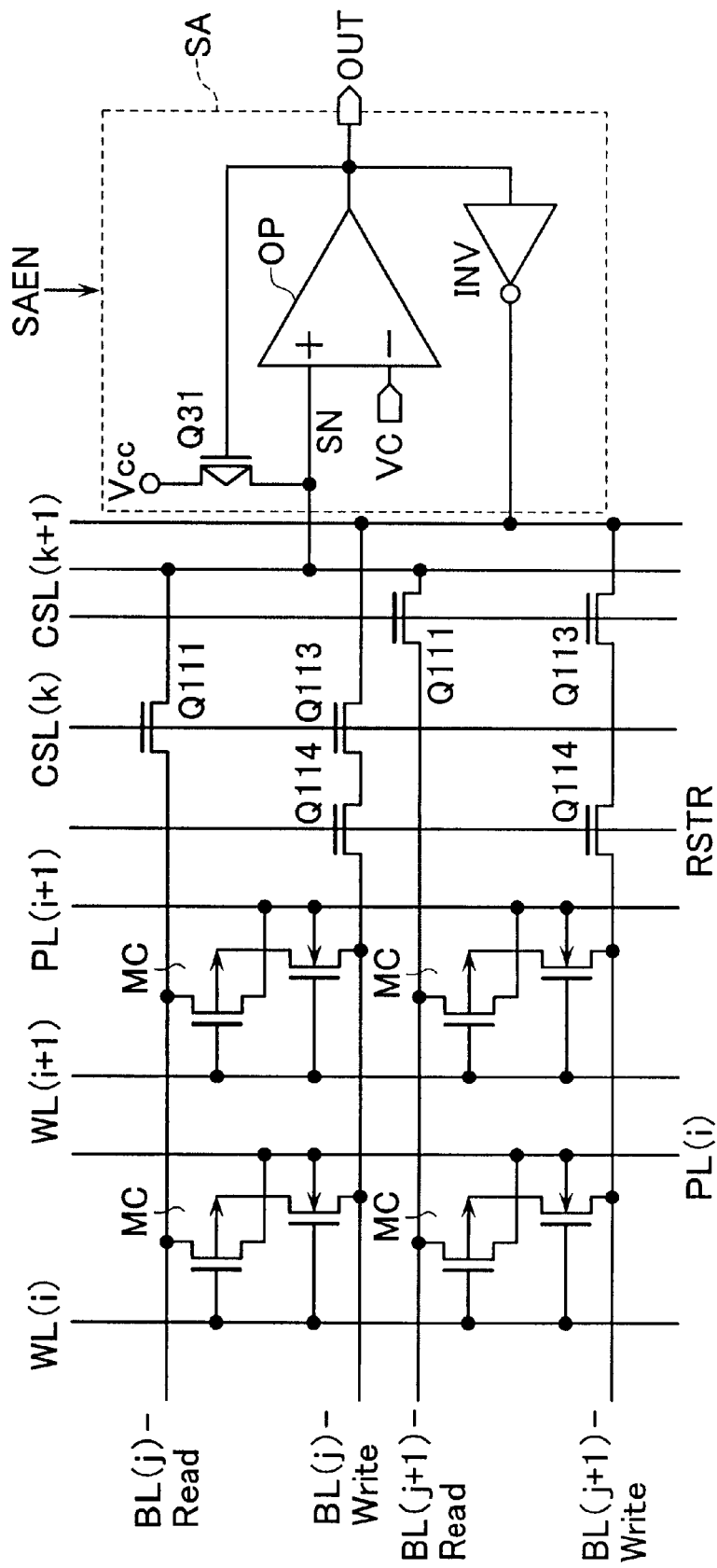
FIG. 19 is a diagram showing a configuration of a cell array using CDRAM cells and a sense amplifier.

See next to FIG. 19. This diagram shows a memory cell array configuration similar in basic arrangement to that of FIG. 9 with the sense amplifier SA being modified to be selectively connected to bit lines via a column gate associated therewith. An operational amplifier OP in sense amp SA has a non-inverting input terminal for use as a sense node SN which is selectively connectable to read bit lines BL(j)-Read, BL(j+1)-Read via NMOS transistors Q111 as driven in response to column select signals CSL(k), CSL(k+1).

A restoring NMOS transistor Q114 is provided between the sense amp output terminal and each write bit line BL-Write via an NMOS transistor Q113 that is to be selected simultaneously together with the column gate transistor Q111.

A sense operation is the same as that of the case shown in FIG. 9. With regard to a restore operation also, this will be done through the transistor Q114 as driven by a restore control signal RSTR in a similar way to that shown in FIG. 9.

Figure 20:
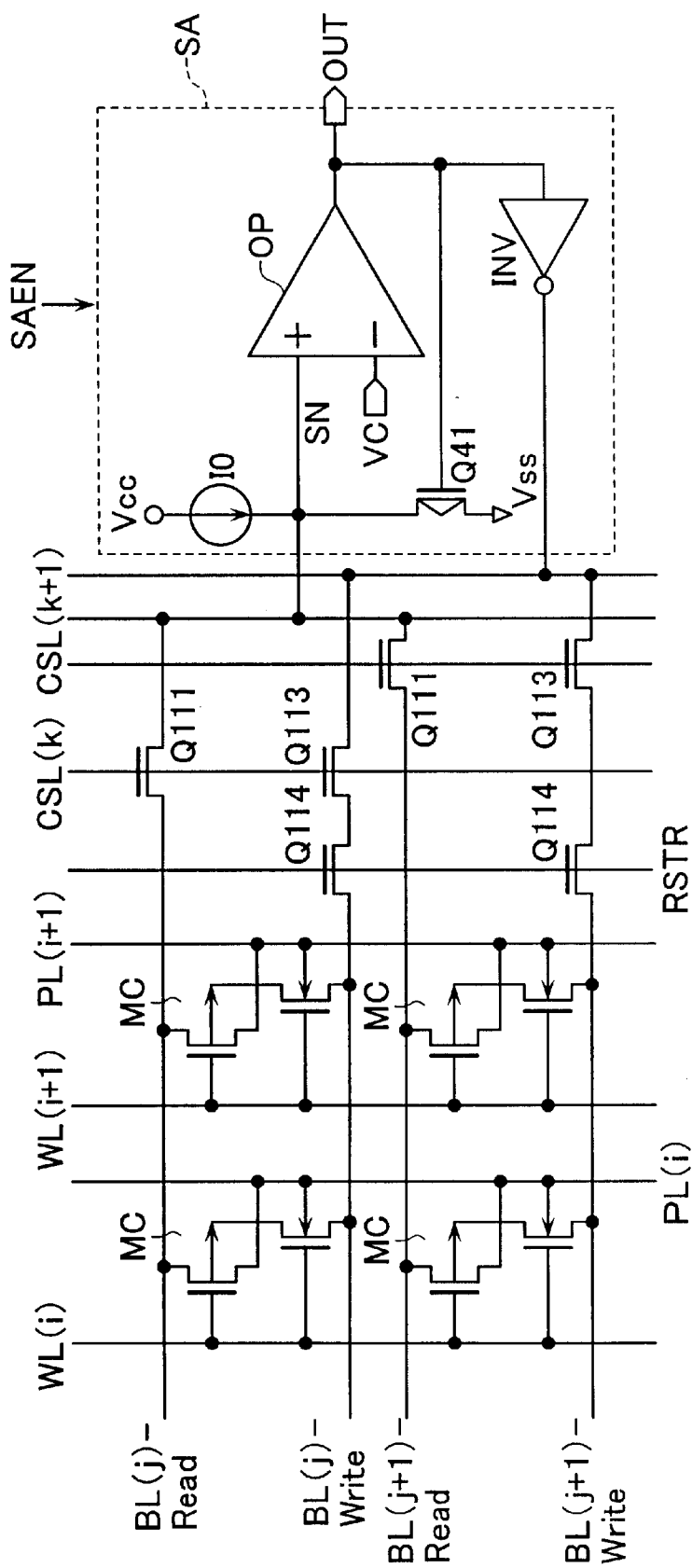
FIG. 20 is a diagram showing another configuration of the cell array using CDRAM cells and sense amplifier.

See next to FIG. 20, which depicts a memory cell array configuration similar in basic arrangement to that of FIG. 10 with the sense amplifier SA being modified to be selectively connected to bit lines via a column gate associated therewith. An operational amplifier OP in sense amp SA has a non-inverting input terminal for use as a sense node SN which is selectively connectable to read bit lines BL(j)-Read, BL(j+1)-Read through NMOS transistors Q111 as driven in response to column select signals CSL(k), CSL (k+1), respectively.

A restoring NMOS transistor Q114 is provided between the sense amp output terminal and each write bit line BL-Write via an NMOS transistor Q113 that is to be selected simultaneously together with the column gate transistor Q111.

A sense operation is the same as that of the case shown in FIG. 10. Regarding a restore operation also, this will be done through the transistor Q114 as driven by a restore control signal RSTR in a similar way to that shown in FIG. 10.

Figure 21:
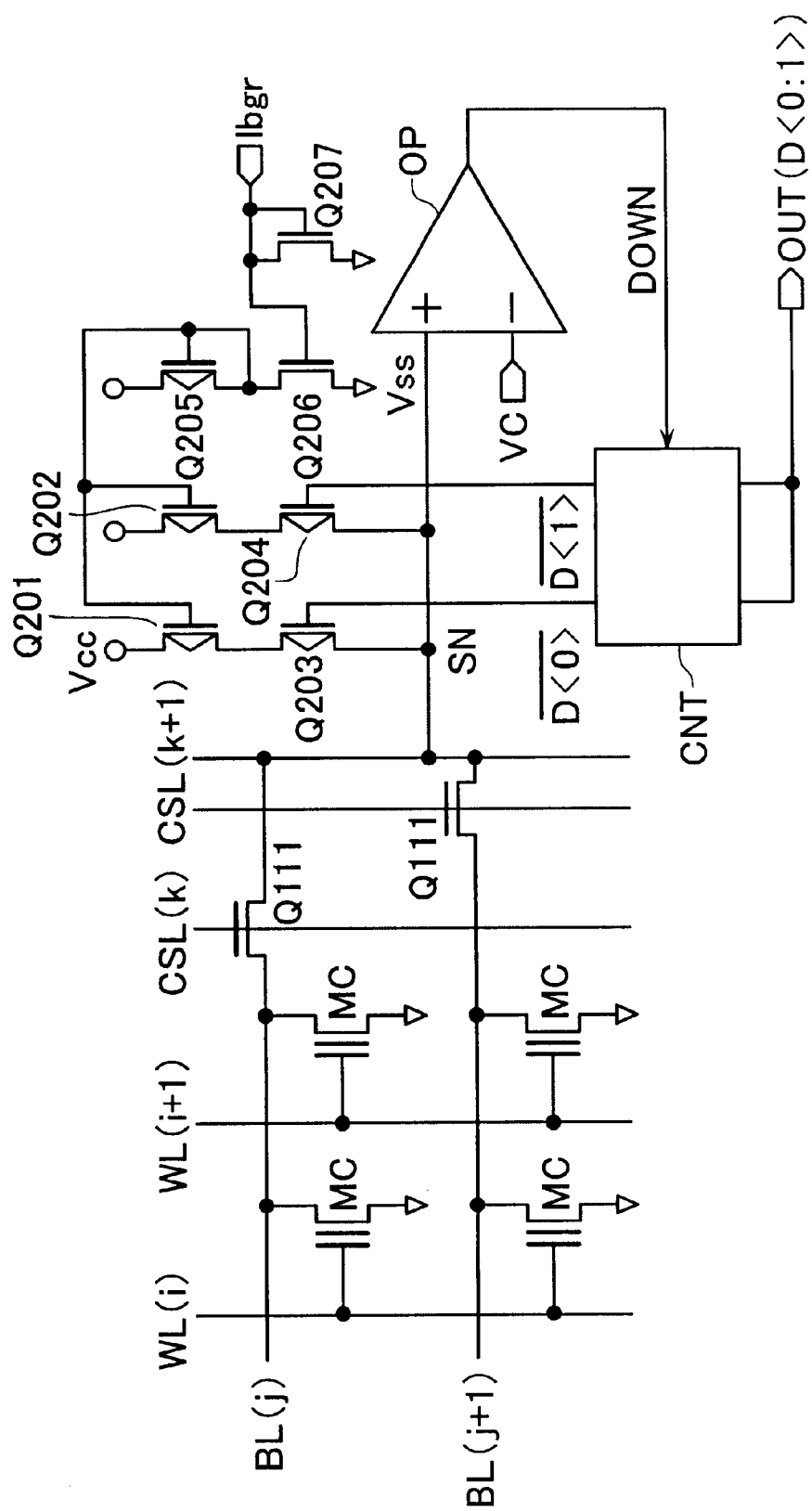
FIG. 21 is a diagram showing a configuration of a cell array using NOR-EEPROM cells and sense amplifier.

Turning to FIG. 21, there is shown a configuration of main part of a NOR type EEPROM, which is similar in principal arrangement to that of FIG. 15 and includes a sense system designed for application to multiple-value data storage. Preferably EEPROM cells used are arranged to perform triode operations in order to avoid risks of writing errors during data reading. Letting the bit-line potential be suppressed at 500 mV for example in accordance with the principles of this invention as disclosed and claimed herein, a resultant cell current is proportional to a gate voltage (Vg−Vth); in view of this, it will be desired that a load current be made different between when an upper level bit of multi-value data is read and when its lower level bit is to be read.

One preferred form with such upper/lower bit level-dependent load current differentiability is shown in FIG. 21, which employs as the one corresponding to the load current source transistor Q31 of FIG. 15 a couple of PMOS transistors Q201, 202 different in current driving ability from each other, wherein the former is for the upper bit whereas the latter is for lower bit. One practical way of making these transistors Q201, Q202 different in current drivability is to let them differ in channel width W from each other. While the MOS transistor drivability is generally determinable by the ratio of a channel width W to channel length L, it will be preferable that chip-design parameters are less in number. Also note that changing the channel length among MOS transistors used must come after careful consideration of possible elongation or extension of source/drain diffusion layers, which in turn requires more complicated and time-consuming works for chip design proceedings. In view of this, the illustrative embodiment is such that the channel width alone is changed.

The current-source PMOS transistors Q201, Q202 make up a current mirror circuit together with a PMOS transistor Q205. The PMOS transistor Q205 and an NMOS transistor Q206 constitute a reference current source circuit. One example is that the NMOS transistor Q206 is designed to be driven by a terminal voltage of a diode-coupled NMOS transistor Q207, to which a current of constant current source Ibgr as created by a band-gap reference (BGR) circuit is supplied, thereby causing a reference current to be produced at PMOS transistor Q205. And, certain load currents are expected to flow into load PMOS transistors Q201, Q202 respectively, each of which currents is determined by a prespecified channel width ratio relative to the reference current flowing in PMOS transistor Q205.

Figure 48:
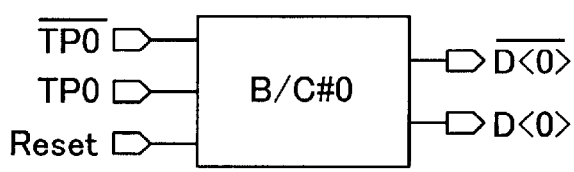
FIG. 48 is a diagram showing a configuration of a binary counter.
Figure 48:
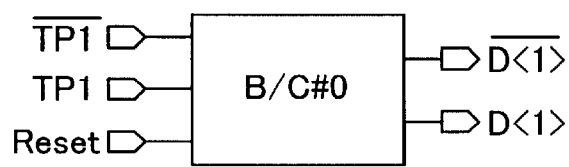

The load current of PMOS transistors Q201, Q202 is switched through sampling and feedback of an output of op-amp OP. Practically a 2-bit binary counter CNT shown in FIG. 48 is provided. This counter is operatively responsive to receipt of the op-amp OP's output as a down-count signal for generating its output signals /D<0>, /D<1>, which are used to control PMOS transistors Q203, Q204 so that these turn on sequentially. With such an arrangement, it is possible to make the load current different between during upper-level bit sensing and during lower-level bit sensing. The output of such binary counter CNT will be for direct use as a sense output. After completion of sense output determination or "judgment," counter CNT is rendered inoperative, i.e. made inactive.

Figure 22:
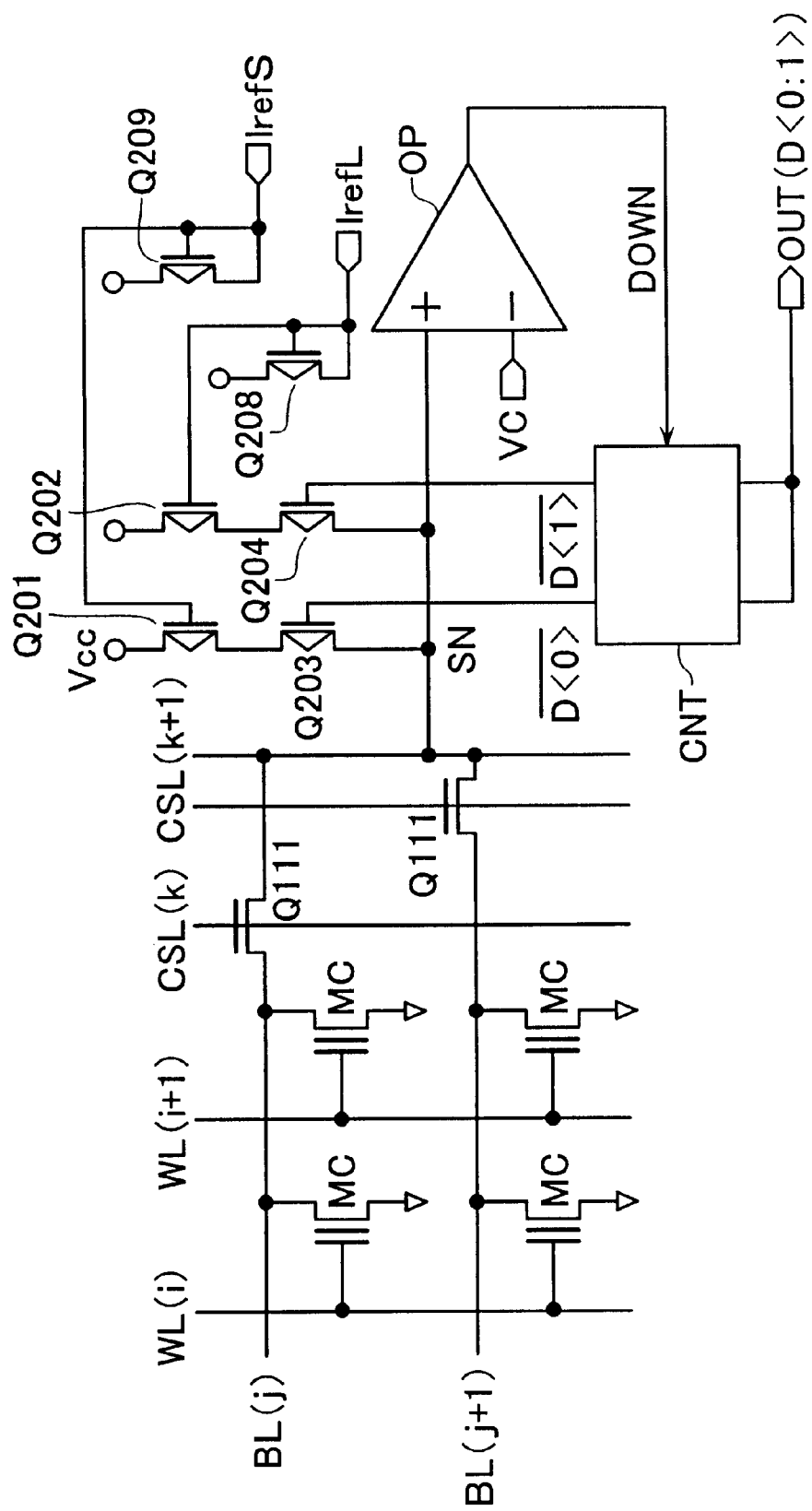
FIG. 22 is a diagram showing another configuration of the cell array using NOR-EEPROM cells and sense amplifier.

A slightly modified embodiment of that of FIG. 21 is shown in FIG. 22 in circuit diagram form. Whereas the embodiment of FIG. 21 is designed using the constant current source Ibgr used in common for the current source PMOS transistors Q201, Q202, the FIG. 22 embodiment incorporates therein separate current sources IrefS, IrefL for independent determination of /D<1> and /D<0>. These constant current sources IrefS, IrefL are operatively associated with PMOS transistors Q209, Q208, each of which makes up a current mirror circuit together with a corresponding one of the PMOS transistors Q201, Q202.

Figure 49:
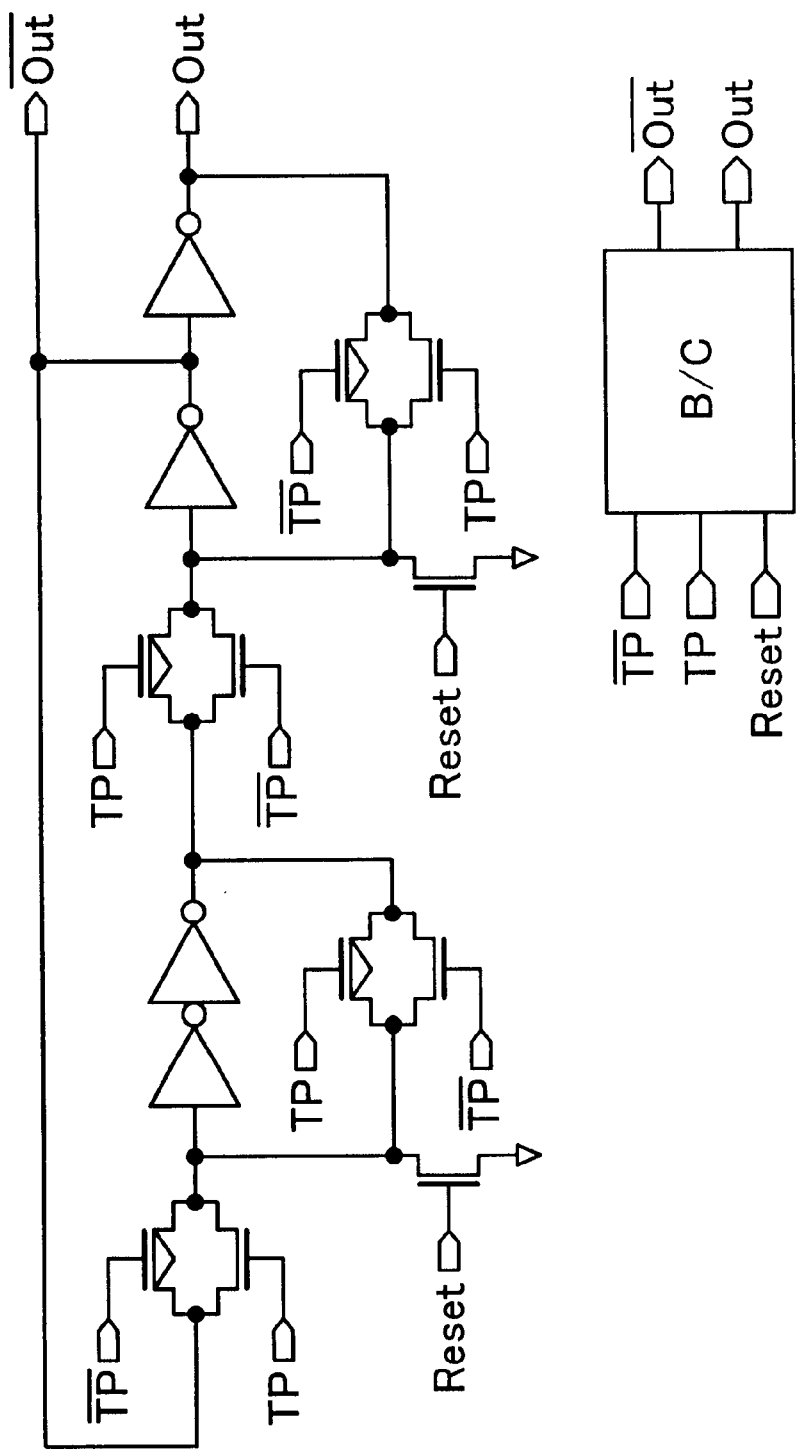
FIG. 49 is a diagram showing a detailed configuration of the binary counter.
Figure 50:
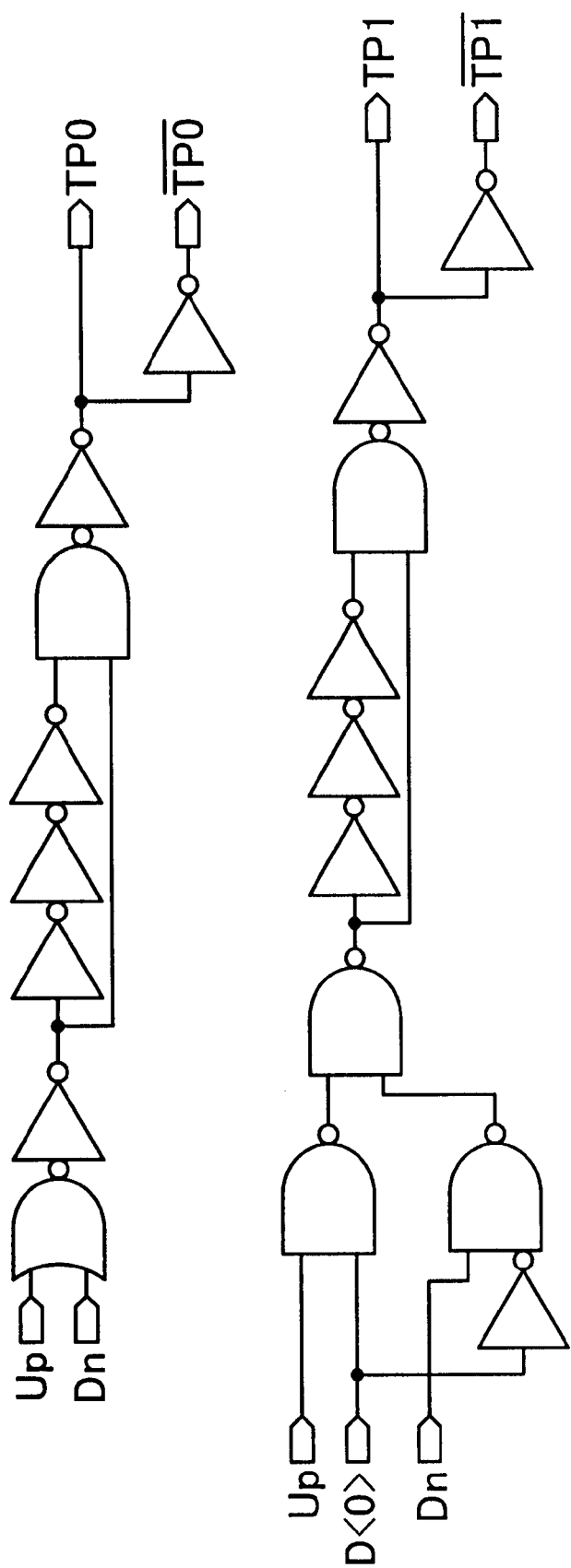
FIG. 50 is a diagram showing a configuration of a binary counter driving circuit.
Figure 51:
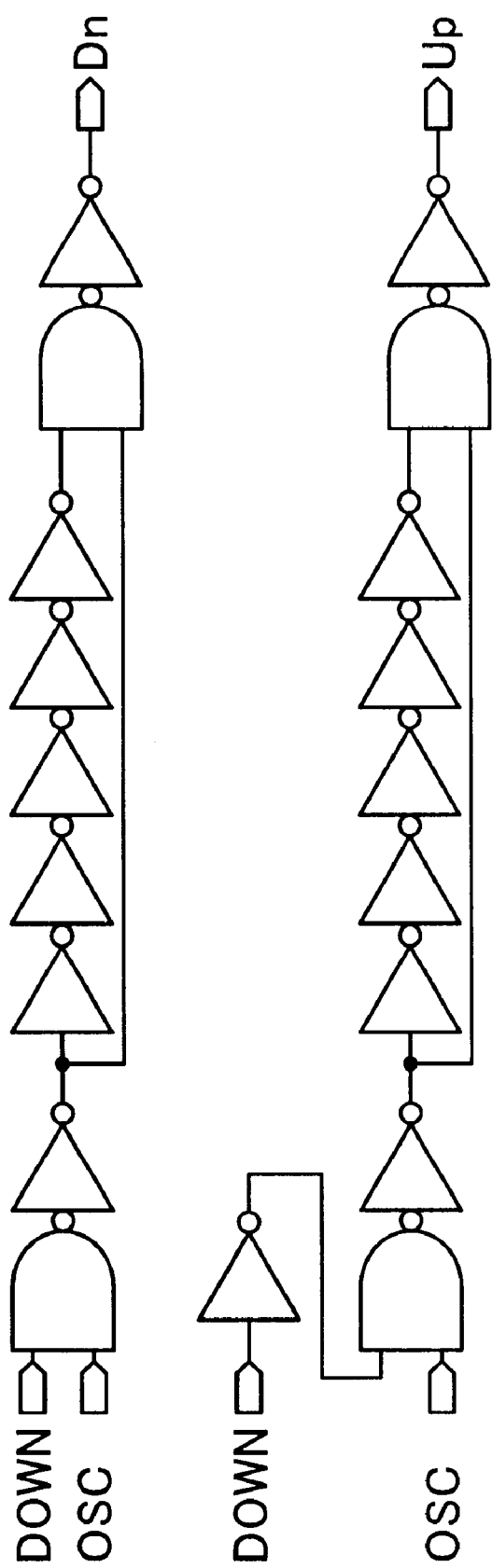
FIG. 51 is a diagram showing a configuration of a trigger signal generation circuit operatively associated with the binary counter drive circuit.
Figure 52:
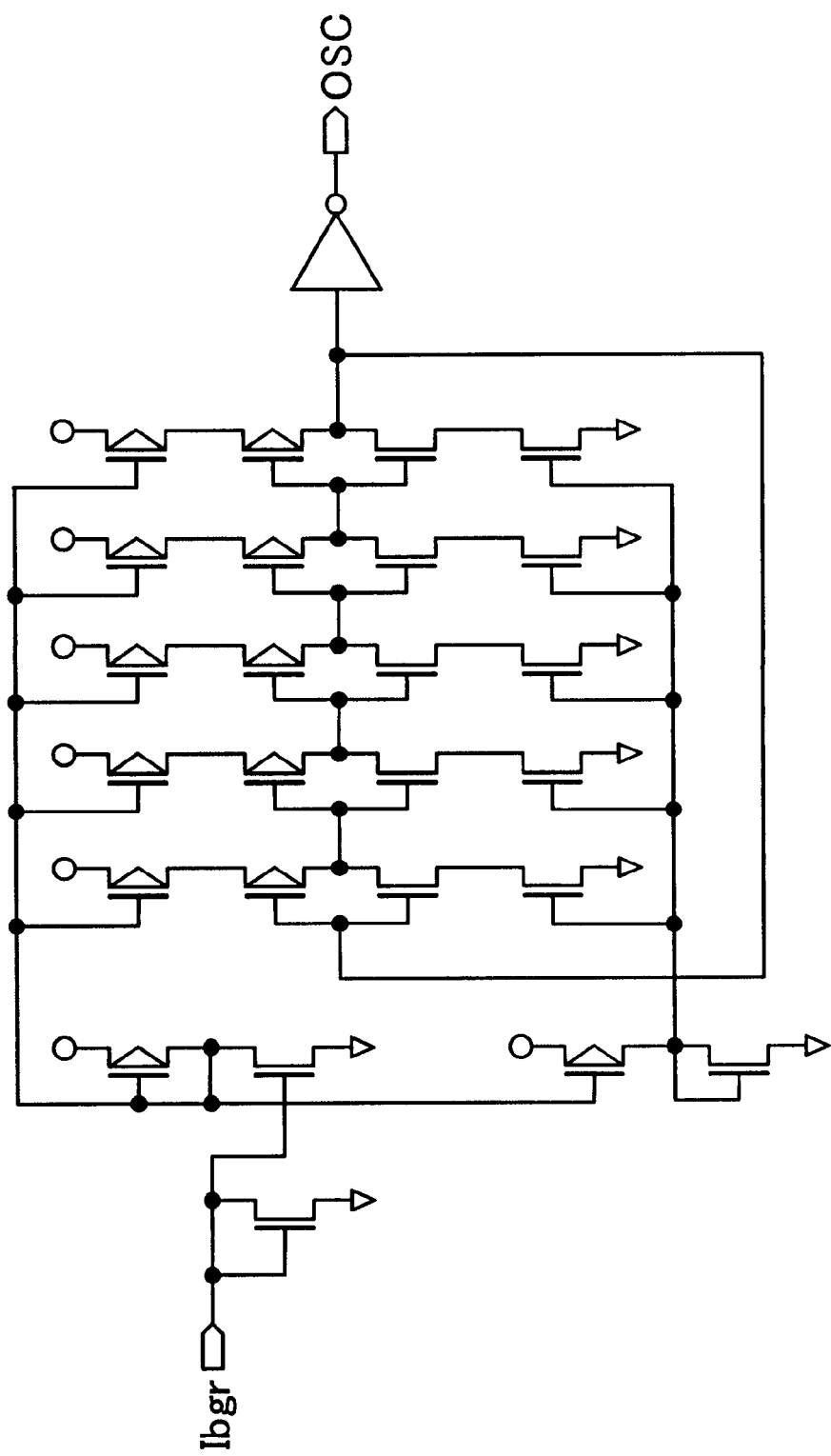
FIG. 52 is a diagram showing a configuration of a ring oscillator for generation of a sampling signal(s) and a trigger signal(s).
Figure 53:
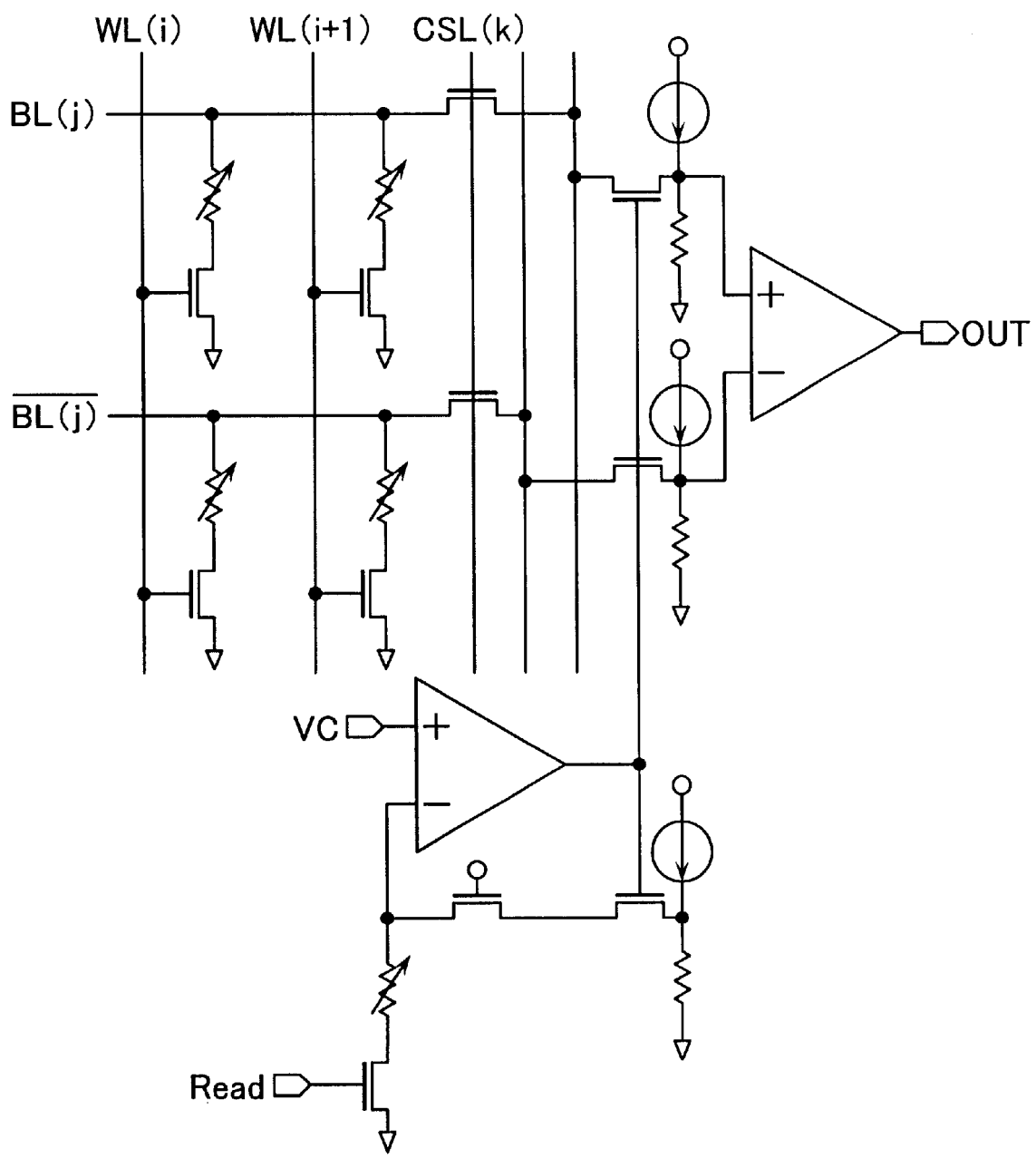
FIG. 53 is a diagram showing a configuration of one prior art cell array using MTJ-MRAM cells and sense amplifier circuitry associated therewith.
Figure 54:
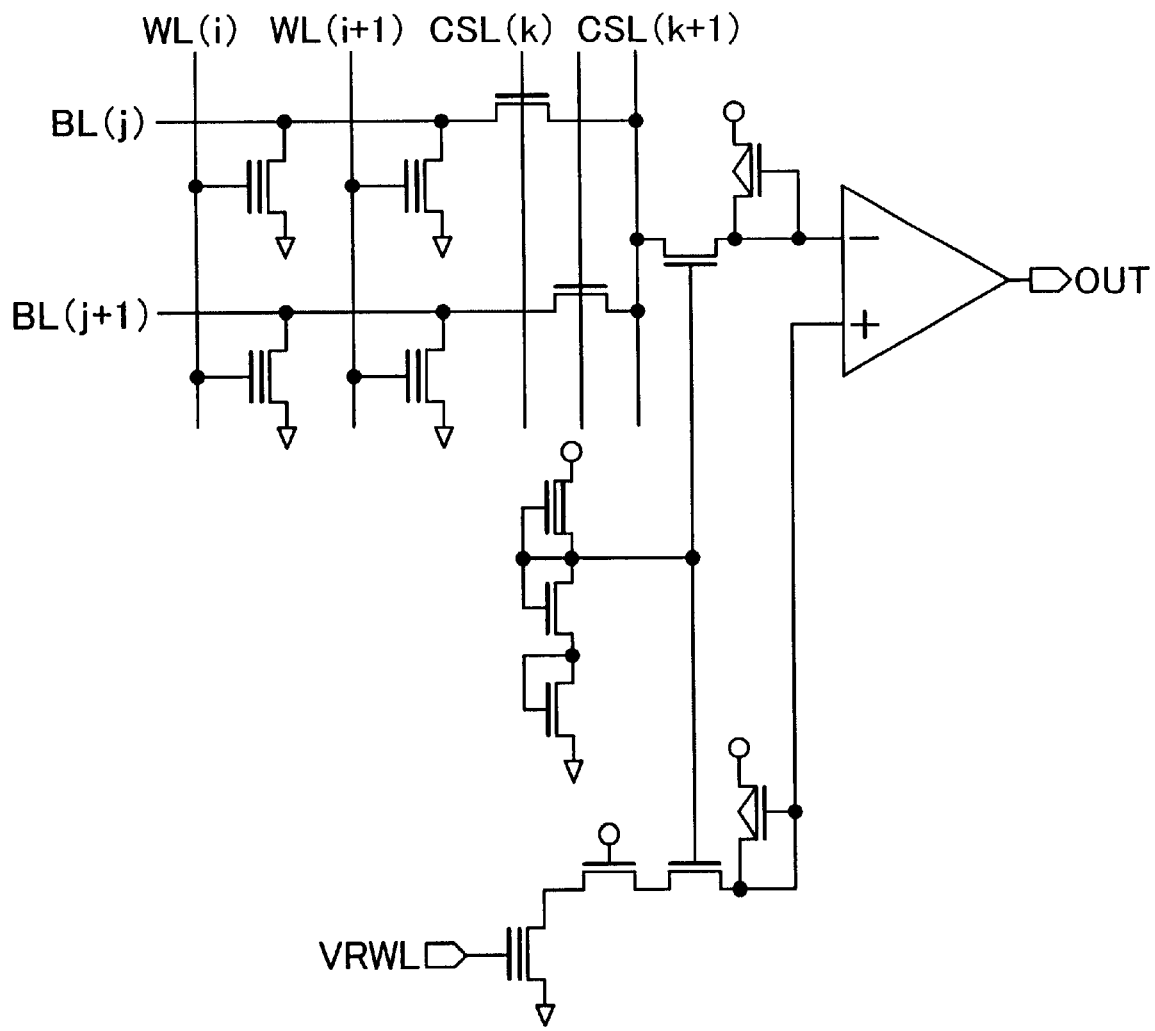
FIG. 54 is a diagram showing a configuration of a prior known cell array using NOR-EEPROM cells and its associated sense amplifier.
Figure 55:
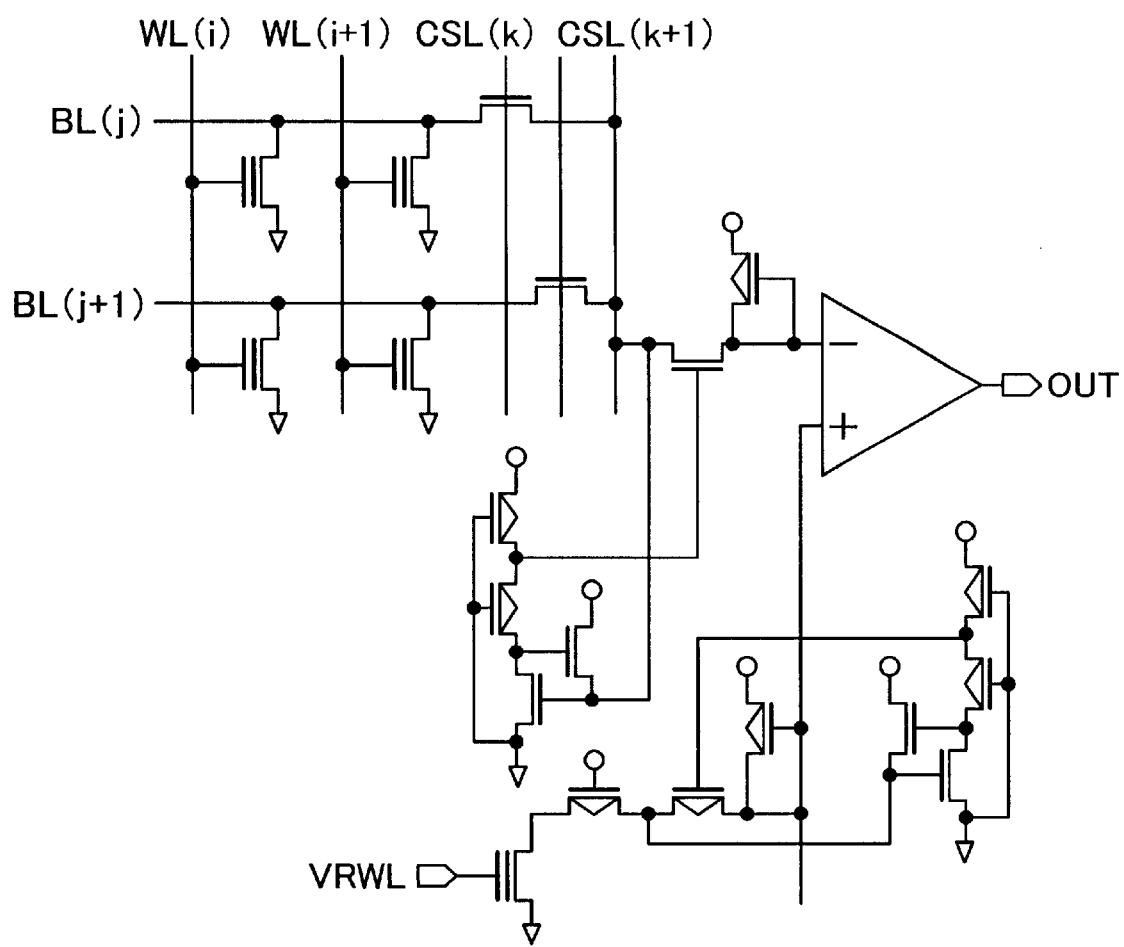
FIG. 55 is a diagram showing a configuration of another prior art NOR-EEPROM cell array and sense amplifier.
Figure 56:
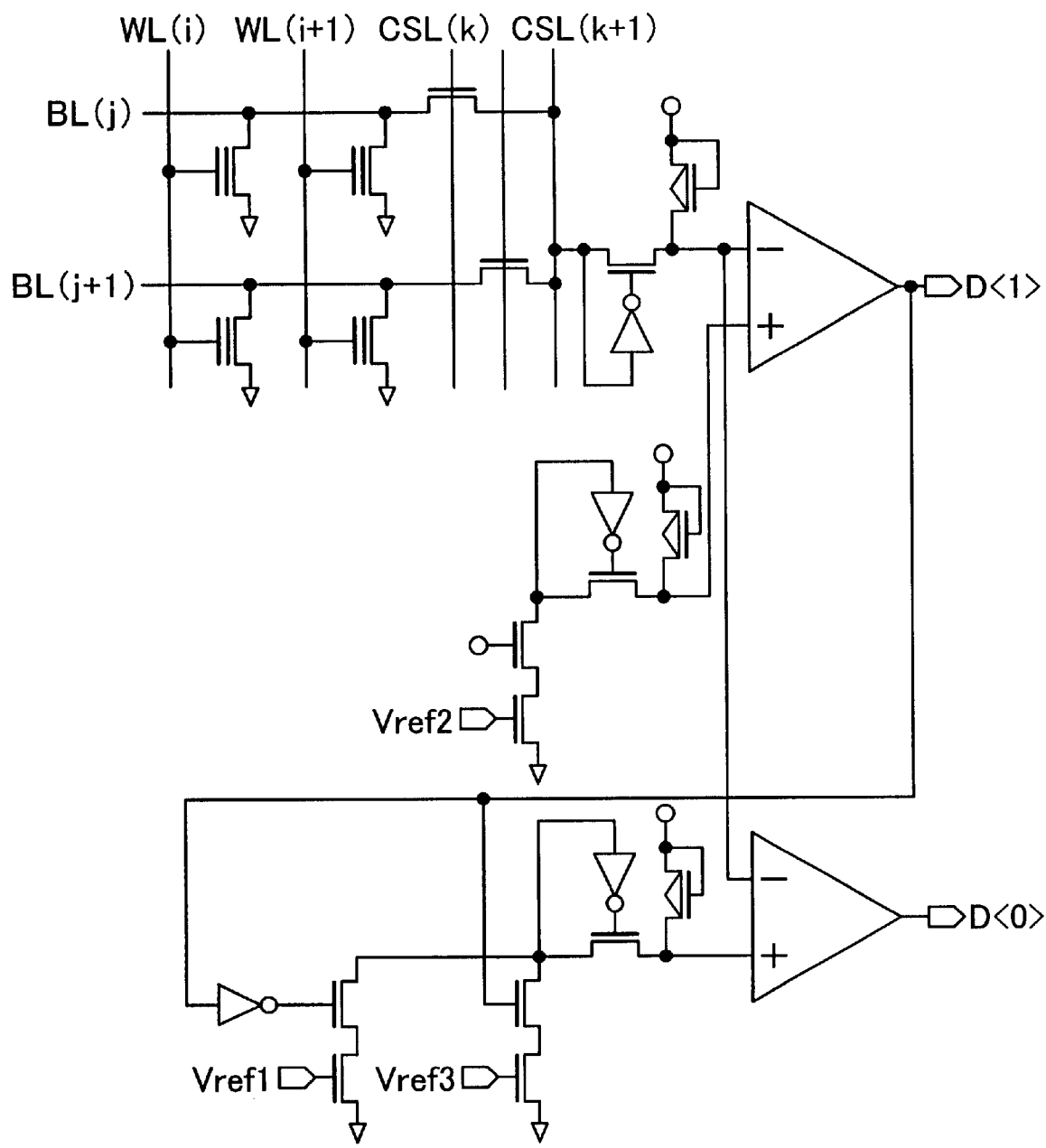
FIG. 56 is a diagram showing a configuration of a prior art cell array using multiple-value storable NOR-EEPROM cells and sense amplifiers coupled thereto.
Figure 57:
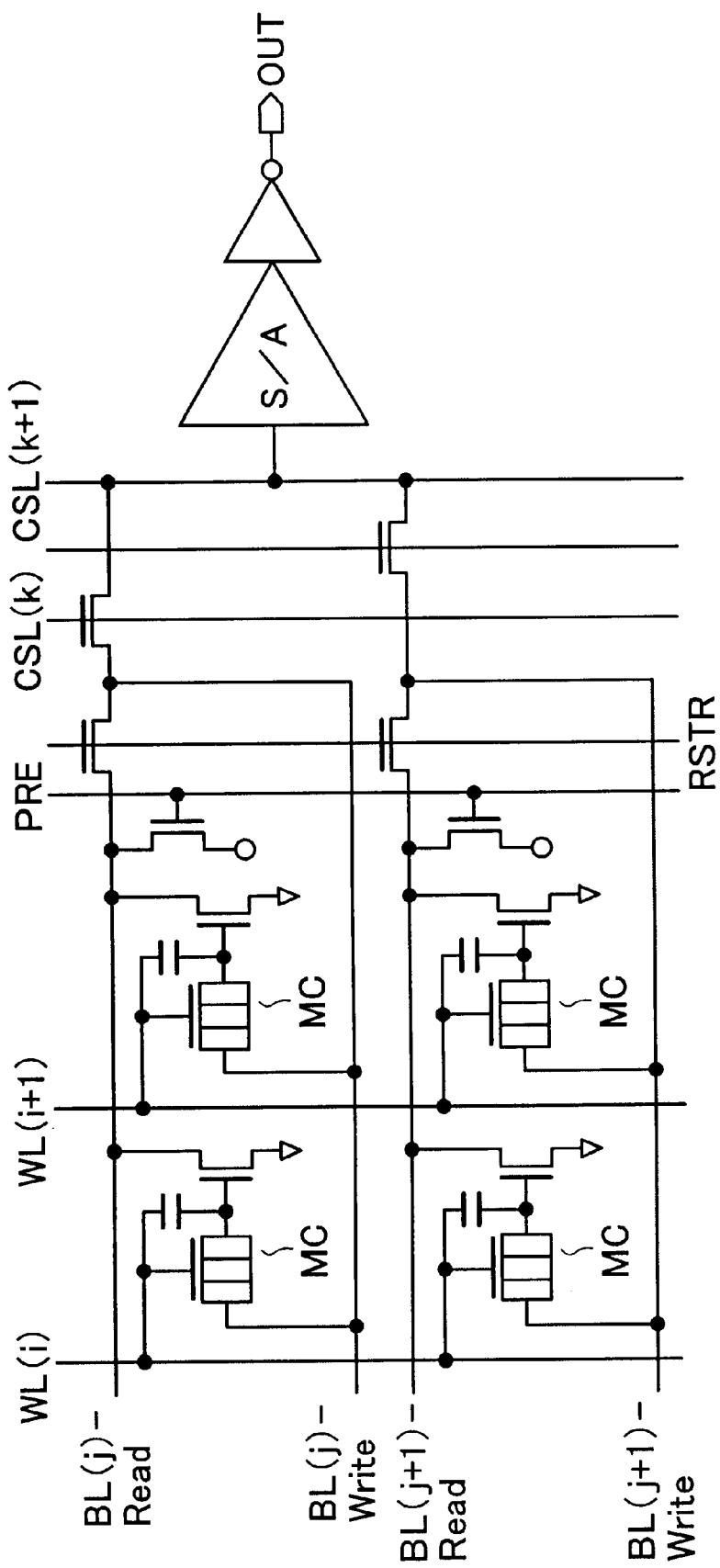
FIG. 57 is a diagram showing a configuration of a prior art cell array using PLEDM cells and sense amplifiers operatively associated therewith.

A 1-bit binary counter for use in the circuits of FIGS. 21 and 22 is practically arranged as shown in FIG. 49. This binary counter is initialized in response to receipt of a reset signal Reset prior to execution of data reading. This binary counter is operatively associated with a drive circuit configured as shown in FIG. 50, which in turn is connected to a trigger signal generation circuit arranged as shown in FIG. 51. This trigger signal generator circuit employs a circuit for generation of a sampling signal osc of an output of op-amp OP, which circuit is formed of a ring oscillator shown in FIG. 52.

Trigger signals Dn, Up as created by the trigger signal generator circuit of FIG. 51 based on the sampling signal osc are supplied to a built-in edge detection circuit so that each has its pulse width shorter than that of sampling signal osc. Similarly drive signals TP0, /TP0, TP1, /TP1 as created by the driver circuit of FIG. 50 based on the trigger signals Dn, Up are passed to the built-in edge detector circuit so that each is shorter in pulse width than trigger signals Dn, Up.

Figure 23:
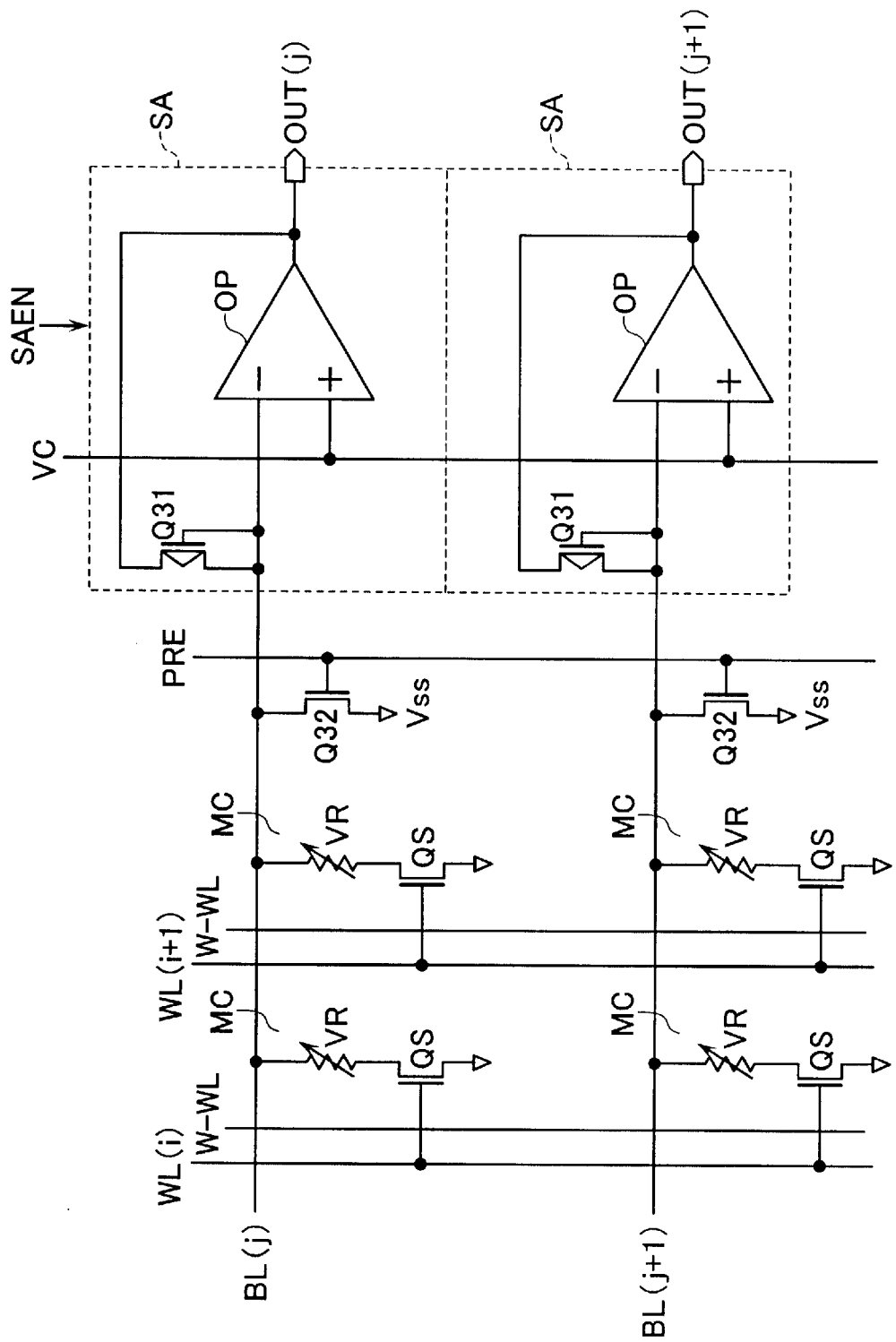
FIG. 23 is a diagram showing another configuration of the cell array using MTJ-MRAM cells and sense amplifiers.

Another preferred configuration example of the 1-transistor/1-MTJ cell array using MTJ-MRAM cells along with sense amplifiers SA associated therewith is shown in FIG. 23. Memory cells MC used are designed to have the above-stated basic structure of FIG. 33A; more specifically, each cell in FIG. 23 is formed of an MTJ as equivalently indicated as a variable resistor VR and a select MOS transistor QS being series-connected thereto. The MTJ selectively has a high resistance state and low resistance state, which will be stored as a data bit "1" and "0," respectively.

Unlike the case of FIG. 3, the individual bit line BL is connected to the inverting input terminal of its corresponding operational amplifier OP, which has its non-inverting input terminal to which the fixed potential VC is applied. A PMOS transistor Q31 for use as the current source load is different from that of FIG. 3 in that its drain and gate are connected together to the inverting input terminal of op-amp OP with a source being coupled to the output terminal of op-amp OP. In brief, the output of op-amp OP is to be fed back to the source of PMOS transistor Q31. PMOS transistor Q31 is operable to charge up its associated bit line BL and, simultaneously, has the functionality of a clamp circuit for suppressing any possible bit-line potential drop-down at fixed potential VC.

The fixed potential VC is at 500 mV for example, which becomes a bit-line clamp potential during data reading. A precharging NMOS transistor Q32 is connected to each bit line. Prior to sense amp activation, NMOS transistor Q32 is driven to turn on in response to receipt of a precharge signal PRE, causing its associated bit line BL to be precharged at 0V.

After the bitline precharge operation is terminated and then the switching MOS transistor QS of a selected cell is turned on, the sense amplifier SA is activated thereby permitting execution of a data sense operation. At the beginning of the sensing, an output of sense amp SA is at H level causing PMOS transistor Q31 to turn on, thereby charging up the bit line. In case the selected memory cell is large in resistance and thus stores therein a logic "1" data bit, the bit line BL potentially increases due to such chargeup of PMOS transistor Q31. With an increase in bitline potential, the output of op-amp OP decreases or drops down in potential, causing a current flowing in PMOS transistor Q31 to decrease accordingly. With this negative feedback operation, the bitline potential is clamped at the fixed potential VC. Alternatively in the case of a data bit "0," the memory cell is low in resistance so that a discharge current is large in amount; thus, the op-amp OP operates to drive the source of PMOS transistor Q31 so that this transistor flows therein a certain current commensurate with such discharge current. In brief, the op-amp OP holds H level from the "1" data read event to thereby perform an operation for clamping the bit line BL at VC. Accordingly this sense amp SA also holds the bit line BL at the same fixed potential VC irrespective of whether the data bit is a logic "1" or "0," thus permitting determination of H or L level of a presently issued output signal in accordance with the data.

As the PMOS transistor Q31 is such that its gate and drain are commonly connected together, a current due to the so-called pentode operation flows therein. At this time the resultant current is roughly proportional to $(Vg-Vs-Vt)^2$, where Vg is the gate potential, Vs is the source potential, and Vt is the threshold voltage. Accordingly, an arrangement for feeding an output of op-amp OP back to the gate as shown in FIG. 3 and an arrangement for feedback to the source become equivalent in operation to each other while letting the op-amp OP be reversed in polarity to that of FIG. 3 as shown in FIG. 23.

Figure 24:
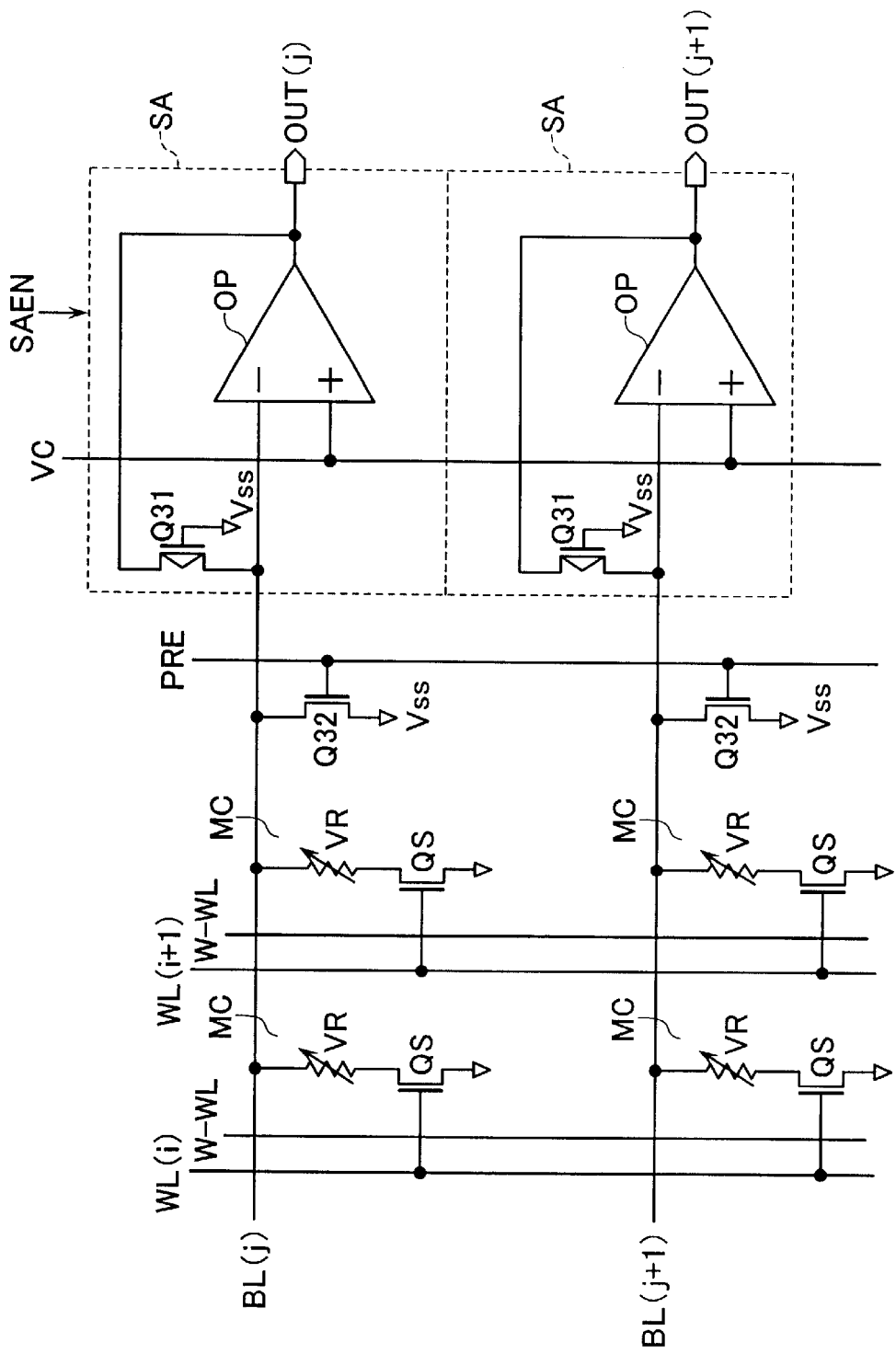
FIG. 24 is a diagram showing still another configuration of the cell array using MTJ-MRAM cells and sense amplifiers.

Turning to FIG. 24, there is shown an example similar in principal configuration to that of FIG. 23 with the current source load PMOS transistor Q31 being modified so that its gate is connected to ground potential Vss. While PMOS transistor Q31 will possibly perform a triode operation depending upon whether its threshold voltage is greater or less in value than the fixed potential VC; in such case, resultant current is substantially equal to $(\frac{1}{2})[Vs^2-2(Vg-Vt)Vs+2(Vg-Vt-Vd/2)Vd]$. This also is a function of the source potential Vs; thus, it is possible to achieve the intended bitline clamp operation due to a similar negative feedback operation to the case of FIG. 23.

The sense amplifier schemes discussed in conjunction with FIGS. 23–24 should not exclusively be limited to the MRAM cells and may also be applied to the above stated cell arrays using the EEPROM cells shown in FIG. 5, PLEDM cells of FIG. 7, and CDRAM cells in FIG. 9. Further, the MRAM cells should not limited to that use MTJs and may be configured to have GMR (Giant Magnetoresistive) devices which are formed, for example, by laminating GMR layers.

Figure 25:
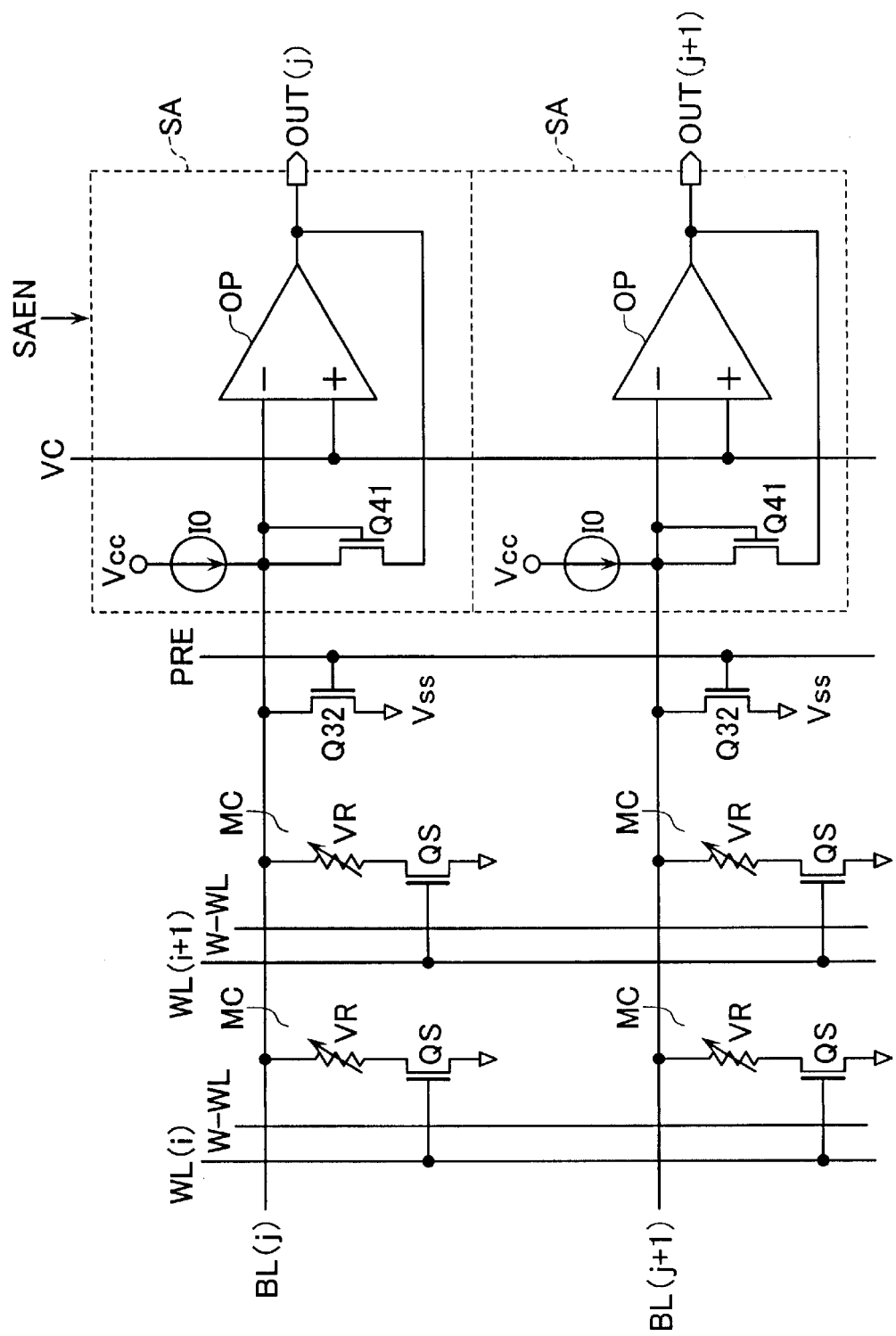
FIG. 25 is a diagram showing yet another configuration of the cell array using MTJ-MRAM cells and sense amplifiers.

Another exemplary memory cell array configuration is shown in FIG. 25, which has 1-transistor/1-MTJ cell arrangement with sense amplifiers SA operatively associated therewith. Unlike the embodiment of FIG. 4, each bit line is connected to the inverting input terminal of an operational amplifier OP while letting a potentially fixed or "constant" potential VC be applied to the non-inverting input terminal thereof. In addition, a discharging NMOS transistor Q41 is provided which has a drain and gate as connected together to the inverting input terminal and a source coupled to the output terminal of op-amp OP.

The constant potential VC is set at 500 mV for example, which will become a bit-line clamping voltage potential during data reading. Before execution of a data sense operation, the bit line BL of interest is to be precharged at 0V by a precharge NMOS transistor Q32. At the interruption of such precharge operation, the switch MOS transistor QS of a selected cell is driven to turn on causing the sense amplifier SA to be activated in response to a sense activation enable signal SAEN, thus permitting execution of a data sense operation. Initially in the data sensing event, the output of op-amp OP stays at H level. In case the selected memory cell is large in resistance and stores therein a data bit of logic "1," the cell's discharge current is less in amount, resulting in the bit line BL potentially rising up due to discharging of constant current source load I0. Whereby the output of op-amp OP decreases in potential. Supplying this op-amp output to the source of NMOS transistor Q41 serves to increase the discharge current. With this negative feedback operation, the bitline potential is clamped at VC. Alternatively in the case of a data bit "0," the cell is less in resistance than when it stores data "1"; thus a larger amount of current is expected to flow. Accordingly the op-amp OP holds an output level higher than during the "1" data reading, for performing negative-feedback control of the NMOS transistor Q41 in such a way that its discharge current is kept smaller. Hence, this sense amp SA also forces the bit line BL to stay at the same constant potential VC without regard to data "0" or "1" for determination of H or L level of an output in accordance with the data.

Figure 26:
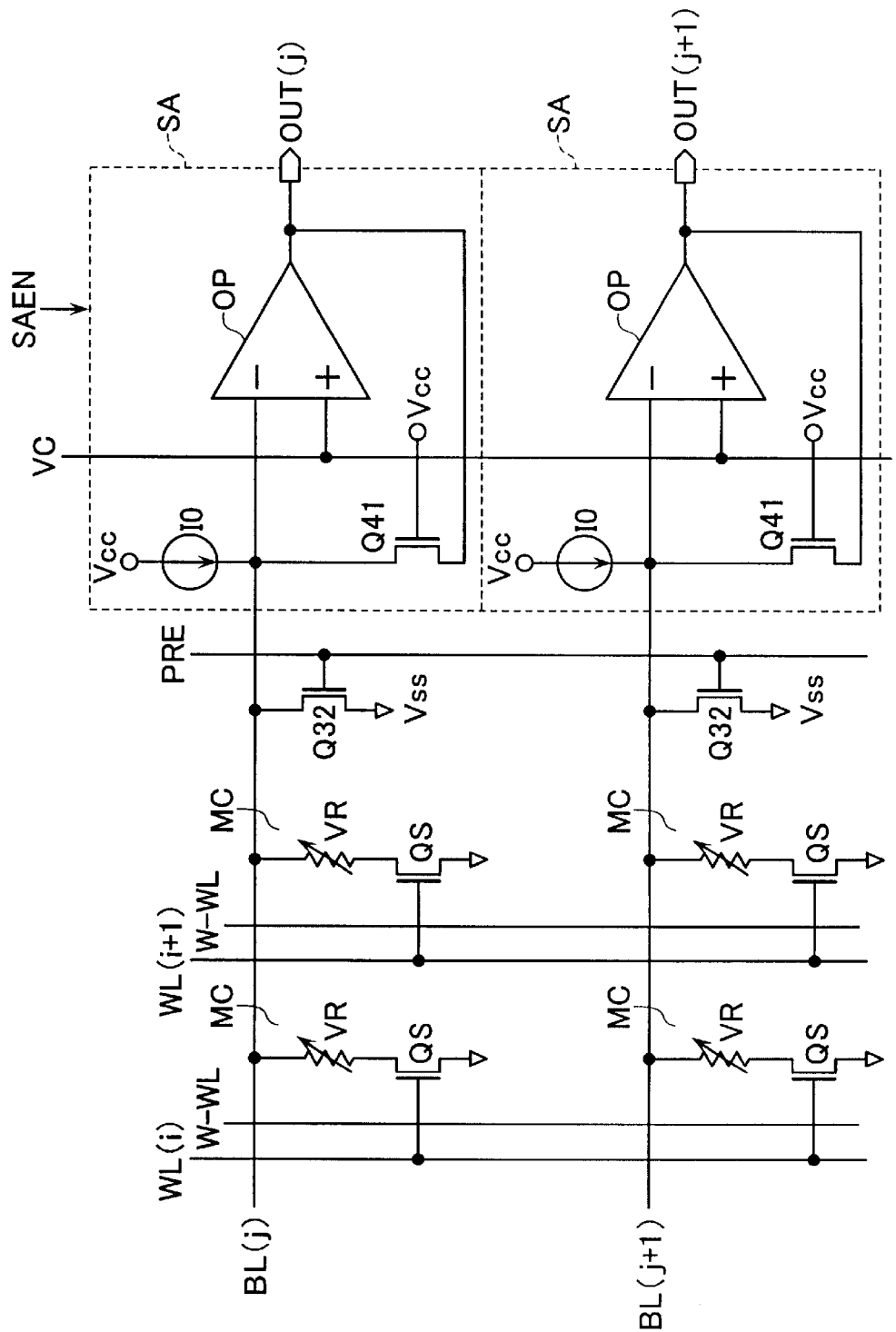
FIG. 26 is a diagram showing further another configuration of the cell array using MTJ-MRAM cells and sense amplifiers.

A modified example of the FIG. 25 embodiment is shown in FIG. 26, which is similar in basic arrangement thereto with the gate of NMOS transistor Q41 being fixed to power supply voltage potential Vcc. In this case also, data sensing is done for clamping the bitline potential at the fixed or constant potential VC through a similar negative feedback operation to that in the case of FIG. 25.

The sense amplifier schemes stated in conjunction with FIGS. 25–26 are applicable to other types of cell arrays other than the MRAM cell array, including but not limited to the cell arrays using the EEPROM cells shown in FIG. 5, PLEDM cells of FIG. 7, and CDRAM cells in FIG. 9. Additionally the same will also be applicable similarly to the TSD cells shown in FIG. 1 and the T-RAM cells of FIG. 2, except for the current source load I0 of the sense-amp schemes stated in conjunction with FIGS. 25–26. Further, the MRAM cells should not limited to that use MTJs and may be configured to have GMR (Giant Magnetoresistive) devices which are formed, for example, by laminating GMR layers.

Figure 27:
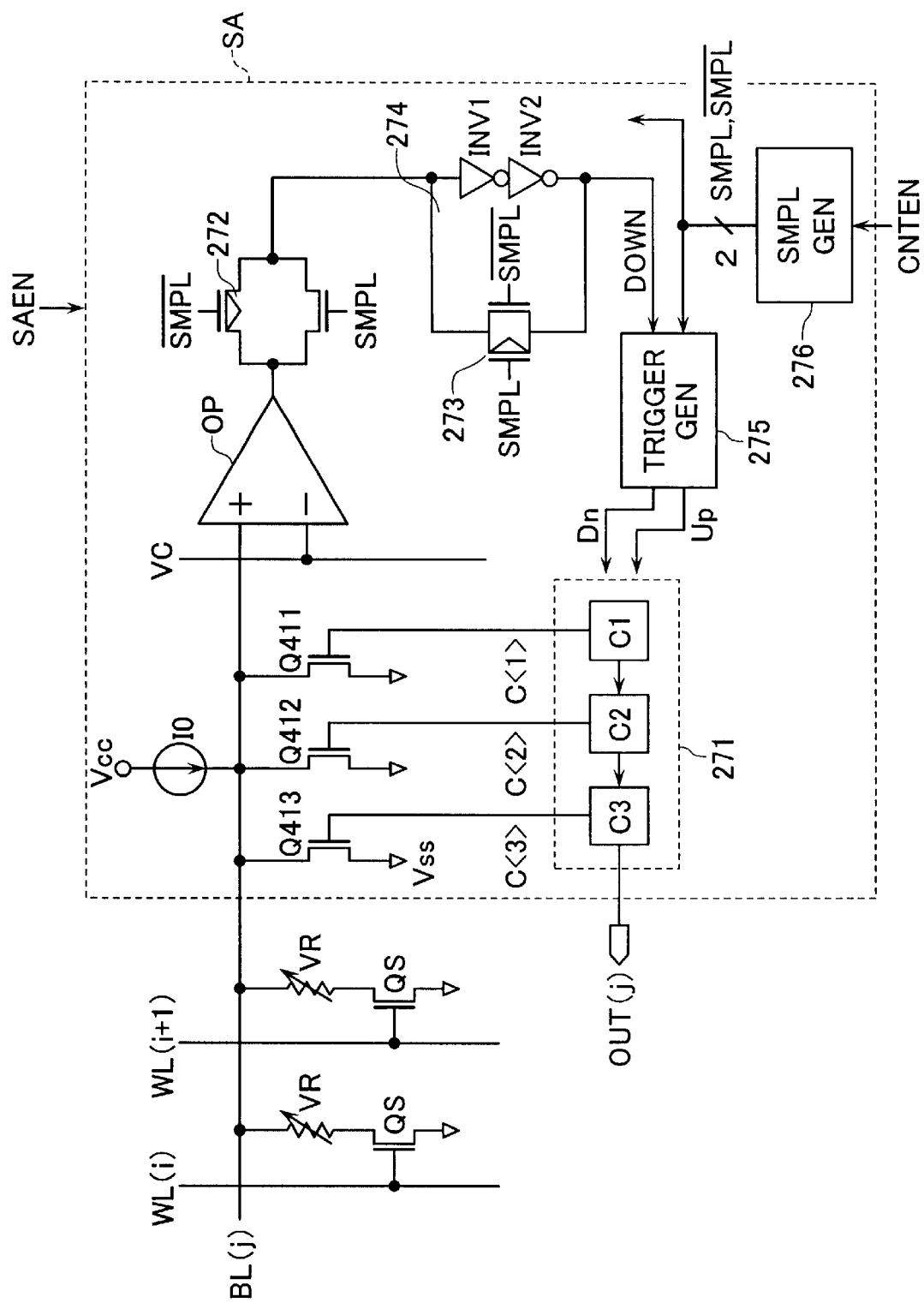
FIG. 27 is a diagram showing still further another configuration of the cell array using MTJ-MRAM cells and sense amplifiers.

Another cell array configuration and its associative sense amplifier SA are shown in FIG. 27, which array employs MTJ-MRAM cells and has the 1-transistor/1-MTJ cell structure. This sense amp SA includes an operational amplifier OP having a non-inverting input terminal connected to a bit line BL(j) and an inverting input terminal to which a fixed or constant potential VC is applied. Also coupled to the non-inverting input terminal is a current source load I0 for bit-line chargeup. The arrangement above is the same as that shown in FIG. 4.

The op-amp OP of FIG. 27 is uniquely arranged so that its non-inverting input terminal is associated with a predefined number—three, in the example shown herein—of discharging (clamping) NMOS transistors Q411, Q412 and Q413, each of which is connected at its drain to the terminal. NMOS transistors Q411–Q413 have sources as coupled and potentially fixed to ground potential Vss. NMOS transistors Q411–413 each have a gate controllable through sampling and feedback of an output of op-amp OP. More specifically, a 3-bit binary counter 271 is provided including counters C1 to C3, whose output signals C<1> to C<3> are given to the gates of NMOS transistors Q411–413, respectively. Provided at output of op-amp OP are CMOS switches 272 as driven by sampling pulses SMPL, /SMPL and a latch circuit 274 operable to hold a sampling output thereof, the latch 274 being formed of inverters INV1, INV2 and a CMOS switch 273.

To control the binary counter 271 with an output of the latch 274 being used as a downcount signal DOWN, a trigger signal generation circuit 275 is provided. The sampling pulses SMPL, /SMPL are generated and issued by a sampling pulse generator circuit 276, which is activated by a counter activation or "enable" signal CNTEN. This counter enable signal CNTEN may also be the sense-amp enable signal SAEN by way of example. The trigger signal generator circuit 276 is configurable by use of the circuitry shown in FIG. 51.

More specifically, the discharge NMOS transistors Q411–Q413 of FIG. 27 are specifically arranged so that these are set at "1:2:4" in ratios of channel width W to channel length L, i.e. W/L ratios. The counters C1–C3 are preset to become "H" prior to data sensing. This may ensure that the NMOS transistors Q411–413 are in sufficiently low discharge resistance states when these are all turned on, thus enabling preclusion of any possible electrical breakdown or "shortcircuiting" of magnetic tunnel junction (MTJ) at the memory cells used.

During data sensing, the output of op-amp OP stays at L level while the bitline potential is lower than the constant potential VC; thus, the downcount signal DOWN obtainable through sampling of this output is at "L." Until downcount signal DOWN potentially goes to "H," the trigger signal generator circuit 275 generates and issues a downcount signal Dn with a sampling period, causing counter 271 to count down. Whereby NMOS transistors Q411–Q413 are switched from the low resistance state with all of them being turned on in such a way that the discharge resistance gets higher sequentially. As previously stated, NMOS transistors Q411–413 are set so that their current drivabilities are at 1:2:4; thus, the discharge resistance value is switchable among eight different levels in reply to an output of counter 271.

An operation for feedback control of the NMOS transistors Q411–413's discharge resistance values in a way pursuant to the resistance of a selected memory cell is principally the same as that in the previously discussed case of FIG. 4. Accordingly, reading the resulting count value after the bitline potential is stabilized makes it possible to determine or "judge" whether the data of interest is a logic "1" or "0." For instance, data judgment is done by determining whether a present count value of the counter C<3>, which is the most significant bit MSB, is at "H" or "L." More specifically, data "1" may be judged if C<3>="H," that is, when NMOS transistor Q413 holds its turn-on state; if C<3>="L," i.e. when at least the NMOS transistor Q413 turns off, then determine it as a data bit "0." A relation of the count value versus data in this case may be represented in Table 1 below.

TABLE 1

| Count Values | | | |
|---|---|---|---|
| C<3> | C<2> | C<1> | Data |
| H | H | H | "1" |
| H | H | L | "1" |
| H | L | H | "1" |
| H | L | L | "1" |
| L | H | H | "0" |
| L | H | L | "0" |
| L | L | H | "0" |
| L | L | L | "0" |

An advantage of the approach to using such sense amplifier circuitry over the case of FIG. 4 for execution of the required data judgment relying upon only the feedback control of the conductivity of a single discharging MOS transistor is that the former offers increased stability and reliability in data judgment. This can be said because respective transistors making up the sense amplifier decrease in degree of operating-point variability, enabling the op-amp to operate more stably.

The sense amplifier scheme stated in conjunction with FIG. 27 should not be limited only to the MRAM cells and may alternatively be applied similarly to other types of cell arrays, such as those using the EEPROM cells shown in FIG. 5, PLEDM cells of FIG. 7, and CDRAM cells in FIG. 9. Further, the MRAM cells should not limited to that use MTJs and may be configured to have GMR (Giant Magnetoresistive) devices which are formed, for example, by laminating GMR layers.

Figure 40:
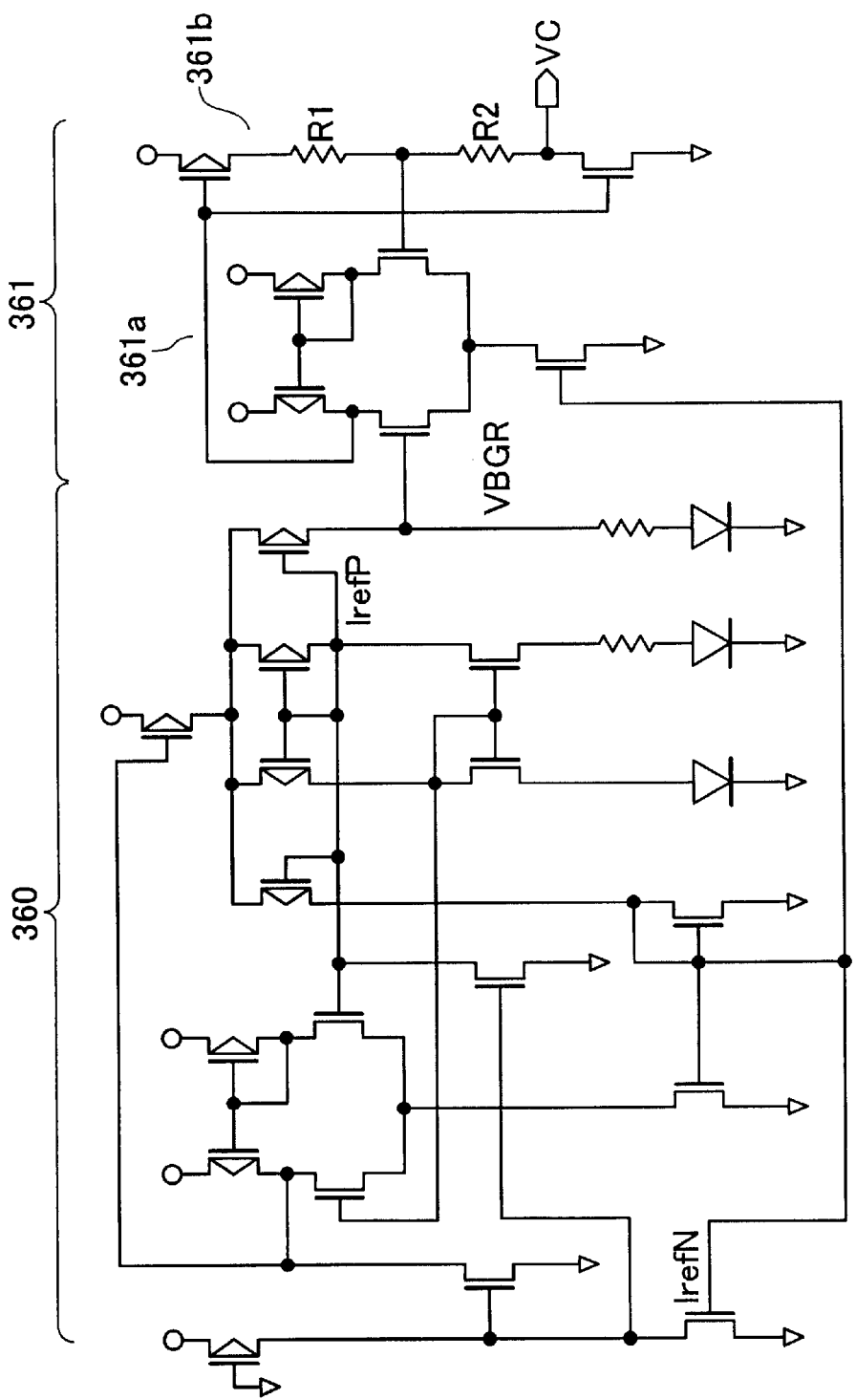
FIG. 40 is a diagram showing a configuration of a constant voltage generation circuit employing BGR circuitry.

In a respective one of the embodiments stated supra, the circuitry for generation of the fixed or constant potential VC adaptable for use as the bitline clamp potential is modifiable so that as shown for example in FIG. 40, it is formed of a band-gap reference (BGR) circuit 360 which generates at its output a reference voltage VBGR and a voltage generator circuit 361 operatively responsive to receipt of the voltage VBGR for generating a constant potential VC. Voltage generator circuit 361 in turn is configured from a current mirror type differential amplifier 361a and an output circuit 361b which is driven thereby and includes a resistive voltage divider circuit 361b with a serial combination of resistors R1, R2. With such an arrangement, it is possible to generate a potentially stable constant potential VC whose level is determinable by the reference voltage VBGR and resistance values of the resistors R1, R2 in output circuit 361b.

Figure 41:
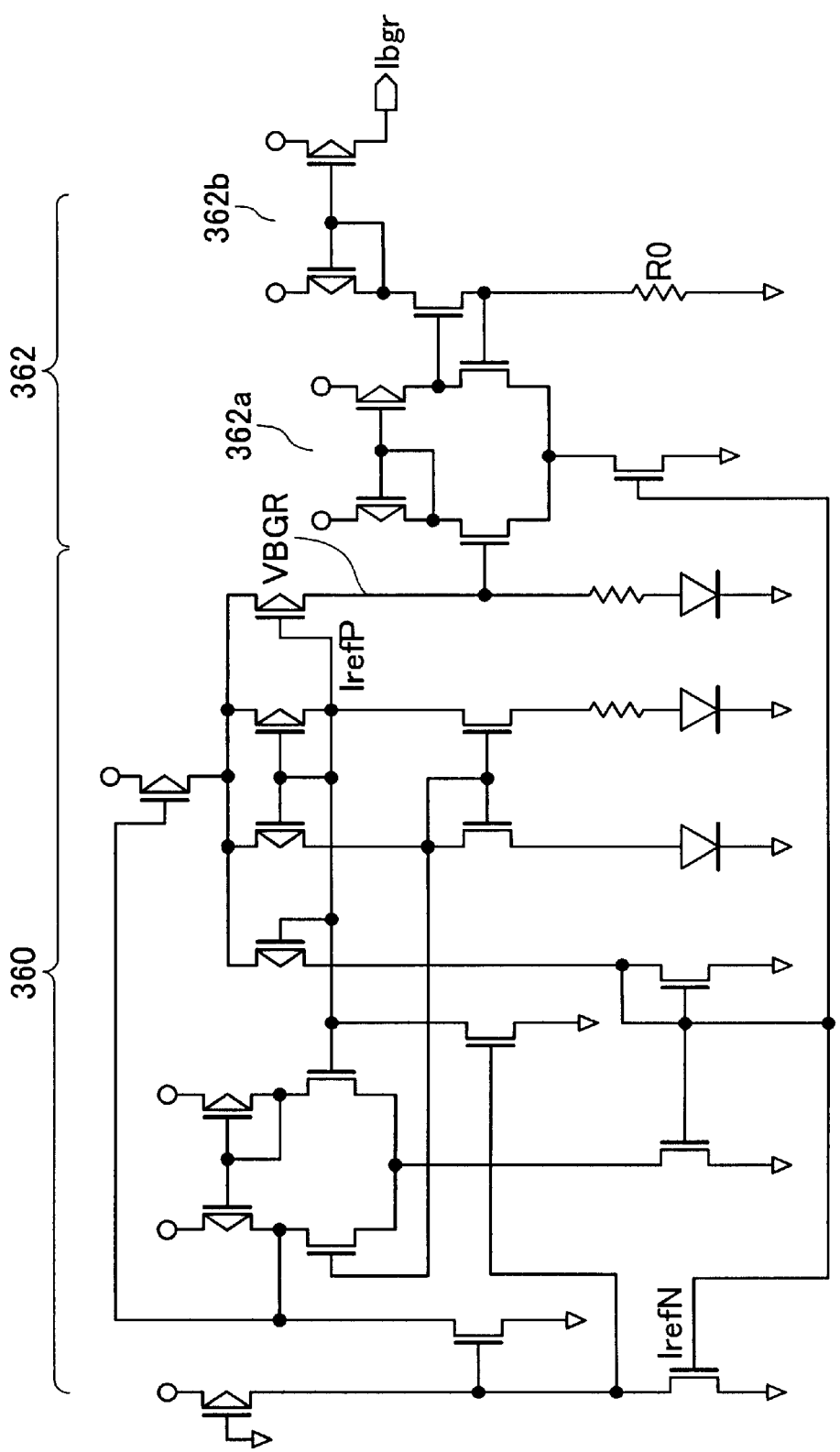
FIG. 41 is a diagram showing a configuration of a constant current generator circuit using BGR circuitry.

Regarding the constant current source Ibgr shown in FIG. 21 also, this is configurable from a band-gap reference (BGR) circuit 360 for output of a reference voltage VBGR and a current production circuit 362 responsive to receipt of the reference voltage VBGR for producing a constant source current Ibgr in a way as shown in FIG. 41. Circuit 362 in turn is formed of a current-mirror differential amplifier 362a and a current source circuit 362b of the current mirror type which is driven thereby. With such an arrangement, a more stable constant source current Ibgr is obtainable, which is determinable by the reference voltage VBGR and the current source circuit 362a's resistance R0 plus PMOS current mirror.

Constant source currents IrefS, IrefL shown in FIG. 22 may also be generated by use of similar circuitry.

Figure 42:
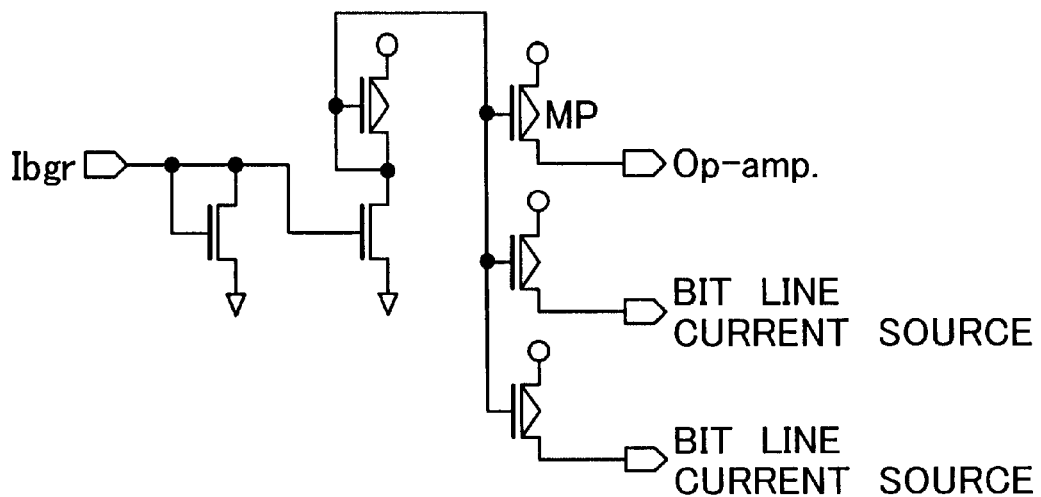
FIG. 42 is a diagram showing a circuit for output distribution of the BGR circuitry.
Figure 43:
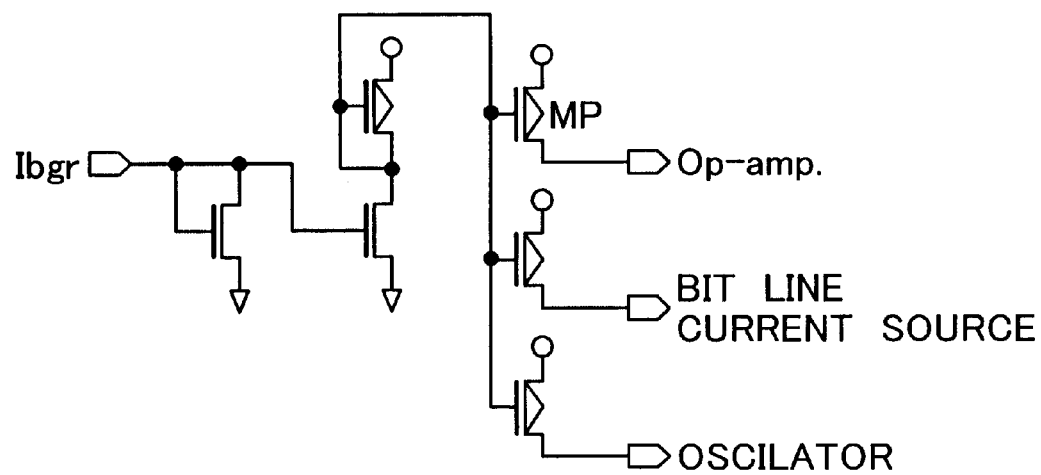
FIG. 43 is a diagram showing a circuit for output distribution of the BGR circuitry.
Figure 47:
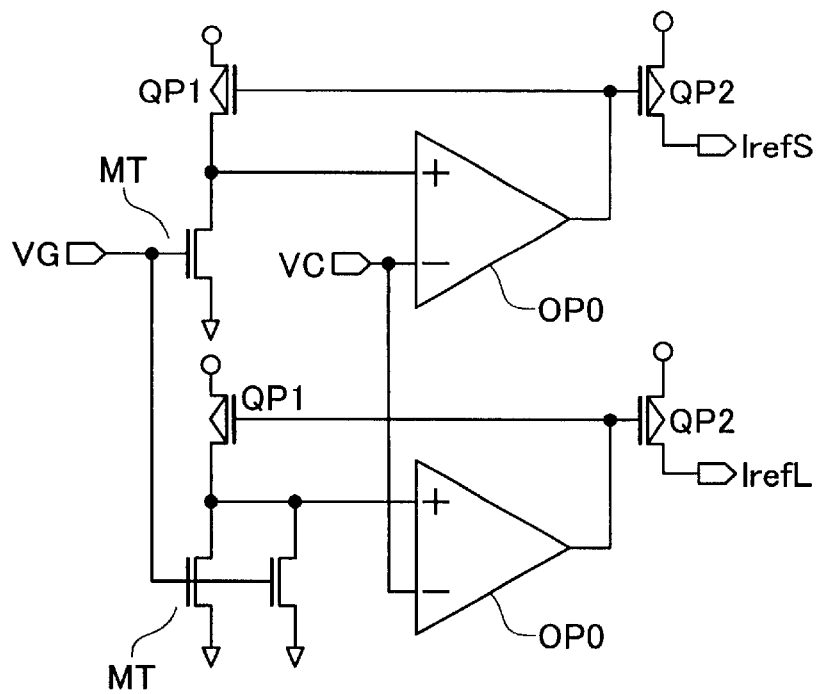
FIG. 47 is a diagram showing a still another configuration of the current source circuit with temperature characteristics.

Additionally the BGR circuits 361 shown in FIGS. 40–41 are the same in configuration as each other. Accordingly, the constant current source and constant voltage source at each part of the circuitry may be designed in such a way that a single BGR circuit is prepared at a "root" portion while providing a distribution circuit such as shown in FIG. 42 or 43 for example to thereby enable creation of any required constant source currents at respective circuit portions. The significance of a constant source current being supplied to each part is determinable through appropriate designing of output-stage PMOS transistor sizes.

The operational amplifier OP for use in a respective one of the above-noted embodiments is formed of a differential amplifier using an NMOS current mirror as shown in FIG. 44A, more practically as depicted in FIG. 44B. A current-source PMOS transistor of FIG. 44B is shown by "MP" in FIG. 42 or 43.

Incidentally in the case of memory cells using MOS transistors, these must have temperature characteristics so that the threshold voltage can decrease with an increase in temperature, resulting a likewise decrease in mobility. Thus, assuming that a gate potential and drain-connected bitline potential are kept constant, the value of a current dischargeable by a cell is variable. This in turn leads to the risk of temperature-dependent margin reducibility in cases where the constant current source is arranged using BGR circuitry for generation of a potentially constant reference voltage independently of temperature changes.

One effective remedy for such margin reduction is to design the constant current source so that it has specific temperature characteristics in a way conformity with the temperature characteristics of the cells used. An example of the constant current source thus arranged is shown in FIG. 45. An NMOS transistor MT shown herein is a memory cell monitoring transistor having a drain to which a load PMOS transistor QP1 is connected. Transistor MT also has a drain terminal as connected to the non-inverting input terminal of an operational amplifier OP0, which has its output terminal coupled to a gate of PMOS transistor QP1 and also to a gate of output-stage PMOS transistor QP2.

A reference voltage VC corresponding to the bit-line clamping fixed or constant potential VC as has been discussed in conjunction with each embodiment stated supra is applied to the inverting input terminal of op-amp OP0 whereas a voltage VG being given to the gate of a selected cell is applied to the gate of the monitoring transistor MT. Preferably this transistor MT is made identical to the cell both in size and in shape.

With such a current source configuration, the constant current Iref is expected to vary with a temperature-dependent change in characteristics of the monitor transistor MT.

See FIG. 46. This diagram shows an example similar in basic configuration to that of FIG. 45 with the above-noted monitoring transistor being replaced by a plurality of monitor NMOS transistors MT. With such an arrangement, it becomes possible to obtain the intended constant current Iref having more appropriate temperature characteristics corresponding to the average characteristic variation of such multiple monitor transistors MT. Typically the ratio of the size of a monitoring current-source PMOS transistor QP1 to that of output-stage PMOS transistor QP2, i.e. channel width ratio, is set at 1/n, where "n" is the number of monitor transistors MT.

For the couple of current sources IrefS, IrefL such as shown in FIG. 22, a parallel combination of two separate circuit modules each similar in principal configuration to the circuit of FIG. 45 may be provided.

It has been stated that in accordance with this invention, it is possible to provide improved semiconductor memory integrated circuitry capable of suppressing any possible stresses at a variety of types of current-driven memory cells to thereby enable achievement of sufficiently large readout margins.

What is claimed is:

1. A magnetoresistive memory device comprising more than one memory cell for performing data storage depending upon whether magnetoresistance is large or small in value, and a sense amplifier connected to a bit line for sensing data as output from said memory cell to the bit line, wherein the sense amplifier comprises:

an operational amplifier having an inverting input terminal connected to said bit line and a non-inverting input terminal with a fixed potential given thereto; and a clamping transistor being feedback-controlled by an output of said operational amplifier for causing said bit line to be clamped at said fixed potential without regard to any data being read, said transistor having a drain connected to said inverting input terminal and a source coupled to an output terminal of said operational amplifier.

2. The magnetoresistive memory device according to claim 1, wherein said clamping transistor is a PMOS transistor with its gate connected to said inverting input terminal, and wherein the PMOS transistor is also operable as a current source load of said bit line.

3. The magnetoresistive memory device according to claim 1, wherein said clamping transistor is a PMOS transistor with a gate grounded, said PMOS transistor being also operable as a current source load of said bit line.

4. The magnetoresistive memory device according to claim 1, wherein said clamping transistor is an NMOS transistor with a gate connected to said inverting input terminal.

5. The magnetoresistive memory device according to claim 1, wherein said clamping transistor is an NMOS transistor with a gate connected to a power supply terminal.

6. The magnetoresistive memory device according to claim 1, wherein said memory cell has a magnetic tunnel junction device including two ferromagnetic layers opposing each other with a tunnel dielectric film interposed therebetween.

7. The magnetoresistive memory device according to claim 1, wherein said memory cell has a magnetic tunnel junction device with one end connected to said bit line including two ferromagnetic layers opposing each other with a tunnel dielectric film interposed therebetween and a select transistor as connected between a remaining end of this device and a reference potential terminal.

8. A magnetoresistive memory device comprising more than one memory cell for performing data storage depending upon whether magnetoresistance is large or small in value, and a sense amplifier connected to a bit line for sensing data as output from said memory cell to the bit line, wherein the sense amplifier comprises:

an operational amplifier having a first input terminal connected to said bit line and a second input terminal with a fixed potential given thereto;

a current source load as connected to said first input terminal;

a plurality of clamping transistors provided between said first input terminal and a reference potential terminal for being controlled by an output of said operational amplifier to clamp said first input terminal at said fixed potential without regard to read data;

a binary counter operatively responsive to each bit data for controlling gates of said plurality of clamping transistors; and a counter control circuit for sampling an output of said operational amplifier and for performing up/down control of said binary counter.

9. The magnetoresistive memory device according to claim 8, wherein said clamping transistors are arranged so that channel width to channel length ratios thereof are progressively doubled in value with a certain one being as a reference, said one being controlled by a least significant bit data of said counter.

10. The magnetoresistive memory device according to claim 8, wherein said memory cell has a magnetic tunnel junction device including two ferromagnetic layers opposing each other with a tunnel dielectric film interposed therebetween.

11. The magnetoresistive memory device according to claim 8, wherein said memory cell has a magnetic tunnel junction device with an one end connected to said bit line including two ferromagnetic layers opposing each other with a tunnel dielectric film interposed therebetween and a select transistor as connected between a remaining end of this device and a reference potential terminal.

* * * * *